(12) United States Patent
Sellathamby et al.

(10) Patent No.: US 8,829,934 B2
(45) Date of Patent: Sep. 9, 2014

(54) METHOD AND APPARATUS FOR INTERROGATING ELECTRONIC EQUIPMENT COMPONENTS

(75) Inventors: Christopher V. Sellathamby, Edmonton (CA); Steven Slupsky, Edmonton (CA); Brian Moore, Edmonton (CA)

(73) Assignee: Scanimetrics Inc., Edmonton, Alberta (CA)

( * ) Notice: Subject to any disclaimer, the term of this patent is extended or adjusted under 35 U.S.C. 154(b) by 712 days.

(21) Appl. No.: 12/919,823

(22) PCT Filed: Feb. 26, 2009

(86) PCT No.: PCT/CA2009/000235
§ 371 (c)(1),
(2), (4) Date: Aug. 27, 2010

(87) PCT Pub. No.: WO2009/105885
PCT Pub. Date: Sep. 3, 2009

(65) Prior Publication Data
US 2011/0006794 A1    Jan. 13, 2011

Related U.S. Application Data

(60) Provisional application No. 61/031,805, filed on Feb. 27, 2008.

(30) Foreign Application Priority Data

Feb. 29, 2008   (CA) ...................................... 2623257

(51) Int. Cl.
*G01R 31/20*     (2006.01)
*G01R 31/3185*   (2006.01)
*G08C 17/02*     (2006.01)
*H04Q 9/02*      (2006.01)
*G01R 31/302*    (2006.01)
*G01R 31/308*    (2006.01)

(52) U.S. Cl.
CPC ............ *G08C 17/02* (2013.01); *H04Q 2209/40* (2013.01); *G01R 31/318572* (2013.01); *H04Q 9/02* (2013.01); *H04Q 2209/75* (2013.01); *G01R 31/318555* (2013.01); *G01R 31/308* (2013.01); *G01R 31/3025* (2013.01)
USPC ...................................................... 324/754.03

(58) Field of Classification Search
USPC ................. 324/762.01–762.1, 750.01–750.3, 324/754.01–754.3, 755.01–755.1; 257/48; 438/14–18
See application file for complete search history.

(56) References Cited

U.S. PATENT DOCUMENTS

| 5,293,400 A | 3/1994 | Monod et al. |
| 5,345,231 A | 9/1994 | Koo et al. |

(Continued)

FOREIGN PATENT DOCUMENTS

| WO | WO 01/63827 | 8/2001 |
| WO | WO 2004/046741 | 6/2004 |

(Continued)

OTHER PUBLICATIONS

Eberle H., "A Radio Network for Monitoring and Diagnosing Computer Systems". IEEE Micro, IEEE Service Center. Jan. 2003, vol. 23, No. 1, pp. 60-65.

(Continued)

*Primary Examiner* — Tung X Nguyen
(74) *Attorney, Agent, or Firm* — Davis & Bujold, PLLC; Michael J. Bujold

(57) ABSTRACT

An apparatus for interrogating an electronic circuit supported by a substrate includes a tester external to the substrate and comprising an tester transceiver. A testing circuit is supported by the substrate and connected to the electronic circuit. The testing circuit includes a processor and a testing circuit transceiver in communication with the tester transceiver for transmitting instructions from the tester to the processor and for transmitting results of an interrogation from the processor to the tester. The processor being programmed to process instructions from the tester to interrogate the electronic circuit with an interrogation corresponding to the instructions.

12 Claims, 47 Drawing Sheets

(56) References Cited

U.S. PATENT DOCUMENTS

| | | | |
|---|---|---|---|
| 5,395,231 | A | 3/1995 | Maejima |
| 5,764,655 | A | 6/1998 | Kirihata et al. |
| 5,952,849 | A | 9/1999 | Haigh |
| 6,003,777 | A | 12/1999 | Kowalski |
| 6,058,497 | A * | 5/2000 | Tuttle .......................... 714/733 |
| 6,161,205 | A | 12/2000 | Tuttle |
| 6,236,223 | B1 * | 5/2001 | Brady et al. ............... 324/750.3 |
| 6,262,600 | B1 | 7/2001 | Haigh et al. |
| 6,331,782 | B1 | 12/2001 | White et al. |
| 6,374,379 | B1 | 4/2002 | Walker et al. |
| 6,412,086 | B1 | 6/2002 | Friedman et al. |
| 6,449,308 | B1 | 9/2002 | Knight, Jr. et al. |
| 6,484,279 | B2 | 11/2002 | Akram |
| 6,525,566 | B2 | 2/2003 | Haigh et al. |
| 6,625,682 | B1 | 9/2003 | Simon et al. |
| 6,732,301 | B1 | 5/2004 | Landry et al. |
| 6,759,863 | B2 | 7/2004 | Moore |
| 6,836,866 | B2 | 12/2004 | Nolles et al. |
| 6,873,065 | B2 | 3/2005 | Haigh et al. |
| 6,885,202 | B2 | 4/2005 | Slupsky et al. |
| 7,073,111 | B2 | 7/2006 | Whetsel |
| 7,075,329 | B2 | 7/2006 | Chen et al. |
| 7,109,730 | B2 | 9/2006 | Slupsky et al. |
| 7,183,788 | B2 | 2/2007 | Moore et al. |
| 7,202,676 | B2 | 4/2007 | Banaska et al. |
| 7,202,687 | B2 | 4/2007 | Khandros et al. |
| 7,215,133 | B2 | 5/2007 | Kwark |
| 7,218,094 | B2 | 5/2007 | Khandros et al. |
| 7,239,163 | B1 | 7/2007 | Ralston-Good et al. |
| 7,242,209 | B2 | 7/2007 | Roberts et al. |
| 7,256,055 | B2 | 8/2007 | Aghababazadeh et al. |
| 7,612,630 | B2 | 11/2009 | Miller |
| 2002/0186106 | A1 | 12/2002 | Miller |
| 2002/0196029 | A1 | 12/2002 | Schmidt |
| 2003/0042602 | A1 | 3/2003 | Drost |
| 2003/0146771 | A1 | 8/2003 | Moore |
| 2004/0004216 | A1 | 1/2004 | Eldridge et al. |
| 2005/0086021 | A1 | 4/2005 | Khandros et al. |
| 2005/0138499 | A1 | 6/2005 | Pileggi et al. |
| 2005/0193294 | A1 | 9/2005 | Hildebrant |
| 2006/0186893 | A1 | 8/2006 | Schmidt |
| 2006/0232323 | A1 | 10/2006 | Mohr et al. |
| 2006/0252375 | A1 | 11/2006 | Wu et al. |
| 2007/0162801 | A1 | 7/2007 | Moore et al. |

FOREIGN PATENT DOCUMENTS

| | | |
|---|---|---|
| WO | WO 2005/076885 | 8/2005 |
| WO | WO 2007/010480 | 1/2007 |
| WO | WO 2007/101345 | 9/2007 |

OTHER PUBLICATIONS

Eberle H. "Radioport: A Radio Network for Monitoring and Diagnosing Computer Systems". High Performance Interconnects, 2002. Proceedings. 10$^{th}$ Symposium on Aug. 21-23, 2002. pp. 135-139.

Cheng-Wen Wu et al. "The HOY Tester-Can IC Testing Go Wireless?". VLSI Design, Automation and Test, 2006 International Symposium. IEEE. Apr. 2006. pp. 1-4.

Yuxin Wang et al. "New Embedded Core Testing for System-on-Chips and System-in-Packages". Electrical and Computer Engineering, Canadian Conference. IEEE. May 2006. pp. 1897-1900.

Hess et al. 2007 IEEE International Conference on Microelectronic Test Structures, Mar. 19-22, Tokyo, Japan. Paper 7.4Ca.

Sayil et al. "Comparison of contactless measurement and testing techniques to a new All-Silicon optical test and characterization method," *IEEE Transactions on Instrumentation and Measurement*, vol. 54, No. 5, pp. 2082-2089, Oct. 2005.

Rofougaran et al. "Radios for next generation wireless networks," *IEEE Microwave Magazine*, pp. 38-43, Mar. 2005.

Hsiao et al. "A Built-in Timing Parametric Measurement Unit" in *International Test Conference*, pp. 315-322, 2001.

Sumanen et al. "A digital Self calibration method for pipeline A/D converters," in *Proc. IEEE Symp. Circuits and Sytems*, pp. 792-795, 2002.

Cong and Geiger. "A 1.5 V 14-Bit 100-MS/s Self Calibrated DAC," *IEEE Journal of Solid-State Circuits*, vol. 38, No. 12, pp. 2051-2060, Dec. 2003.

Linares-Barranco and Serrano-Gotarredona. "On the design and characterization of Femtoampere current-mode circuits," *IEEE Journal of Solid State Circuits*, vol. 38, No. 8, pp. 1353-1363, Aug. 2003.

Zhang et al. "An improved saw tooth oscillator and its application in on-chip femto-ampere Current Monitor" in *International Conference Solid State and Integrated Circuit Technology*, pp. 2073-2075, 2006.

B. Floyd et al, "Wireless Interconnection in CMOS IC with Integrated Antennas" IEEE ISSCC 2000, Paper WA 19.6, Feb. 2000, pp. 238-239.

IEEE Computer Society, "IEEE Standard Test Access Port and Boundary-Scan Architecture" IEEE Std. 1149.1-2001, New York: IEEE, 2001.

S. Sunter and B. Nadeau-Dostie, "Complete, Contactless I/O Testing—Reaching the Boundary in Minimizing Digital IC Testing Cost", International Test Conference 2002, Paper 16.2.

N. Park et al, "Quality-effective repair of multichip module systems" (Abstract) Journal of Systems Architecture, 47, Apr. 2002, pp. 883-900.

C. Sellathamby et al., "Wireless Wafer Probe" Southwest Test Workshop, Session 7, Jun. 9, 2004.

W. Mann, "Leading Edge of Wafer Level Testing" Proceedings of the ITC International Test Conference, 2004.

B. Moore, C. Backhouse and M. Margala, "Design of a Wireless On-wafer Sub-Micron Characterization System" IEEE TVLSI Journal vol. 2 Feb. 2005.

"International Technology Roadmap for Semiconductors" SIA 2005 Edition.

C. Sellathamby, et al, "Non Contact Wafer Probe using Wireless Probe Cards" International test Conference, IEEE, 2005, Paper 18.3.

P. Collins, I. Reis, M. Simonen and M. Houcke, "A Transparent Solution for Providing Remote Wired or Wireless Communication to Board and System Level Boundary-Scan Architectures" International Test Conference 2005 Paper 2.2.

F. De Jong and A. Biewenga, "SiP-TAP: JTAG for SiP" International Test Conference 2006, Paper 14.3.

L. Whetsel, "A High Speed Reduced Pin Count JTAG Interface" International Test Conference 2006, Paper 10.1.

K. Harvey, "Cost of Test Issues for RF SiP Circuits" KGD Conference, 2006.

J. McElney, "Testing of Converging Device Technologies: High-Efficiency Multi-Site Test for SiP Mobile Technologies" KGD Conference, 2006.

T. Kuroda, "Inductive-Coupling Inter-Chip Link for System in a Package" CMOS-Emerging Technologies Workshop Banff, AB, Canada, Jul. 19, 2006.

I. Reis, P. Collins and M. Houcke, "On-line Boundary-Scan Testing in Service of Extended Products" (Abstract) International Test Conference 2006, Lecture 4.2.

P. Cauvet, "SiP Technology and Testing" Mar. 28, 2007.

* cited by examiner

Figure 9
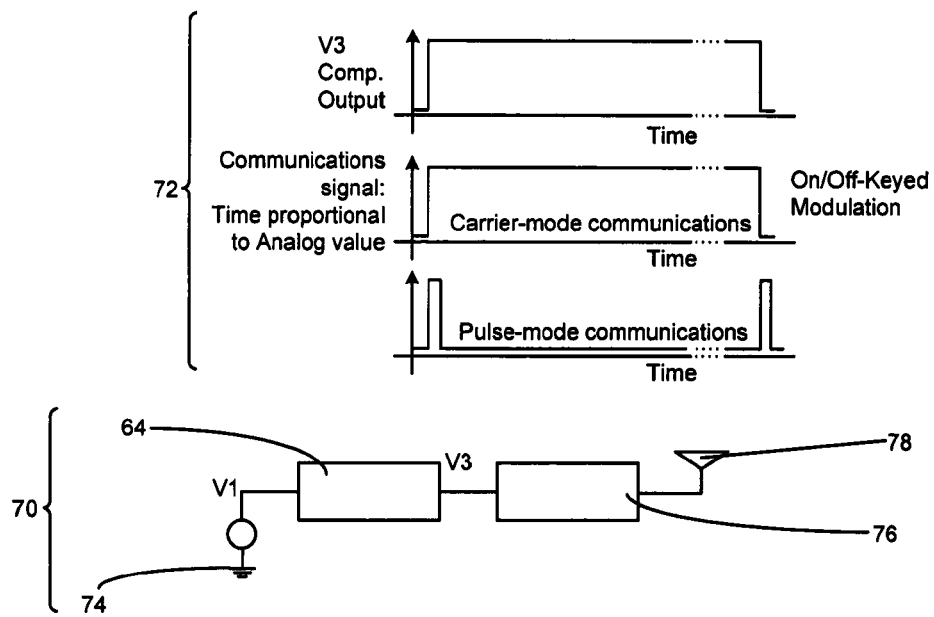
Figure 10
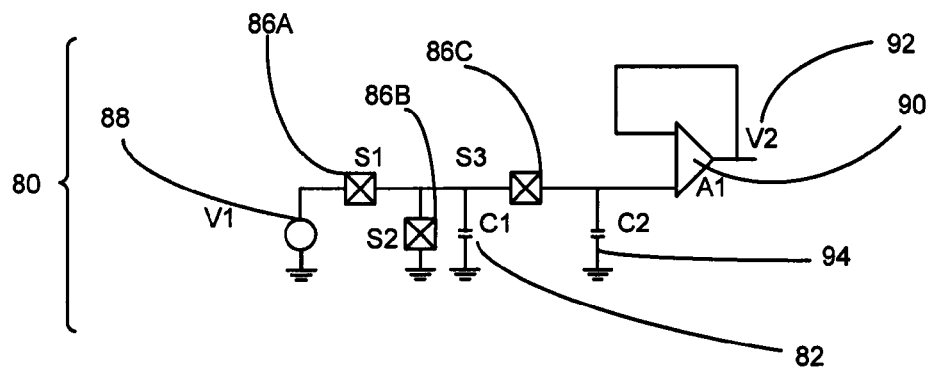
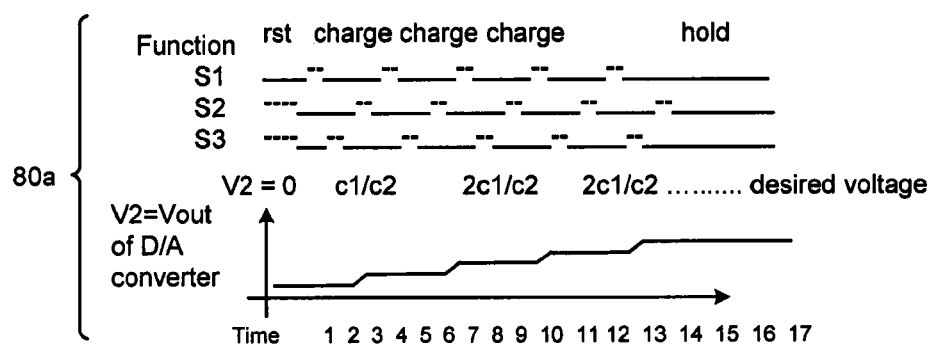

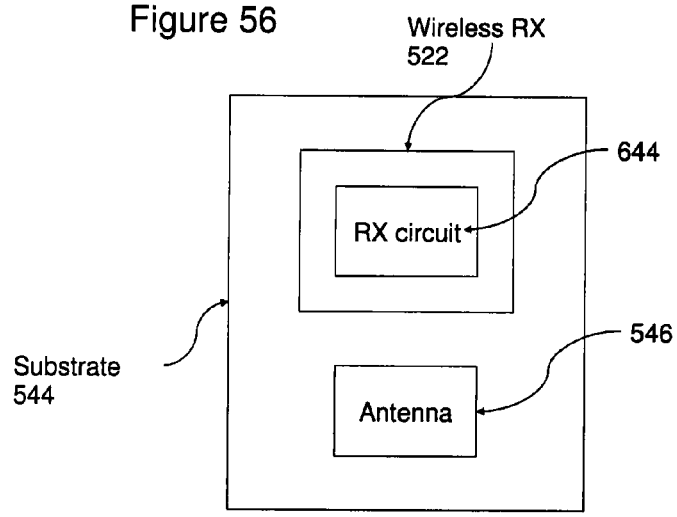
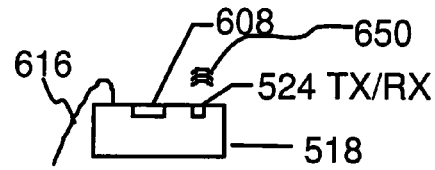
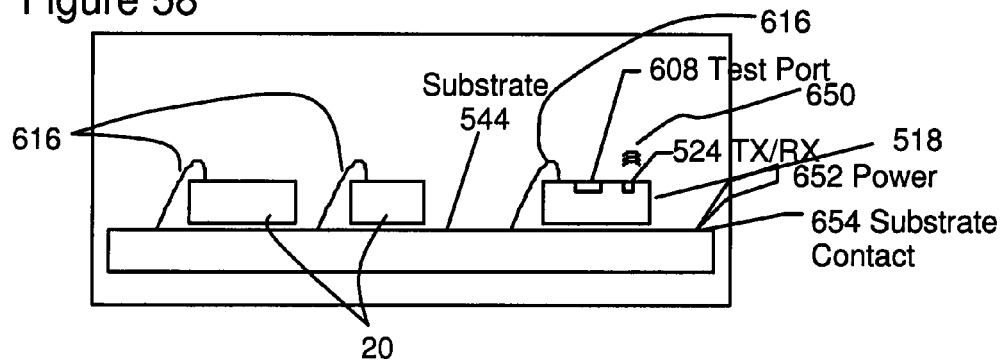

```
ATTEN 10dB
RL -45.0dBm
MKR 1.4835 GHz
-69.17 dBm
```

```
Centre 1.4840 GHz        SPAN 100.0MHz
RBW 1.0MHz    VBW 1.0MHz SWP 50.0ms
```

METHOD AND APPARATUS FOR INTERROGATING ELECTRONIC EQUIPMENT COMPONENTS

FIELD

Wireless testing of one or several IC components on-wafer or as a manufactured assembly of ICs and parts, before, during and after IC fabrication.

BACKGROUND

Testing of integrated circuits (IC) during fabrication is usually carried out at the end of the fabrication process. For example, a full wafer is first fabricated which includes 100's to 1000's of IC which then are diced for further testing. Wafer testing is generally carried out at the end of the fabrication because of the delicate nature of the structures placed on the wafer, firstly transistor or active elements, then a succession of conductive structures, typically metalized, for interconnect purposes and insulating structures. Normally, input/output (I/O) pads and structures are built which provide contacts for probe testing.

Probe testing necessarily requires at least one physical contact between at least one probe and corresponding I/O pads. Such contact may not be repeatable or may not be reliably performed through the potential for damage induced by the physical contact. Thus it is desirable to be able to perform testing without the requirement for physical contact. Such testing methods are termed contactless or wireless testing.

Of particular challenge and expense is process monitoring in which are conducted analog and variable measurements of critical process parameters. To date, testing at this level has required removal of wafers from the process line and contact testing off-line. It is preferable to have in-line contactless testing.

One problem with this technique is the fact that it requires physical contact with the device being accessed. Consider the example of an integrated circuit. Integrated circuits have on-chip structures for connecting the semiconductor chip to the outside world. These structures are conductive, and usually metallic in nature. Common structures ("touchpads" or "bondpads") include pads and solder balls. Typically, test needles are brought into contact with the circuit at these touchpads in order to make a DC-coupled, wireline link by which to test the integrated circuit. Typical characteristics of the test needles include a spring force and a tip shape that induces a pressure at the point of contact.

Touchpads commonly used in modern integrated circuits to couple electronic signals are very fragile and subject to damage during mechanical probe. Damage of the touchpad can cause failure of the integrated circuit. Further, the mechanical stresses associated with mechanical contact to the structure often induces stresses into the integrated circuit beyond the conductive structure itself leading to additional failure modes of the integrated circuit. This creates other problems as well, since these structures are used later when the integrated circuit is packaged. The damage caused to the touchpads makes it difficult to connect the integrated circuit to a package or substrate, where it can interface with other electrical systems.

Another area where this physical damage causes problems is in System-in-Package ("SiP") integration. It is known that manufacturers prefer that no pad on a SiP be probed more than one time. Such a restriction makes it difficult to touch multiple times during the assembly process flow. Thus, the testing of assembled SiP devices and the components of SiP's is a serious obstacle to large scale adoption of the technology. SiP has seen widespread adoption in memory devices using the stacked approach but little acceptance in other areas. Wireless handsets are beginning to ramp SiP manufacturing but manufacturing yields are a major concern due to Known Good Die (KGD) test reliability. The testing of such heterogeneous SiP modules is a significant and growing problem in the electronics manufacturing industry, where current test technology only allows testing after complete assembly and packaging of the SiP. Rapid growth in the highly cost conscious consumer and communications (primarily cellular phone) applications has magnified this problem. SiPs are seen as an economic way to reduce the time-to-market by the use of small specific function ICs on miniature substrates rather than the time, cost and effort to build completely integrated ICs known as System-on-Chip (SoC). Rather than the vastly more expensive complete circuit integration of SoC solutions, SiP technology enables the best-of-class, best-cost, or best-mixed technologies in separate ICs to be assembled on one SiP substrate.

Typically, the package for an integrated circuit only contains one semiconductor chip. For reasons of size, cost and performance, it is often desirable to place multiple chips inside a single package. However, if multiple, untested circuits are placed within a single package, and a single chip is defective, it becomes extremely costly or it may not be viable to replace or fix the single faulty chip. Hence the entire package, including the working dice, is discarded. This leads to inflated costs.

Consequently, it is desirable to fully test integrated circuits before they are integrated within a single package. However, when there is damage caused by the physical contact experienced in conventional test methods, it becomes difficult to integrate these chips using a SiP approach. Further, Automatic Test Equipment (ATE) and wafer probe environments involve very costly equipment and impart a significant cost to test at the wafer level. Thus semiconductor manufacturers have a dilemma balancing test cost with device yield and therefore, a new technique must be developed that does not damage the substrate during testing.

Unfortunately, testing a SiP is not the same as testing an IC. SiP testing has the challenges similar to system or PCB level testing combined with the technical challenges of chip testing. An example of the latter is the fine placement of test probes required for SiP testing. The inherent flexibility of SiP level integration means that specific ICs included on a SiP are changeable with a smaller non-recurring engineering (NRE) investment than that of a monolithic solution. This means that SiP testing methods must be flexible as well. The design-for-test of single monolithic ICs is not available in SiPs as SiPs typically don't use fully custom ICs.

Like PCB testing IC testing has evolved to include boundary scan testing which is included on many chips and built to a standard, such as the JTAG standard for testing IEEE 1149.1. Boundary scan TAP techniques allow for the testing of ICs on PCBs without the need to individually probe IC pins. This technique overcomes two major economic and technical challenges of SiP manufacturing that is, testing coverage and throughput. This method is also economic in that it uses standard automatic test equipment (ATE) infrastructure and techniques. Extensions to standard boundary scan techniques are needed for multi-device testing on SiP packages.

It is beneficial to interrogate electronic components without causing damage to the devices. One method of avoiding this physically-induced damage is to avoid physical contact altogether using a method of interrogating electronic components in a wireless (rather than wireline) manner. A method to accomplish wireless testing has been described previously. Wireless, non-contact testing can potentially alleviate many of the above SiP testing constraints, allowing for significant improvements in both the economics of SiP manufacturing, and the ability to integrate more test functions with less I/O.

There are several proven and proposed apparatus and methods for enabling contactless testing of IC, of which the following represent some of the current art:

Moore et al. in U.S. Pat. No. 6,759,863 show how a wireless test structure (ring oscillator) may be placed on wafers to gain insight into the fabrication process.

Moore et al. in U.S. Pat. No. 7,183,788 and United States Application 20070162801 describes aspects of control mechanisms on wafers.

Slupsky et al. in U.S. Pat. Nos. 6,885,202 and 7,109,730 describe micro fabrication and I/O cells for IC on-wafers.

Kwark in U.S. Pat. No. 7,215,133 describe die level device differencing with single ended output.

Khandros et al. in U.S. Pat. Nos. 7,202,687 and 7,218,094 Khandros describe forms of signal transfer to testers.

Aghababazadeh et al. in U.S. Pat. No. 7,256,055 describe use of thermal junctions to power test structures.

Walker et al. in U.S. Pat. No. 6,374,379 describe a low cost configuration for monitoring and controlling parametric measurement units in automatic test equipment. The patent discusses block diagram implementation of a PMU.

Ralston-Good et al. in United States Patent Application 2007239163-001 describes die level test structures on wafer.

Roberts, et al. in U.S. Pat. No. 7,242,209 disclose a design for test elements for inclusion in IC.

Hess et al. in 2007 IEEE International Conference on Microelectronic Test Structures, March 19-22, Tokyo, Japan. Paper 7.4; describe an array structure for testing various transistors in a wafer scribe line using contact probes.

Sayil et al. in "Comparison of contactless measurement and testing techniques to a new All-Silicon optical test and characterization method," *IEEE Transactions on Instrumentation and Measurement*, vol. 54, no. 5, pp. 2082-2089, October 2005, present a comparison of eight non-contact probing methods. The optical testing of CMOS dies is of particular focus.

The present method for wireless communication is that of inductive coupling. A current flowing through one inductor generates a magnetic field which extends beyond the inductor. This field induces current in another inductor within close proximity of the first inductor, coupling the two inductors together.

RF techniques are then used to transmit data between the inductors. For example, a digital signal can be modulated by a carrier wave, and then driven through an inductor. The receiving inductor picks up some fraction of this modulated wave, and passes the signal on to a receiver circuit. The use of RF techniques for transmitting data is the reason the inductors are sometimes called "antennae." Many microfabricated antenna designs have been, and continue to be, researched for various applications such as clocking and data transfer. These designs are generally intended for non-test applications and do not meet the cost, performance and data integrity requirements for applications such as SiP testing. The designs presented here create RF transceivers meeting the cost and performance goals of SiP applications. Specialized RF CMOS technologies and other technologies like SiGe are not used for the stated economic reasons, but the concepts may be implemented in these processes for technical reasons. Although many designs may be used for transmitting and receiving data wirelessly, many are not suitable in wafer testing applications since they require a large power budget, or utilize large amounts of silicon real estate on the device under test (DUT) or probe. Additionally, the bit error rate for testing purposes must be extremely low.

The use of RF based interconnects alleviates the need to reduce the number of touch downs on signal i/o (input/output) pads. Further, as has been discussed, KGD levels improve dramatically since a more thorough wafer level test is performed. These two benefits combine to suggest RF based interconnects provide a means for improving SiP process test flow and consequently manufacturing yields.

The method of wireless communication is not limited to inductive coupling, however. It is possible to use other forms of near-field communication, such as capacitive coupling, for communication. As well, far-field communication is also a viable technique, where one antenna receives far-field radiation from a transmitting antenna. Further, optical methods such as lasers, photo diodes, and electro-optic components may be used to couple electronic circuits. Another method involves the use of magnetics such as high speed magnetic circuit (MR, GMR, TMR, etc.) components to couple electronic circuits.

One method for improving manufacturing yields is to perform tests of the SiP during the manufacturing process flow. Such testing enables defects to be identified early in the process and rework and repair to be affected or the component can be discarded and reduces the cost of the discard by eliminating additional process steps and their associated additional value. The implementation of a process flow with just one repair step can have a significant impact on manufacturing yield. SiP's are manufactured with materials that are susceptible to probe damage in the same way as CMOS VLSI integrated circuits.

However, wireless access has limitations. One limitation is that there may be a need to provide power to the device being accessed. A limited amount of power can be provided without physical contact to a chip undergoing access, for example, but the amount of power may be inadequate for accessing of complex multi-component circuits on such a chip. Hence it would be more beneficial to develop a method for accessing electronic components in which the probe can be configured to interface one or both of wireless access and a wireline access methods.

One method to allow physical probing without causing damage is to "ruggedize" the physical contact. For example, use thick metal that will withstand multiple touchdowns or metallurgy that is not compatible with standard manufacturing techniques for integrated circuits but may be applied in a post process. Such metallurgy may include gold contacts, tungsten contacts, etc.

System-in-Package Testing

The testing of SiP modules is a significant and growing problem in the electronics manufacturing industry. In only eight years SiP packaging has grown from less than 5% to nearly 50% of the packaged IC market. Thus SiPs and SiP testing have become multi-billion dollar industries in a very short time. The Semiconductor Industry Association (SIA) defines a SiP as any combination of semiconductors, passives, and interconnects integrated into a single package. SiP economics are based on the ability to combine multiple different technologies (active and passive) into a miniature package.

SiPs are analogous to PCBs (printer circuit board) in the sense that multiple chips and passives are combined using one substrate. SiPs use passive substrates and various technologies combined in a miniature package, including Si, SiGe, 0.13 um, 0.25 um, digital, analogue, RF, bare die, flip chip ICs, etc. However, unlike PCBs the miniature size of SiPs precludes normal testing as the signal connections and the IC pads themselves are miniature and inaccessible, or occupied. Based on experience during development of the IC industry, the cost of testing a SiP is anticipated to grow more quickly than its manufacturing cost as SiPs evolve into more complex designs.

A SiP has the functional complexity comparable to a populated PCB, combined with the inability to provide access or test points for internal signals. Classical PCB testing has evolved to improve test time and coverage by providing the concept of a Test Access Port (TAP), which gives access to signals on the PCB. The test access port, for which the most common standard is JTAG IEEE 1149.1, is used to assist in fault location and thus enable PCB repair and retest in an efficient manner. Repair and retest of SiPs is not viable given their assembly and construction methods. Testing a SiP is not the same as testing an IC. SiP testing has the challenges similar to system or PCB level testing combined with the technical challenges of chip testing. An example of the latter is the fine placement of test probes required for SiP testing. The inherent flexibility of SiP level integration means that specific ICs included on a SiP are changeable with a smaller non-recurring engineering (NRE) investment than that of a monolithic solution. This means that SiP testing methods must be flexible as well. The design-for-test of single monolithic ICs is not available in SiPs as SiPs typically do not use fully customized ICs. Like PCB testing, IC testing has evolved to include boundary scan testing which is included on many chips and built into the JTAG standard for testing. IEEE 1149.1. JTAG TAP techniques allow for the testing of ICs on PCBs without the need to individually probe IC pins.

Package Testing

The earlier mentioned PCB and IC test issues continue for SiP packaging where a set of VLSI ICs, and discrete components are placed onto substrates to create a compact system. SiP assembly includes bare die and flip chip techniques to provide very high levels of system integration in a physically small but low cost package. Additionally, passives can be included as separate parts or even integrated in the SiP substrate. The substrates used in SiPs are evolving along the same path as that of ICs with finer features and greater complexity. The ability to produce large numbers of SiPs simultaneously on a single wafer produces a bottleneck as SiP testing is currently done serially.

The addition of each IC to a SiP substrate has a negative impact on yield during production. Typically, the final packaging is done without the ability to test devices as they are added to the SiP substrate. Even when there is the ability to test devices as they are added to SiPs it is currently not done because of yield loss due to the potential for damage resulting from multiple test probe touchdowns. SiP probe testing requires touchdown and scrubbing of IC Pads. Scrubbing creates some damage on pads, which affects their ability to be wirebonded to the SiP. Another cost is that there is a need for multiple probe card designs for each manufacturing step or individual SiP design. A further reason pre-package testing is limited in manufacture of SiPs is that the number of signals/pads is large if they are individually tested. Additionally, if IC pads on SiPs were accessible for massively parallel contact probe testing there would be yield loss in subsequent wirebonding-manufacturing steps. Even without these issues it is difficult to conceive of how intermediate tests can be done using physical contact methods because of the three-dimensional nature of the SiP assemblies and mixed technologies (flip chip, wire bond, surface mount, discrete etc.) used in manufacturing SiPs. While technology is available to enable such testing, the costs would be very high, requiring investment in multiple multi-level custom probe cards, test stations and time which would be detrimental to SiP economics.

The growth in SiP design wins is driven by cost and the ability to produce miniature yet advanced products. Using Known Good Dies (KGD) is a way to increase yield in products. However, for SiPs it is not always possible or feasible for cost and test time reasons. Thus, for economic reasons, electronics manufacturers often use untested SiPs, partially tested or only wafer tested dies. This means that there is an enhanced level of rejected components, and resultant waste, built into the SiP manufacturing process as it is currently practiced. Because SiPs are normally tested only after packaging, a test coverage gap is created between the starting dies and the final packaged SiP. This gap or test blindness zone can cause problems especially on large volume products, which is the main target of SiP technology. Thus yield improvement is very difficult, and the invested assembly and packaging cost is invested on all units, including nonfunctional ones. Without mid stream testing there is no opportunity to cull defective devices early in the manufacturing value chain. The complete packaging investment is wasted on non-functional SiPs, whose condition is only visible at the end of the packaging process. Yield loss when mounting dies or passives remains invisible without the ability to do test during production. With half of all packaged systems being SiPs, and SiPs only being tested after assembly, there are severe economic costs arising from test blindness.

Thus there is a need for a fast, flexible, and nondestructive method and apparatus for testing of electronic components, such as SiPs.

SUMMARY

There is provided an apparatus and method for wireless testing of one or several IC components on-wafer or on assemblies of ICs on substrates. The apparatus and method can be used before, during and after IC fabrication, in contrast to prior art methods.

According to one aspect there is provided an apparatus for interrogating an electronic component, which consists of a body having an interface for an interrogating device to use as a conduit in reliably performing multiple discrete interrogations of the electronic component without the interrogating device physically touching the electronic component.

According to another aspect there is provided a method for interrogating an electronic component. A first step involves providing a body having an interface for an interrogating device to use as a conduit in the testing of the electronic component. A second step involves performing multiple discrete interrogations of the electronic component via the interface of the body without the interrogating device physically touching the electronic component.

Integrated circuit conductive structures commonly used in modern integrated circuits to couple electronic signals are very fragile and subject to damage during mechanical probing. Damage of the structure can cause failure of the integrated circuit. Further, the mechanical stresses associated with mechanical contact to the structure often induces stresses into the integrated circuit beyond the conductive structure itself leading to additional failure modes of the integrated circuit. Repeated physical contact causes wire bond failure and leads to reliability problems. The approach advocated with the present method and apparatus provides a durable interface that can be interrogated as many times as may be necessary to complete a series of discrete testing protocol. This interrogating can be through wireless probing, physical probing or a hybrid approach involving both.

According to an aspect, there is provided an apparatus for interrogating an electronic circuit supported by a substrate. The apparatus comprises a tester external to the substrate, the tester comprising a tester transceiver. A testing circuit is supported by the substrate and connected to the electronic circuit. The testing circuit comprises a processor and a testing circuit transceiver in communication with the tester transceiver for transmitting instructions from the tester to the processor and for transmitting results of an interrogation from the processor to the tester. The processor processes instructions from the tester to interrogate the electronic circuit with an interrogation corresponding to the instructions, and the processor receives the results of the corresponding interrogation.

According to an aspect, there is provided a method of interrogating an electronic circuit during manufacture of the electronic circuit on a substrate. The method comprises the steps of: providing a testing circuit supported by the substrate and connected to the electronic circuit, the testing circuit comprising a processor and a testing circuit transceiver; transmitting instructions from a tester to the testing circuit; processing the instructions using the processor; and interrogating the electronic circuit using an interrogation corresponding to the instructions.

According to an aspect, there is provided a method of interrogating an electronic circuit supported by a substrate during manufacture of the electronic circuit. The method comprises the steps of providing a testing circuit supported by a substrate, the testing circuit comprising a testing circuit transceiver for communicating with a test probe and a processor for processing instructions from the test probe, the testing circuit being electrically connected to the electronic circuit; instructing the testing circuit to interrogate the electronic circuit using a first interrogation; applying a manufacturing step to the electronic circuit; and instructing the testing circuit to interrogate the electronic circuit using a second interrogation.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 9 illustrates an on-wafer A to D or A to t converter to provide a controllable output voltage, with communications capability, the output voltage in relation to switches' status as a function of time.

FIG. 10 illustrates a D/A converter and its functions.

FIG. 56 illustrates an apparatus for interrogating an electronic component with an antenna and a wireless RX2 mounted to the same substrate.

FIG. 57 illustrates an apparatus for interrogating an electronic component having an electronically contactable test port and a transmitter RX2.

FIG. 58 shows schematically the apparatus for interrogating an electronic component shown in FIG. 57 hardwired into electrical contact with a substrate through which it is in communication with two devices under testing.

DETAILED DESCRIPTION

Figure 1A:
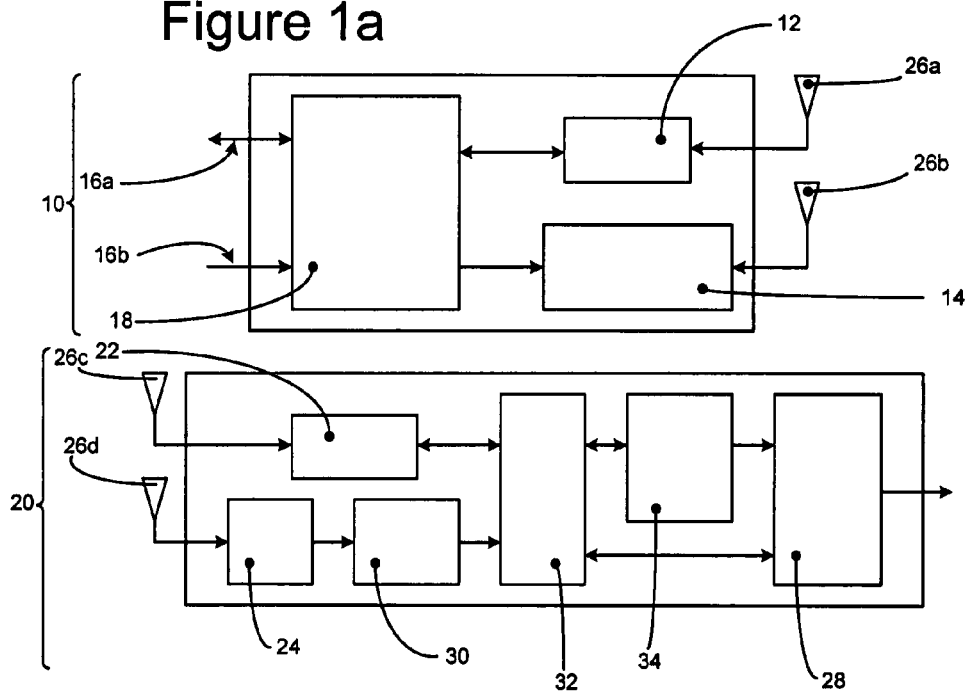
FIG. 1a is a block diagram showing a Probe and a corresponding DUT (Device under Test).

The discussion below relates to a methodology and apparatus for wireless testing of one or several IC components on-wafer. The apparatus and method can be used before, during and after IC fabrication. The prior art technologies provide supporting technical evidence for aspects of the current monitoring scheme, or can be applied with implementation of the current monitoring scheme.

The term "DUT" is typically used to refer to an on-chip or on-wafer structure added to perform tests. This is the generic use of the word. In general however the specific device under test may be part of the overall structure. An example is a DUT resistor or sub component which is being tested on a wafer. In any case it is understood by those versed in the art that DUT can refer to both the added elements and/or the sub element. Included in the current teachings is discussion of parametrics of tests and methods and techniques to access the values of the parameters. These parameters represent fundamental information about chip circuit or IC operation and are used for process monitoring or quality control in manufacturing and test. There may be direct parametric measurements as well as indirect measurements. An example of a direct measurement is a voltage measurement while an indirect measurement is the frequency of operation of a circuit proportional to the voltage. The underlying parameter of interest is the voltage. These direct and indirect methods are discussed below. A common industry method for external measurements is to include in external testers a Source Measurement Unit or SMU. An SMU allows the tester to have the generic functions of sourcing voltages and currents and as a result is flexible and can be programmed to measure parameters under differing conditions. There may be both the direct and specialized parametric measurements as well as the more generic SMU measurement methods. The teachings discussed below allow on the DUT side the flexibility to be specific where needed and generic where the economics or value of a test guides the selection. Also included is the concept of an overall test framework which can include SMU and specialized testing such as high speed testing. Other test frameworks may also be included such as JTAG or Boundary Scan testing which may be used in a contactless and beneficial manner. The integration of Parametric and SMU and general wireless and partially wireless testing then allows the concept of Process Control Monitoring (PCM) to be enabled in a more efficient and complete manner. PCM is a valuable resource for manufacturers which allows them to reduce costs and increase process control and product yield. In general adding more test knowledge and these results is a large economic advantage to those who implement such processes as are discussed herein.

The concept of a DUT is used to describe the Device Under Test. The terminology is useful, but the DUT may be considered a single element such as a resistor or an assemblage of parts such as an amplifier or a memory/logic element or an assembly of parts. DUT in the generic sense can also refer to the complete device being tested which can include communications elements and other ancillary elements which make the tests possible. DUTs and Sub-DUTs are generally on the wafer or SiP side. The definition is however incomplete in that the teachings herein cover the case where elements of the tester are included on the DUT such as the example of a SMU. In this case the DUT can be considered whole of the circuits on the wafer/sip/MCM and sub-DUTs are those elements which the SMU is tasked with obtaining direct or indirect measurements from.

The term "processor" is used to describe element in the system which interacts with devices under test on chip or on wafer and which is used to perform certain actions. The processor processes instructions from an external tester and interprets these as high level abstractions which the processor then uses to create a sequence of steps. The instructions or abstractions can be high level, which in this case means that the processor instantiates a series of sub actions, sub-tests, configurations of test elements etc. Where the instructions are low level, the processor instantiates a more limited set of sub-actions. The processor receives communications from the external tester and also creates return information which it transmits back to the external tester. The return signals may be abstractions of status such as acknowledging commands or status of the processor or they may be status of a completed task. As well the return signals may encode test results such as a voltage or frequency which represents a test result. Note that the processor may also commence functional testing for example test a logic function by activating logic functions on a device under test and comparing or returning results. In this case the processor may send back a high level abstraction such as status of the completion of the test correctly or incorrectly, or it may send back test vectors or the raw functional results. The concept of the processor can be implemented to do simple functions or more complex ones depending on need and economic utility. The processor may also be reprogrammable such that, as the testing progresses, the processor is able to be reprogrammed to perform other tasks or to be more efficient. The processor also controls sub elements which process analog functions and as such extract parametric information which can then be communicated back to the external tester in raw or encoded or high level form. An example would be transmitting the raw value of a voltage or an encoded voltage or simply a pass fail voltage. The actions of the processor are on the one hand communication and on the other hand controlling actions. Sub elements such as sources or signal multiplexing or test resources on chip or on module or on wafer are controlled by the processor. This configuration activity also includes managing the DUT and how the DUT is connected logically or in an analog manner with the testing resources. Where the DUT is not contained within complete control of the processor, the processor is configured to interact with the DUT and share control with the function of the product device. Such a situation may arise during functional test which may use resources not controlled by the processor or where the testing is complete and the DUT becomes part of the broader function of the end product or device.

The method and apparatus discussed herein will be referred to as on-wafer wireless process monitoring. It includes many aspects of wireless testing and is useful for conducting parametric tests, recognized to be a large part of process monitoring, and functional tests. Included in the apparatus are contactless source measurement units (SMU), system and parts thereof, communications and control of wireless test units. The method includes use of ultra low power testing techniques to assist testing during the fabrication of semiconductor wafers. It is especially useful for testing IC fabricated on wafers, and includes the capability to test systems based on silicon wafers, silicon germanium wafers, and IC hybrid circuits, LCD panels and other wafers and structures including individual IC multichip modules, and silicon-based integrated circuits.

The method and apparatus includes a system in which in line process monitoring can be carried out at various stages of semiconductor wafer fabrication. Included are contactless source measurement units (SMU), control mechanisms and schema sequencing and timing, and communications links for registration and data transfer including both analog signals and digital signals.

Because the system is no-contact it can be enhanced by the use of ion, electron or photon injection into test sites. Because the system is non-contact it can be used in vacuum, thus enabling non-contact charge injection early in the manufacturing process to perform testing of C-V and I-V characteristics. Further, these tests can be conducted in association with earlier more basic tests such as electron beam charge injection.

Semiconductor manufacturers want to observe and test various systems during the production of IC. For front end of line testing there are several tests which relate to important production issues (TABLE 1), and there is the need for testing of samples after manufacture ("back end testing") (TABLE 2).

Various front end tests are enabled using the contactless technique by itself or enhanced by the above techniques, including:

Measurements of C-V and I-V: product wafer measurements

Using light contamination measurements, minority carrier diffusion length/lifetime and quantitative metallization and diffusion measurements.

Using on-wafer charge pumps and control dielectric leakage measurements and evaluation of gate oxide integrity (GOI), and dielectric parameters using on-wafer charge pumps and control dielectric leakage measurements.

Non-contact C-V: dielectric charge and interface measurements, determination of capacitance and Oxide Thickness (EOT) for dielectrics and with a charge pump within tunneling range.

Non-contact C-V: dielectric charge and interface measurements for dielectrics in the low leakage F-N tunneling.

CMP, etch, and Plasma Damage Monitoring.

Surface level effects including charge injection.

TABLE 1

Tests related to manufacture of IC on-wafer.

| Application | Potential problems | Result | Potential test |
|---|---|---|---|
| Polished wafers | Heavy metal contamination | GOI | CV, Frequency |
| Annealed wafers | Surface Asperity & COP's | GOI | CV, Frequency |
| Epi Wafers | Heavy metal contamination | GOI | CV, Frequency |
| | Doping: near surface | VT | Vt tests |
| Wafer Cleaning | Heavy metal contamination | GOI | Via chain |
| | Mobile ion contamination | Reliability | High temp Freq tests |
| Diffusion | Heavy metal contamination | GOI | CV/VI |
| | Ion contamination | Reliability | High current tests |
| | Oxide charge | VT | CV |
| | Dopant/surface contam. | VT | Vt |
| | Oxide & interface quality | GOI | various |
| Plasma etch/ash | Charging damage | GOI/VT | various |
| | Ion contamination | Reliability | various |
| | Radiation damage | GOI | various |

TABLE 1-continued

Tests related to manufacture of IC on-wafer.

| Application | Potential problems | Result | Potential test |
|---|---|---|---|
| Thin films | Dielectric capacitance, and K | Capacitance | Frequency/ |
| | Charging damage | VT | various |
| | Oxide charge and Dit | VT | various |
| | Leakage | Integrity | various |
| Ion Implant | Implant concentration & profile | VT | CV, Fet |
| | Heavy metal contamination | GOI | various |
| | Electron/Plasma flood | VT | various |
| Advance dielectrics | Dielectric capacitance, Equivalent oxide thickness, | C | CV/Speed |
| | EOT, K | VT | CV |
| EOT | Dielectric leakage | Leakage | V-I |
| | Dielectric charge | VT | various |
| Plasma | Dielectric capacitance, | VT | various |
| Nitrided | EOT, K | EOT | various |
| Oxides | Dielectric leakage | Leakage | Frequency |
| | Dielectric charge | VT control | CV, Fet |

TABLE 2

Back end of line testing

| Application | Potential problems | Result | Potential test |
|---|---|---|---|
| Cu CMP | Cu contamination/ | GOI | CV |
| | Barrier integrity | GOI | High voltage |
| Low K dielectrics | Capacitance: K Frequency/time | | Switching speed |
| | Leakage | Switching speed | Frequency/time |
| Plasma Damage: | Heavy metal contamination | GOI | CV IV |
| Thin film deposition | Mobile Ion contamination | Reliability | various |
| Etching/Ashing | Oxide charge | VT | various |

A key benefit of this method and apparatus is the ability to measure one or more parameters both before and after one or many steps during the manufacturing process, thus determining any difference arising between front end of the manufacturing line and back end. For example, features that may be tested include metal interconnect integrity and dielectric integrity. Functional tests can be performed on blocks of circuitry such as memory, processing units, logic elements and blocks, power devices, ring oscillators, etc.

An apparatus and method for on-wafer wireless process monitoring will be further described with reference to FIG. 1a through 30.

A wireless PCM can be implemented using a probe device 10 and a device under test (DUT) 20, which may also be referred to as a testing circuit, as described above. A top level block diagram of a probe 10 that is an interface between a DUT and testers, and specifically, is used for interrogating the DUT is shown in FIG. 1a. A top level block diagram of a corresponding DUT 20 is also shown in FIG. 1a, such as a DUT in wafer, board, module, IC, or multiple items. Probe 10 includes a probe transceiver 12, at least one probe wireless power transfer block or generation circuitry 14 and an interface 18 to a tester (not shown). Element 16a represents signals and test results, and element 16b represents test and control signals from the tester. Transceiver 12 is a transmit and receive processor of wireless test signals to and from DUT 20. DUT 20 includes a DUT transceiver 22 used to process wireless test signals to and from tester interface 18, at least one DUT wireless power module 24 that includes power control circuit elements that receive and condition power, a plurality of test devices or electronic circuits to be tested (not shown) and a processor 28 in the form of a parametric measurement unit (PMU). It will be understood that DUT 20 may be used to test a single electronic circuit, or multiple circuits. The electronic circuits are supported by a substrate, meaning that they may be integrally formed as an integrated circuit on the substrate, they may be manufactured separately and mounted on the substrate, the circuits may be a combination of the two, or any other known technique for manufacturing electronic circuits on substrates. It will also be understood that processor 28 may also be a source measurement unit, or any other design based on the discussion presented above. The role of processor 28 is to process instructions received from the tester via probe 10 to interrogate the electronic circuits to be tested with an interrogation corresponding to the instructions. The functions that are included within processor 28 will depend upon the preferences of the user. Examples of possible functions will be discussed in more detail below. For example, processor 28 also preferably receives and processes results from the interrogations of the electronic circuits.

Figure 1B:
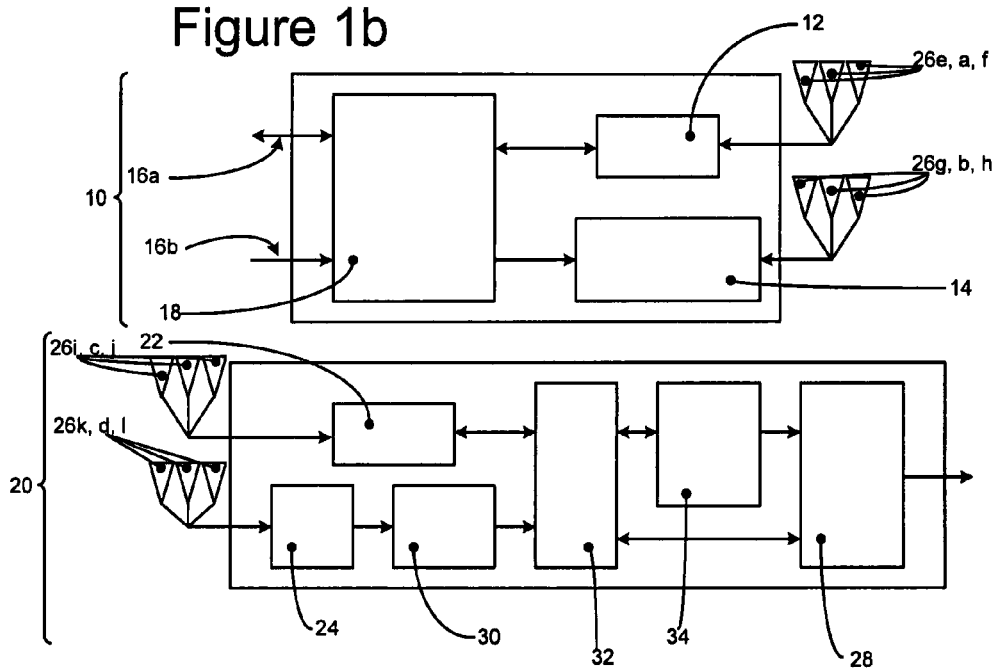
FIG. 1b shows a variation of FIG. 1a with an implementation of the probe and the DUT that utilizes multiple antennae.
Figure 1C:
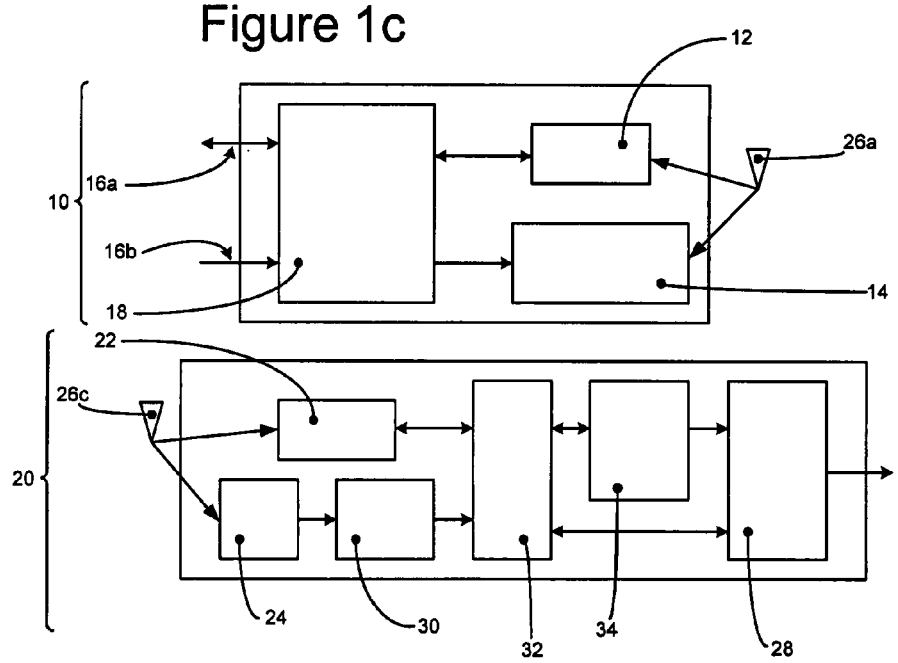
FIG. 1c shows a variation of FIG. 1a with an implementation of the probe and the DUT that utilizes combined antennae for both power and signal transfer.

A series of antennae are used to transmit the various wireless signals, such as test signal antenna 26a on tester interface 18 that communicates with test signal antenna 26c on DUT 20, and a power transmitter, which is depicted as a power antenna 26b on tester interface 18 that communicates with a power receiver, or power antenna 26d on DUT 20. Referring to FIG. 1b, other antennae 26a through 26l may also be used as shown. A power conditioner 30 conditions power to a control interface 32. An AC/DC converter 34 interconverts AC and DC signals between PMU 28 and control interface 32. In turn, PMU 28 includes the following sub blocks: at least one current measure instrumentation amplifier; at least one voltage measure instrumentation amplifier; at least one femtoampere current measurer; at least one force voltage amplifier (sweeping capability, controlled by D/A); a switches bank; integrated resistances for range selection; and a variable amplitude oscillator for CV measurements. AC/DC converter 34 is not restricted to classical A/D and may utilize Analog to Frequency or Analog to Time conversion techniques and Digital to Frequency or Digital to Time techniques.

Implementations for the Processor Blocks

Figure 2:
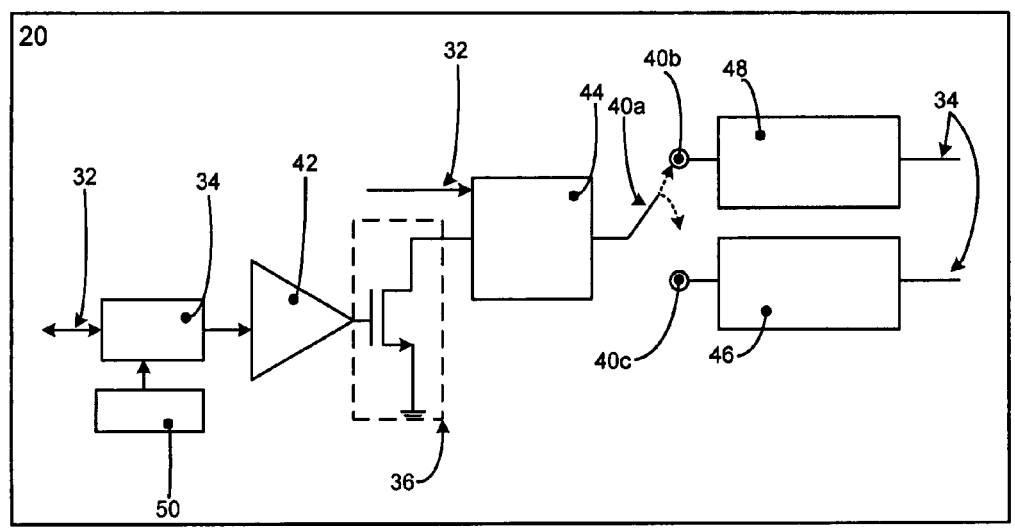
FIG. 2 is a block diagram of an I-V measuring system.

Referring to FIG. 2, another circuit 40 is used for measuring the drain current versus the gate voltage characteristics of an IC. In this example, the processor is a PMU. The number of bits of the D/A can be set to provide 10 millivolt increase in the output of a voltage force amplifier 42. The range select resistors 44 are selected based on the required current that needs to be measured. The femtoampere current measurer 46 can be used to measure currents in the femtoampere range. A sensitive current amplifier 48 such as the amplifier used in Idd testing can be used to measure currents in the nanoampere and microampere range. Current measure instrumentation amplifier 48 can measure currents in the microampere and milliampere range. D/A converter 34 before voltage force amplifier 42 has a reference device 50.

Figure 3:
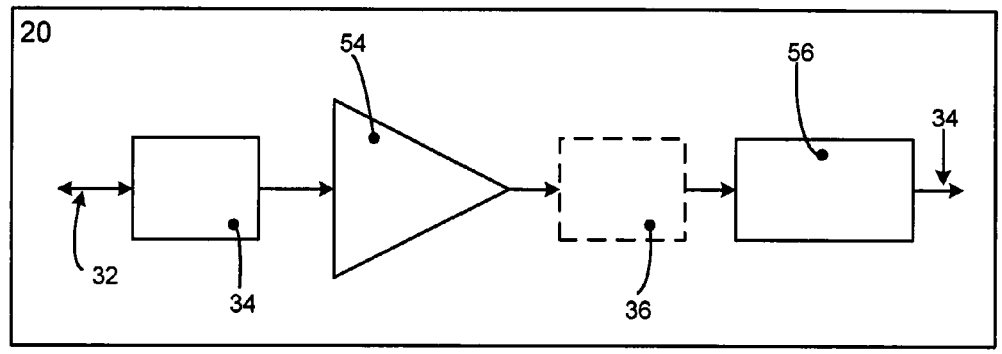
FIG. 3 is a block diagram of a resistance measuring system.
Figure 4:
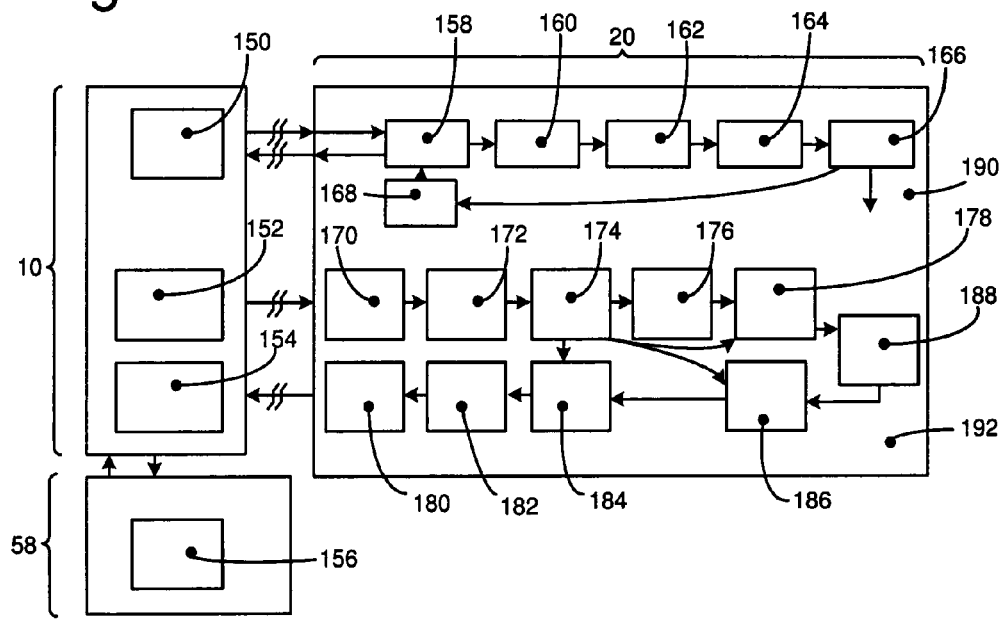
FIG. 4 shows the intercommunications between the various components of a tester (probe card) and a device under test (IC/Sub-circuit/wafer).

Referring to FIG. 3, another embodiment which is used for measuring resistance values. The number of bits of the D/A can be set to control of the output of a current force amplifier 54. There is a DUT 20, such as a sub-element within an IC or wafer being measured. The voltage measure instrumentation amplifier 56 measures the voltage drop over the DUT. The output value of the current force amplifier 54 and the output of the voltage measure amplifier 56 are passed to the A/D converter 34 and to the control unit 32 to calculate the value of the measured resistance. Element 36 is the sub circuit or sub DUT in this case a resistor of which there are many types which can be implemented in a integrated circuit FIG. 4 shows the directions of communication between the various components of an automatic test equipment (ATE) tester 58, probe device 10 and a DUT 20. Reset circuitry is included to either externally reset SMU under power cycling or reset under command with external communications. Tester 58 has ATE circuits 156 contained within it. Probe 10 has a power transmitter 150 to transmit power to DUT 20, a transmit control communication circuit 152, and a receive test results/status communication circuit 154. DUT has antennae 158 for power transfer and feedback. DUT 20 also has rectification circuits 160 for AD to DC conversion, protect circuits 162, energy storage 164, voltage or current regulator 166, feedback voltage and/or current for power control 168, a receiver antenna 170 for control signals, a receiver circuit 172, a circuit 174 for control logic, state machine, or microcontrol, stimulation circuits 176, stimulation multiplexer 178, transmitter antenna 180 for transmitting test results, a transmitter circuit 182, V to F/T and Ito F/T measurement circuits 184 to convert raw measurements into conditioned signals, test structures 188 which may include sub-elements to be tested, such as resistors, capacitors, and active elements logic and memory devices, and power 190. The DUT/IC/wafer is represented by reference numeral 192.

Figure 5:
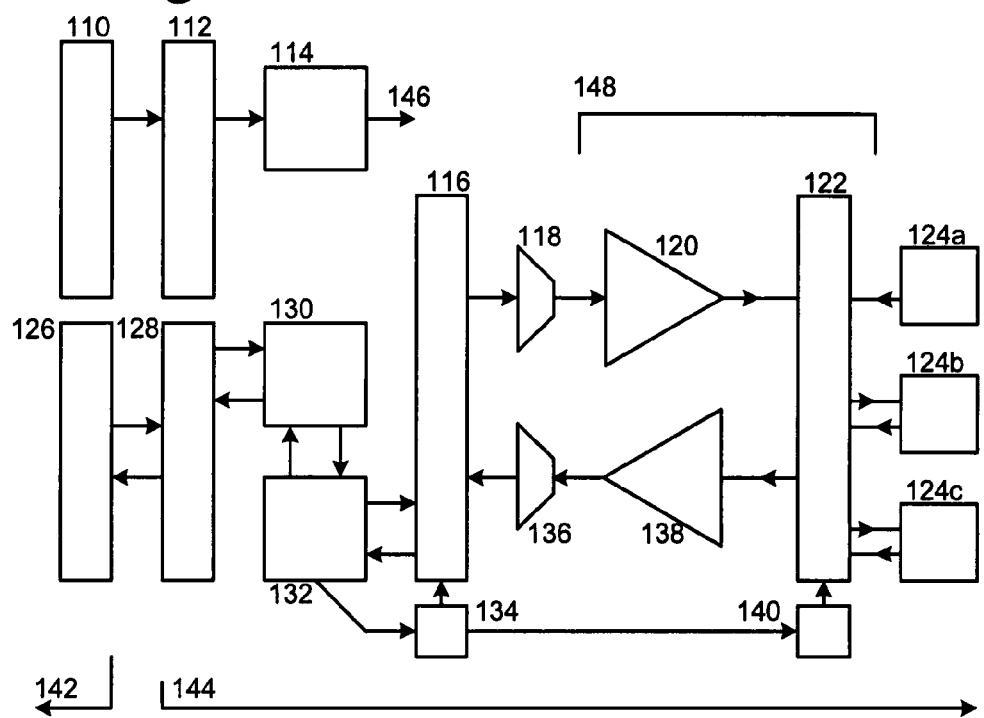
FIG. 5 is a diagram showing components of an on-wafer measurement system.

FIG. 5 shows the relationships between components of an on-wafer measurement system. Reference numeral 142 refers to off-wafer tester, while reference numeral 144 refers to on-wafer devices/elements/structures. An on-wafer SMU is represented by reference numeral 148. One or more off-wafer power antennae 110 communicates with rectification circuitry 112. Power is conditioned by power conditioning circuitry 114, and is then transmitted for on-wafer power distribution, represented by arrow 146. One or more on-wafer signal/control antennae 126 communicates with modulation/demodulation circuitry 128, which communicates with master/signal control register 132 through signal/control conditioning circuitry 130. There is an A/D D/A command register 134 and an A/D D/A control register 116. Signals are communicated to and from on-wafer SMU via D/A circuit(s) 118 and A/D circuit(s) 136. SMU 148 includes SMU drive circuit(s) 120 connected to a SMU-DUT connection matrix 122, SMU sense circuit(s) 138, and a connection matrix control register 140. SMU 148 is connected to one or more DUTs represented by 124a, 124b, and 124c to transmit test queries, and to receive the responses.

Figure 6:
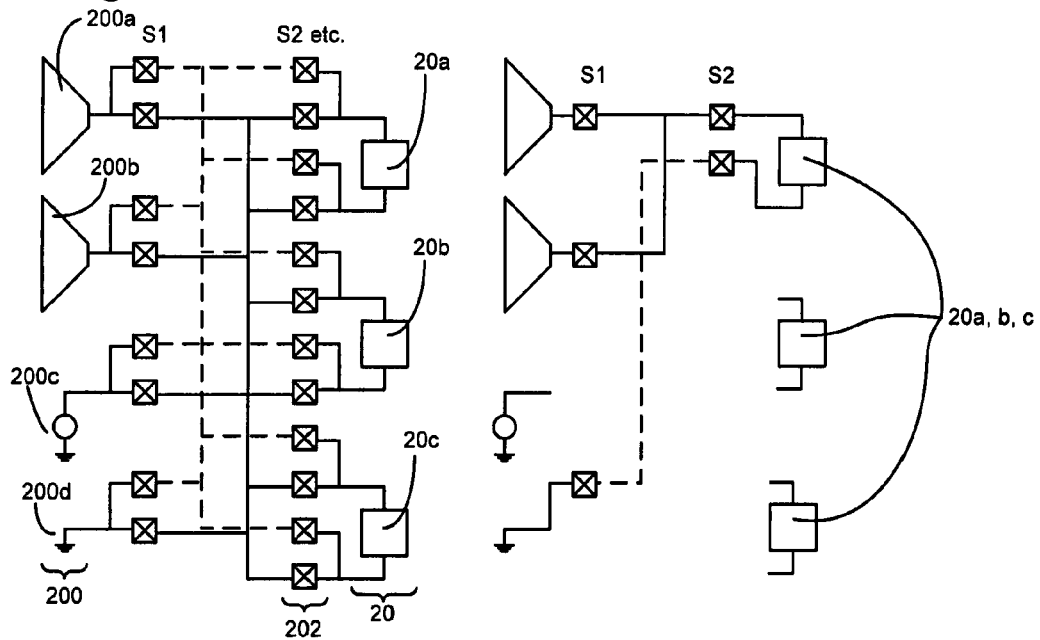
FIG. 6 is a diagram of an on-wafer signal multiplexer switcher which enables multiplexing of tests and on wafer DUT resources to perform various tests on various sub-elements or sub-DUTs.
Figure 7:
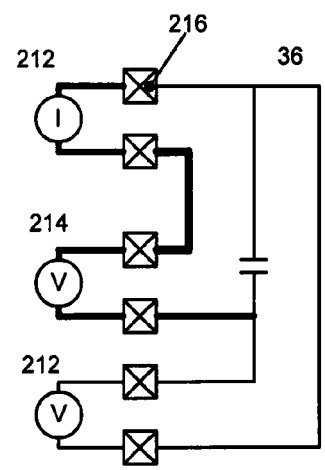
FIG. 7 illustrates four-wire or Kelvin measurements, in this illustration the sub-element under test is a capacitor C. This similar method can be used for simple and complex devices.

FIG. 6 illustrates an on-wafer signal multiplexer switcher 60. Elements 20a, 20b and 20c represent the particular sub-elements or sub-DUTs to be tested. Elements 200 represents SMU resources such as voltages, currents, opens, shorts, etc. In particular, there is shown a D/A converted 200a, an A/D converted 200b, a voltage reference 200c, and a ground 200d. Reference numeral 202 represents analog switches, such as switches S1n, which configure resources, and switches S2n, which configure sub-elements or sub-DUTs. Switches S1 and S2 are energized to connect various resources 200 to various points on devices under test 20. In this way tests can be performed in a programmed way sequentially optimizing time and tester resources under the control of the tester.

In most configurations there is a requirement for multiple sources and multiple measurements. Consequently, it is useful to have four-wire or Kelvin measurements, shown in FIG. 7, to reduce the possibility of measurement error. So, in this case, a voltage source 214, and measurement devices 212 that measure current and voltage de-embed wire losses in the circuitry and enable higher accuracy. Switches 216, such as transistors, FETs transmission gates, etc. allow test configuration of sub-element element 36 (in this case a capacitor) under examination/measurement. For transistor characterization measurements, use of two voltage sources with a current measurement and two voltage measurements increase accuracy. To simplify the circuit, these measurements may be multiplexed over time to achieve similar results. In addition, 4-wire measurements can be used to overcome wire losses in measurements and make the system more accurate. In this case, the voltage measurement device 212 overcomes measurement error due to IR drop (represented by the thick black lines) from voltage source 214 and current measurement 212 lines to the element under examination 36. This is known as a Kelvin measurement. It is advantageously utilized in this device as there are no IR losses due to contact resistance in this contactless method of measurement.

Figure 8:
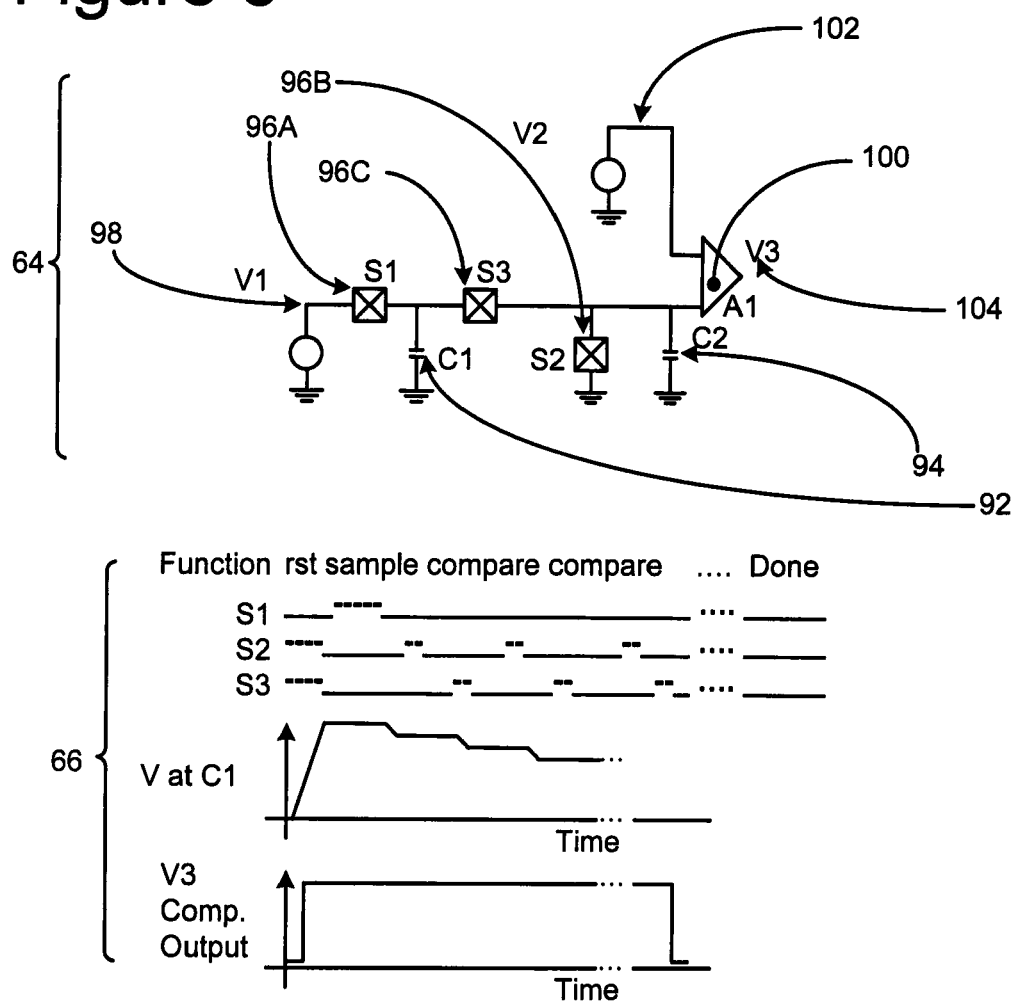
FIG. 8 illustrates an on-wafer A/D converter shown in FIG. 6, and the functions and time sequence used to generate the analog to digital conversion.
Figure 11:
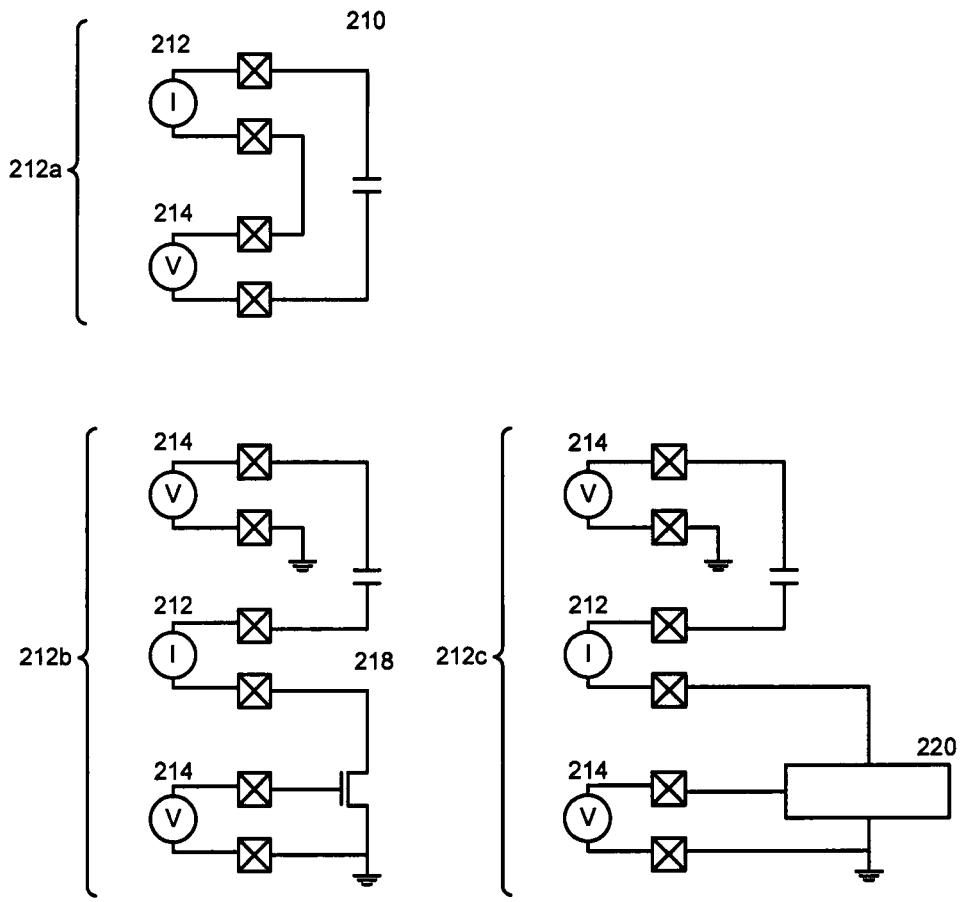
FIG. 11a through 11c illustrate examples of on-wafer DUT structures and sub structures that may be tested.

FIG. 8 illustrates the structure of an A/D converter 64 of on-wafer signal multiplexer switcher 60 shown in FIG. 6, and its operation as a function of time 66. A/D converter 64 includes a sample capacitor 92, a storage, or compare capacitor 94 that is used as a reference capacitor to the unknown sample capacitor voltage. Preferably, the capacitance of capacitor 94 is much larger than capacitor 92 so that multiple samples of capacitor 92 can be used to increase resolution. There is also a series of switches 96A, 96B, 96C, an input voltage provider 98 with an unknown voltage V1, and an amplifier/buffer 100 with a reference voltage supplier 102, so as to controllably provide an A/D output comparator voltage 104, which is preferably a timed signal. The digital value of input voltage provider 98 will be equivalent to the number of times capacitor 94 is compared and discharged. In the depicted embodiment, a simple small set of circuits is used to perform a voltage to digital timed conversion. The time based operation 66 of switches 96A, 96B and 96C are illustrated graphically along with the output comparator voltage 102. While the diagram shows, as an example, an analog voltage conversion, it will be recognized that there may also be analog current conversions as well as analog resistance, charge and other basic electrical characteristics. On-wafer A/D intelligence is communicated off-wafer by means of several methods. One method is to turn the time of a conversion into a representative RF signal whose time is proportional to the input analog signal. A very low power method of doing this is to send a pulse at the start of the conversion and, once conversion is ended, a second pulse is sent. The time difference between these two events is representative of the analog voltage or current. In some cases, if the ATE is controlling the start of the conversion, the first pulse can be ignored and the ATE timing plus the conversion end timing is representative of the analog voltage, current or charge.

Referring to FIG. 9, an on-wafer voltage to time, or A to t, converter system 70 is used to produce a time-based RF signal. At least one of a length of time of RF communications and a time between RF communications is proportional to the analog voltage, as shown by signal-time plots 72. On-wafer A to t converter 70 includes a ground connection 74, on-wafer unknown sub-element or sub-DUT voltage, A/D converter 64, a RF modulator 76 that results from the A/D conversion and an aerial 78, or DUT transmit antenna for return signals to the tester. The input voltage is represented by V1, and the comparator output is represented by V3. The on-wafer A/D output is used to produce a time-based RF signal. The length of time of the RF communication or the length of time between RF communications is proportional to the analog voltage. The sequence of events graph showing timed signal output is indicated generally by reference numeral 72.

Referring to FIG. 10, an on-wafer D/A converter 80 comprises a sample capacitor 82, a storage capacitor 94, a series of switches 86A, 86B, 86C, a reference voltage provider 88, and an amplifier/buffer 90, so as to controllably provide a D/A output voltage 92. The time based operations of switches 86A, 86B and 86C are illustrated graphically along with the output voltage 92. The graph indicated generally by reference character 80a is a time sequence showing the state of the switches to achieve an analog output controlled by the sequence of the tester.

The present teachings may be used for testing of various on-wafer DUT, some examples of which are illustrated in FIG. 11a through 11c. The various structures include, but are not limited to: capacitors manufactured from metals or semiconductors and their junctions; metal or polysilicon resistors; inductors; active elements such as transistors, FET and diodes; and aggregations of elements forming complex DUT such as ring oscillators, I/O cell structures, processing units, memory structures and devices, simple gates and complex gates. Source and measurement units are connected as required to perform one or more tests. In one example, a resistor will be connected to a source ramp voltage and means to measure current. In another example, an FET or an active circuit will be connected to a source voltage and to measurement device for measuring one or both of current and voltage. In another example, a capacitor may be connected to a source ramp voltage and a measurement current. In each of these examples, there is a measurement device 212 and one or more sources 214. Referring to FIG. 11a, element 212a represents a force source of V and a measure of I in this case a capacitive structure 210 is measured. Referring to FIG. 11b, element 212b shows a force of V and a second force source of V to measure the I of a FET 218. Referring to FIG. 11c, element 212c shows a force source of V on a Capacitor C to measure the current of a transient complex DUT 220 under a second force of V.

Figure 12:
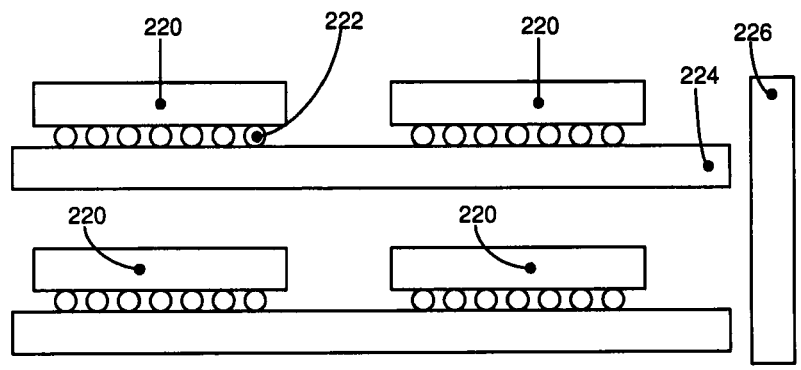
FIG. 12 illustrates a Multi-Die Board/SiP/MCM module to be tested.

FIG. 12 illustrates a Multi-Die Board/SiP/MCM module to be tested. This figure illustrates that the present teachings can be used for MultiChipModules (MCM) which is another form of IC integration and packaging. FIG. 12 elements include an IC package 220, a ball bond 222, system-level board 224, and board interconnect 226. Later illustrations will show how this type of structure can be tested.

Figure 13:
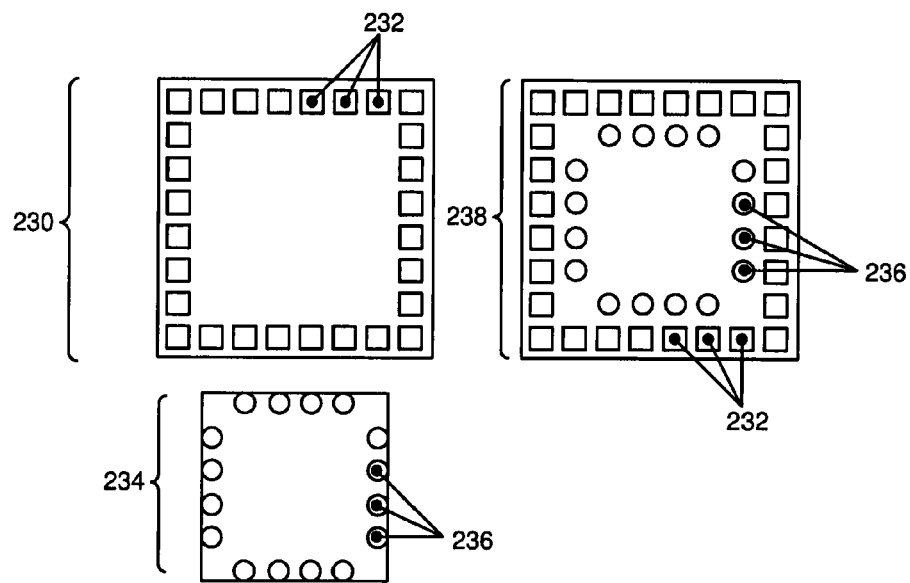
FIG. 13 illustrates Die Test Locations available on an IC on bond pad locations or inside of pad locations.

FIG. 13 illustrates Die Test Locations available on an IC on bond pad locations or inside of pad locations. This figure illustrates the various locations available on a wafer for test structures. FIG. 13 elements include a normal pad frame 230, bond pads 232, wireless I/O probe head 234, antenna(e) 236, and wireless I/O pad frame 238.

Figure 14:
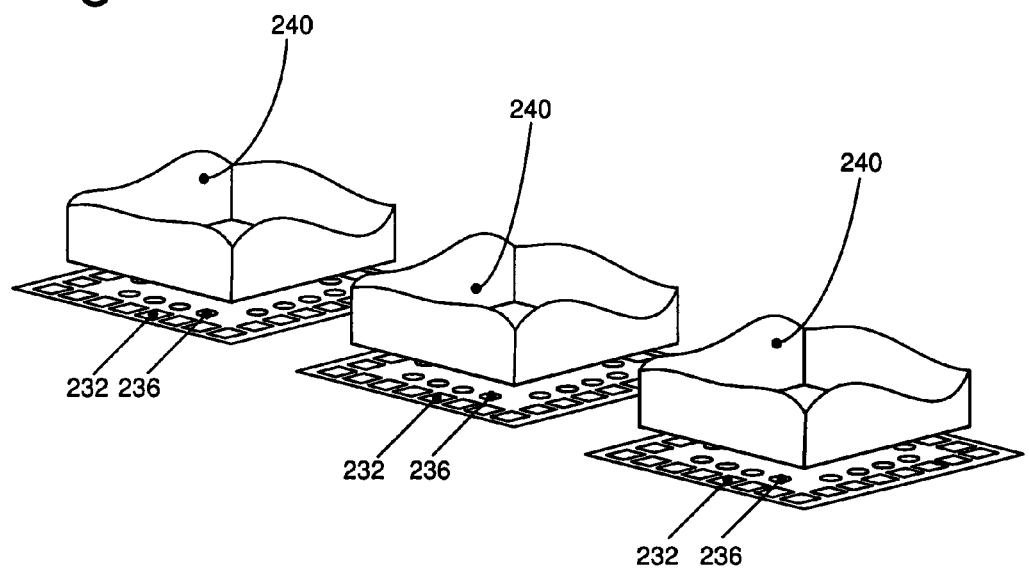
FIG. 14 illustrates a Multi-Head Probe Head which can be used on wafers or SiPs to test multiple DUTs simultaneously.

FIG. 14 illustrates a Multi-Head Probe Head which can be used on wafers or SiPs to test multiple DUTs simultaneously. This figure illustrates the concept of multiple test heads leading to improved economics through parallel testing which is enabled by the present teachings. FIG. 14 elements include bond pads 232 antenna(e) 236, and DUT bottom and cutaway view of wireless I/O probe head 240.

Figure 15:
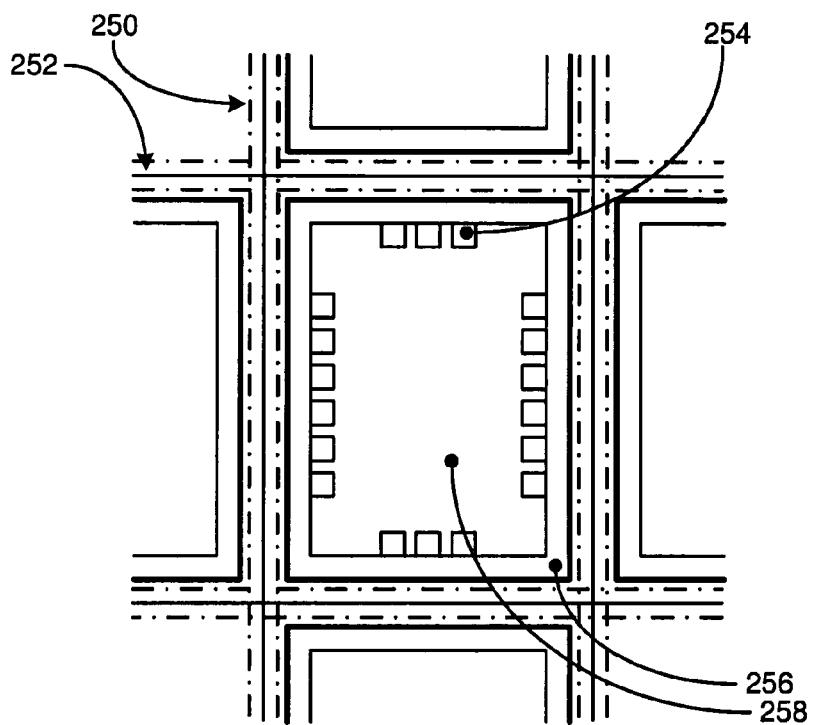
FIG. 15 illustrates Die Scribe Highway and potential Test Locations which occur inside and outside the Die and Scribe areas.

FIG. 15 illustrates a Die Scribe Highway and potential Test Locations which occur inside and outside the Die and Scribe areas. This figure details test areas available on a wafer. FIG. 15 elements include vertical scribe cut lines 250 and horizontal scribe cut lines 252 that exist in the wafer and are cut out at dicing time. These can be used for test structures or DUT control. There are also pad locations 254 on die that can be used as part of testing DUT or connections to test circuitry, pad ring area 256 that can be used for DUT area, and IC or Die core area 258 that can be used for DUT or structures or as IC.

Figure 16:
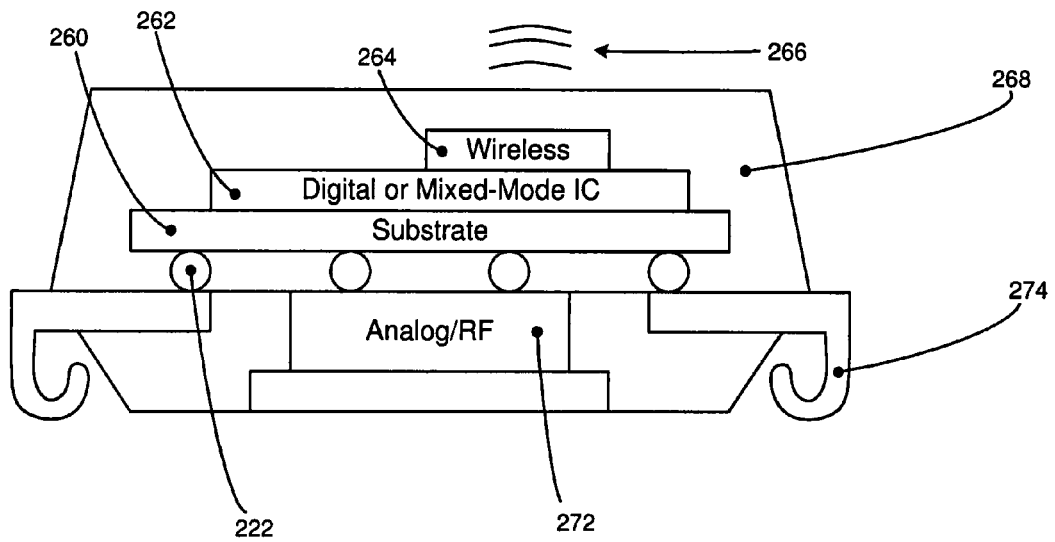
FIG. 16 illustrates a Multi-Die In-Package Test, showing the method and apparatus can be used for packaged testing or further testing post wafer dicing.

FIG. 16 illustrates a Multi-Die In-Package Test, showing the method and apparatus can be used for packaged testing or further testing post wafer dicing including packaging which includes multiple elements and multiple levels. Note that the wireless testing can be done with power supplied using the normal contacts to the IC/device power pins e.g. element 274. FIG. 16 elements include ball bond 222, substrate 260, digital or mixed mode IC 262, wireless elements 264, communication elements 266 fill 268, and analog/RF elements 272. Note this is an embodiment of the teachings herein and in practice the IC/Package may have more or less elements as the end product dictates. It might be all digital or analog and this does not limit the usefulness of the process and apparatus but in fact shows wide applicability.

Figure 17:
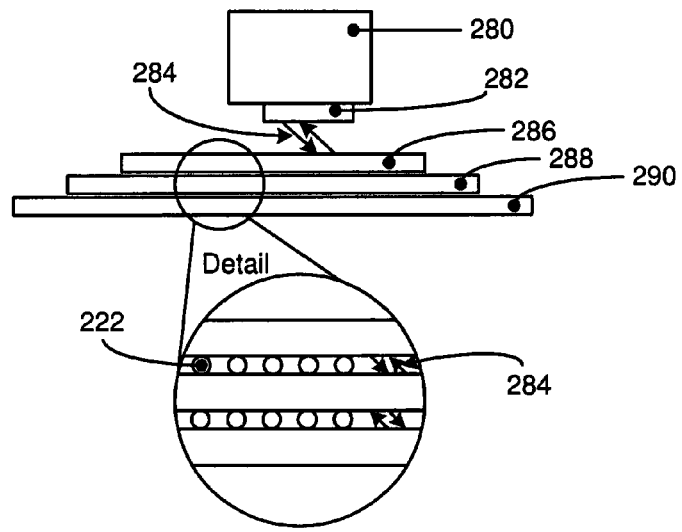
FIG. 17 illustrates a Stacked Die-to-Die Testing, illustration of how the method and apparatus can be used for testing stacked dies.

FIG. 17 illustrates a Stacked Die-to-Die Testing, illustration of how the method and apparatus can be used for testing stacked dies before final encapsulation and packaging. FIG. 17 elements include ball bond, chip to chip, die to die spacers or interconnect 222, probe 280, probe head 282, wireless test and control signals 284, top stacked die 286, middle/bottom stacked die 288, and bottom die 290, or substrate in the case of MCM or SIP.

Figure 20A:
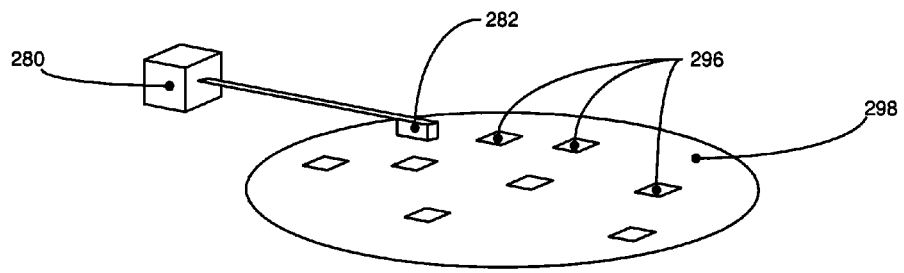
FIG. 20a illustrates a Single-Head Wafer Test, showing testing on with a single test site characterizing a wafer.

FIG. 20a illustrates a Single-Head Wafer Test, showing testing on with a single test site characterizing a wafer. This can be used for testing at a wafer level. This can be used also where the substrate contains multiple discreet elements such as SIPs on a wafer. FIG. 20a elements includes probe 280, probe head 282, IC test sites 296, and wafer 298.

Figure 20B:
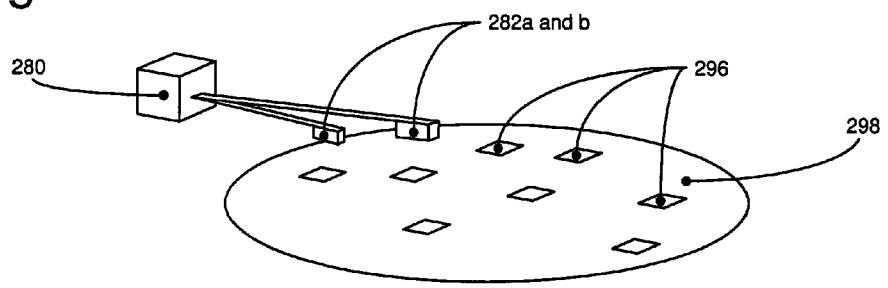
FIG. 20b illustrates a Double-Head Wafer Test, showing testing on multiple sites.

FIG. 20b illustrates a Double-Head Wafer Test, showing testing on multiple sites. FIG. 20b elements include probe 280, probe heads 282a and 282b, IC test sites 296, and wafer 298.

Figure 20C:
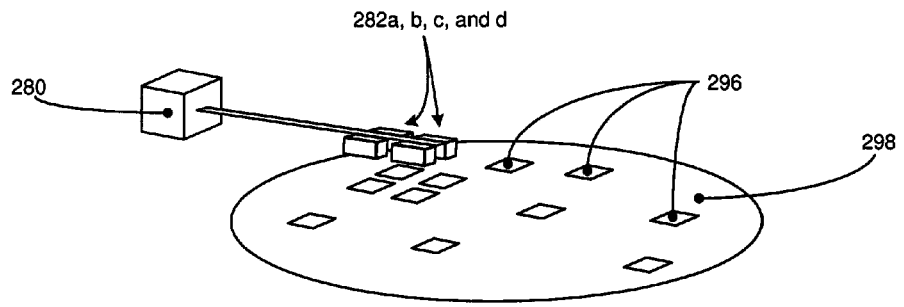
FIG. 20c illustrates a Multi-Head Wafer Test configuration.

FIG. 20c illustrates a Multi-Head Wafer Test configuration which is not limited to 4 sites but to as many as can practically fit into mechanical limits. Because the wireless testing method and apparatus use less physical contact probes (as few as zero in the completely wireless case) massively parallel testing can be performed. FIG. 20c elements include probe 280, Probe Heads 282a, 282b, 282c, 282d, and wafer 298.

Figure 21A:
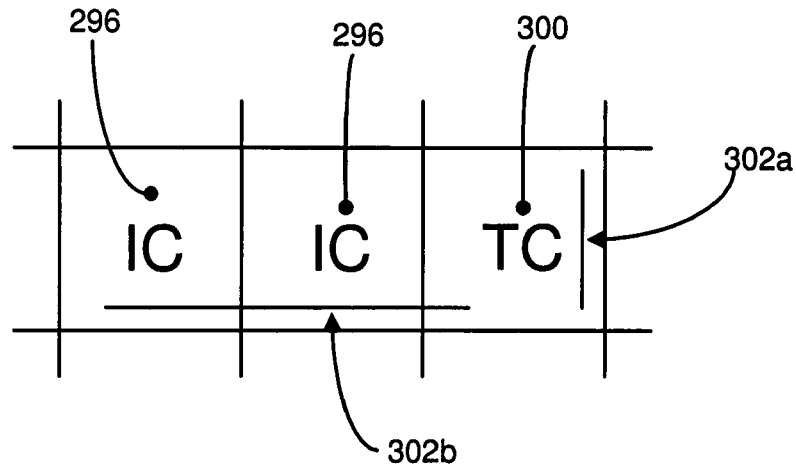
FIG. 21a illustrates a Die and Across-Die Test structures and elements, shows how the testing can be performed across dies by interconnection to other regions outside the test circuit.

FIG. 21a illustrates a Die and Across-Die Test structures and elements, shows how the testing can be performed across dies by interconnection to other regions outside the test circuit. This shows that the TC and IC can be made separate and that communications between sites can be achieved while maintaining separate functions and physical designs for each. The figures illustrate the test circuit testing itself via element 302a. The figure shows the test unit can test multiple ICs viat elements 302b and 304. FIG. 21 elements include ICs or IC Test Sites 296, TC (Test control or Test Site) 300, internal test site communications 302a, and test IC to distant IC communications 302b.

Figure 21B:
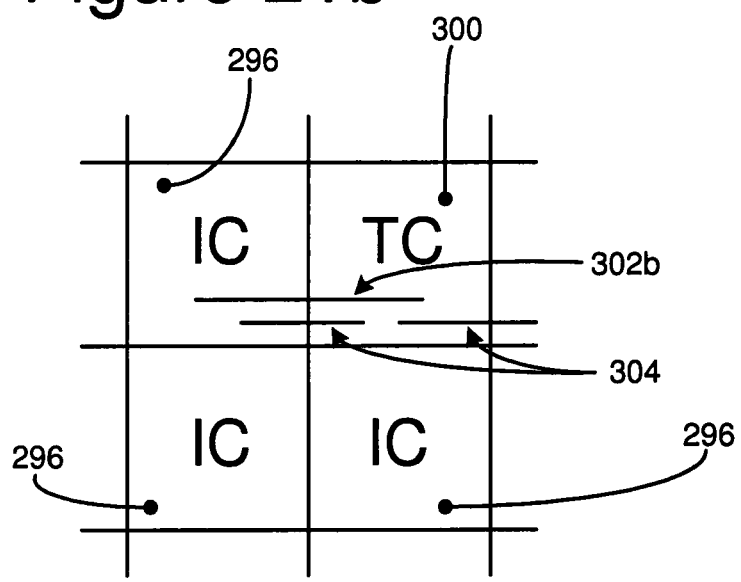
FIG. 21b illustrates an Adjacent-Die Test, showing tests performed on die adjacent to test sites.

FIG. 21b illustrates an Adjacent-Die Test, showing tests performed on die adjacent to test sites. FIG. 21b elements include IC test sites 296 TC Test Site 300, IC to TC communications 302b, and TC to IC communications 304.

Figure 22:
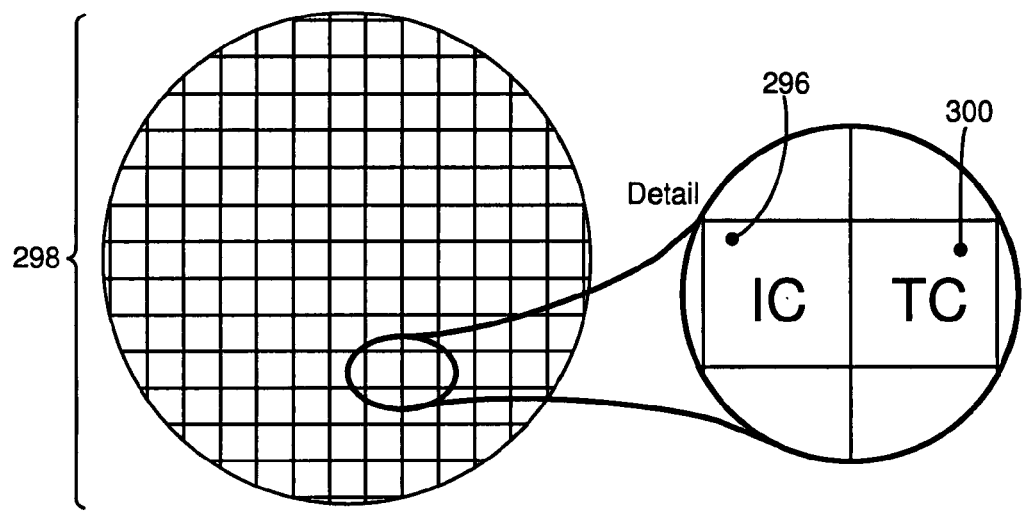
FIG. 22 illustrates a Wafer Die Testing showing test circuit sites as well as IC sites.

FIG. 22 illustrates a Wafer Die Testing showing test circuit sites as well as IC sites on a wafer basis. This can equally be a substrate assembled as a multi-chip substrate which is later diced to contain multiple dies per package. FIG. 22 elements include IC Test Sites 296, wafer 298, and TC Test Site 300.

Figure 23:
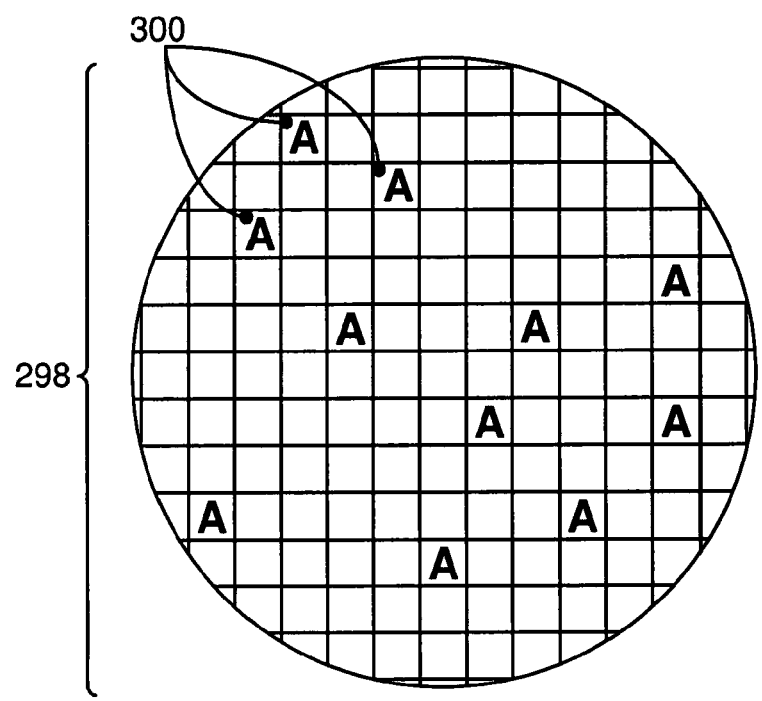
FIG. 23 illustrates Wafer test site Location at various locations on wafer.

FIG. 23 illustrates Wafer test site Location at various locations on wafer. FIG. 23 includes wafer 298, and TC Test Site 300.

Figure 24:
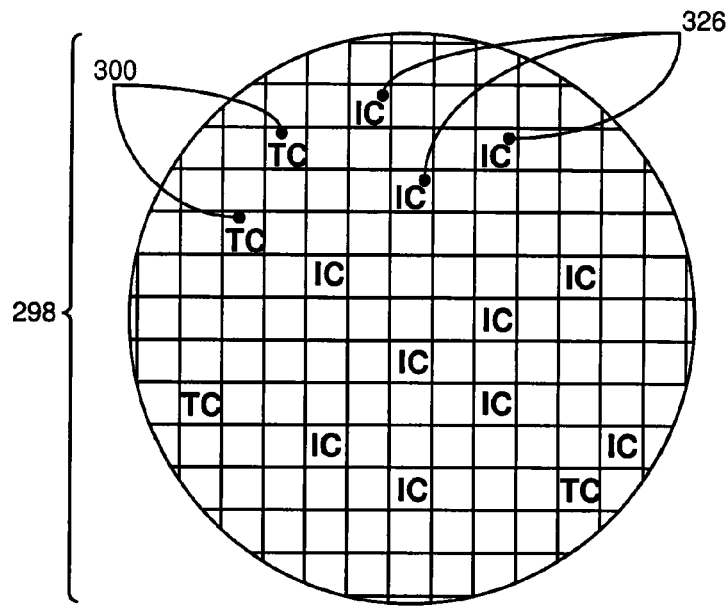
FIG. 24 illustrates a Test Sites and IC locations for multisite Wafer testing.

FIG. 24 illustrates a Test Sites and IC locations for multisite Wafer testing. FIG. 24 includes IC test sites 296, wafer 298, and TC Test Site 300.

Figure 25:
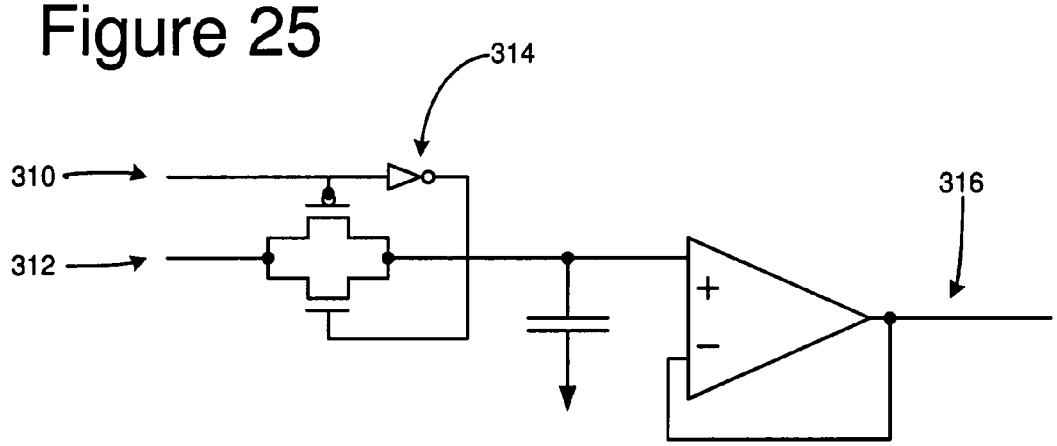
FIG. 25 illustrates a simple HF (high frequency) undersampling testing circuit for inclusion in DUT to enable high speed testing with low speed control.

FIG. 25 illustrates a simple HF (high frequency) undersampling testing circuit for inclusion in DUT to enable high speed testing with low speed control. This is important as in many applications the on chip signaling is faster than the signaling available off chip. This method allows the tests to characterize very high speed on chip signals with a low speed interface.

Figure 26:
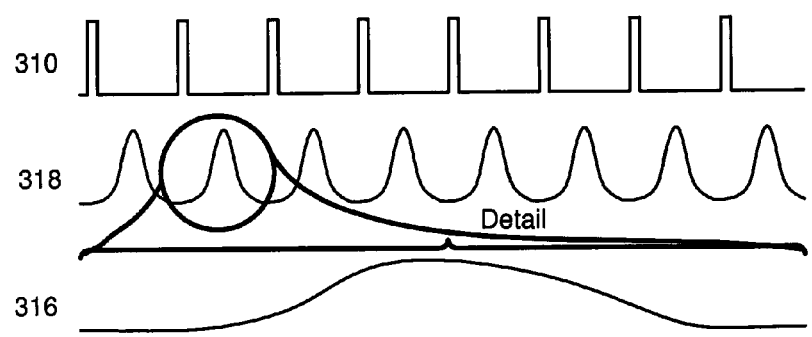
FIG. 26 illustrates a how a Narrow-Band Fast Sampling circuit of FIG. 25 on a DUT circuit can be used to Characterize High Frequency Signals.

The circuit of FIG. 25 can be used to resolve extreme detail or very high speed analog signals on DUTs using only low speed signals. FIG. 25 includes sampling clock 310, DUT signal 312, nano-second pulses 314, swept at frequency just off DUT signal rate, output 316, which is a down-sampled slow signal representative of HF DUT signal FIG. 26 illustrates a how a Narrow-Band Fast Sampling circuit such as the one shown in FIG. 25 on a DUT circuit can be used to Characterize High Frequency Signals using low speed signals. FIG. 26 includes low speed sampling clock 310, low speed output signal 316, high frequency (HF) signal 318 that is internal to IC DUT or generated by DUT.

Figure 27:
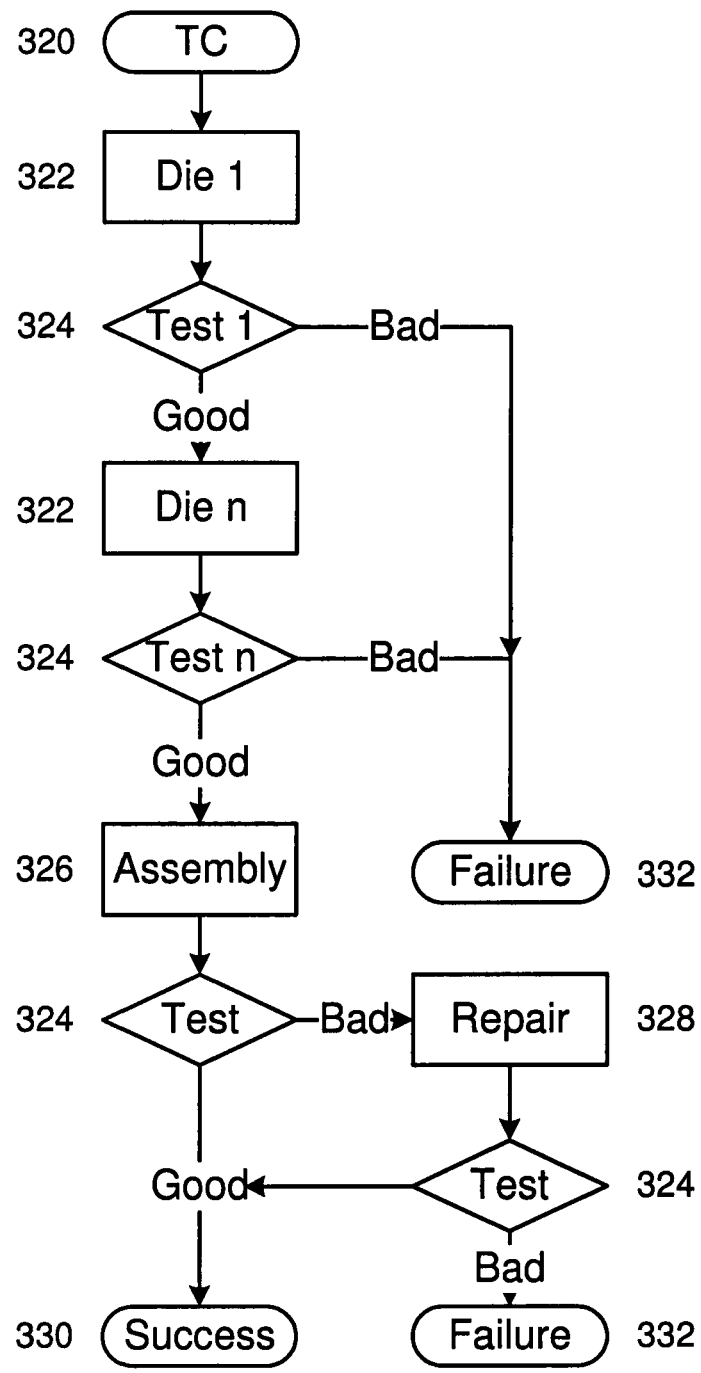
FIG. 27 illustrates a Manufacturing and test Process flow.

FIG. 27 illustrates a Manufacturing and test Process flow. FIG. 27 includes steps for test placement 320, die placement 322, test 324, assembly 326 repair 328, success result 330, and failure result 332. One can note that the apparatus and method described herein allow test insertions within the process flow versus the current method used in industry that does the testing at the end of the manufacturing process.

Figure 28:
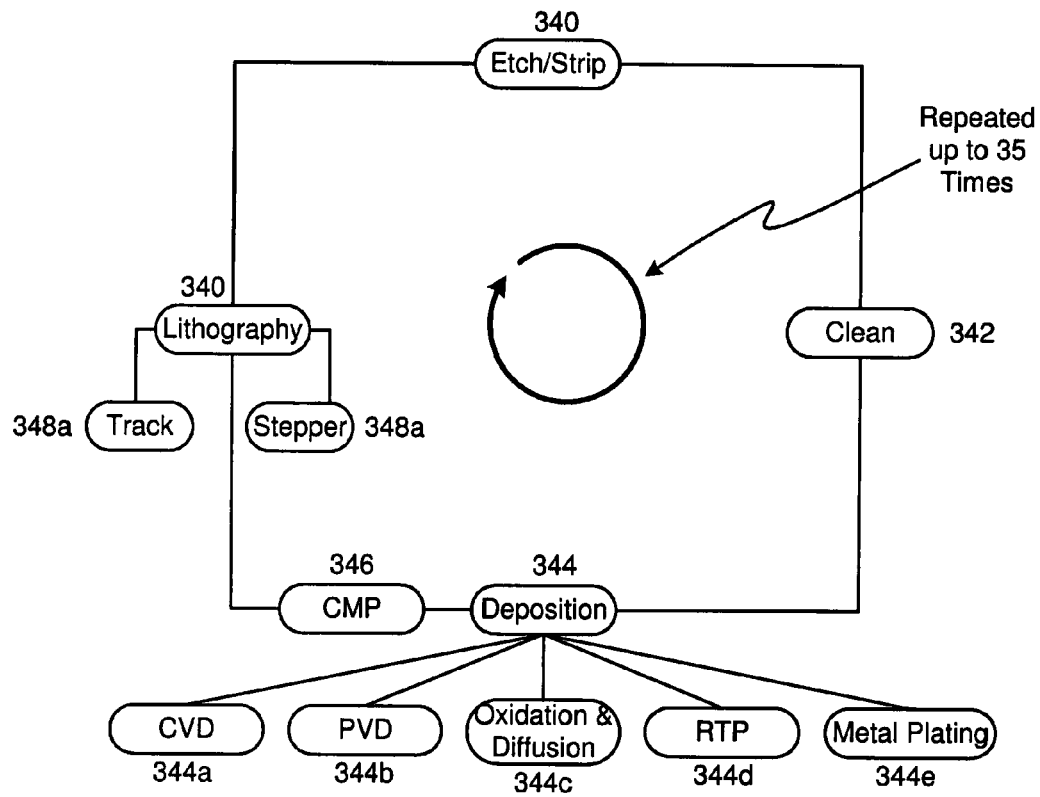
FIG. 28 illustrates a typical Chip Fabrication Process.
Figure 29:
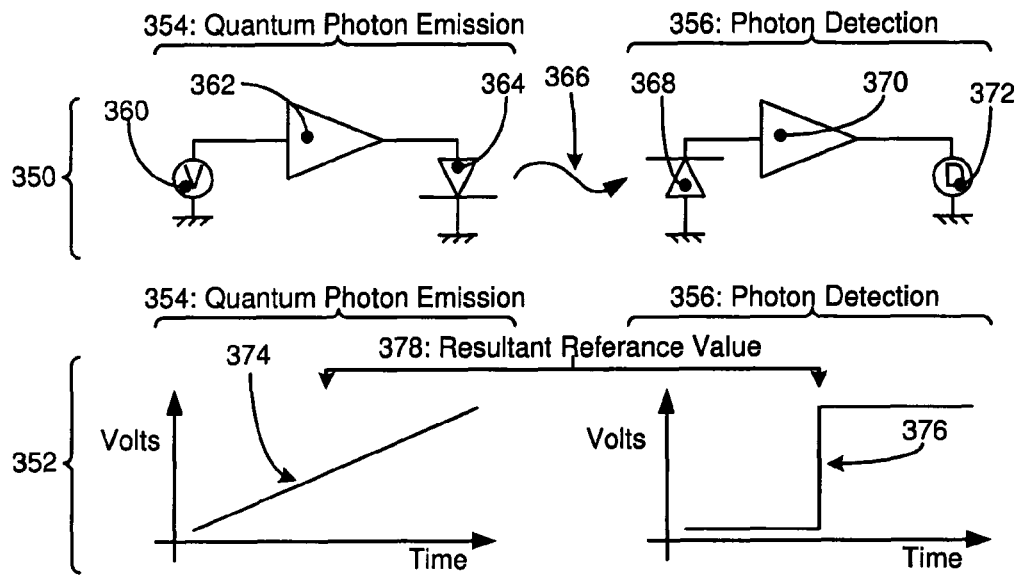
FIGS. 29a and 29b are illustrations of reference generation with Quantum Mechanical (QM) effects.
Figure 30:
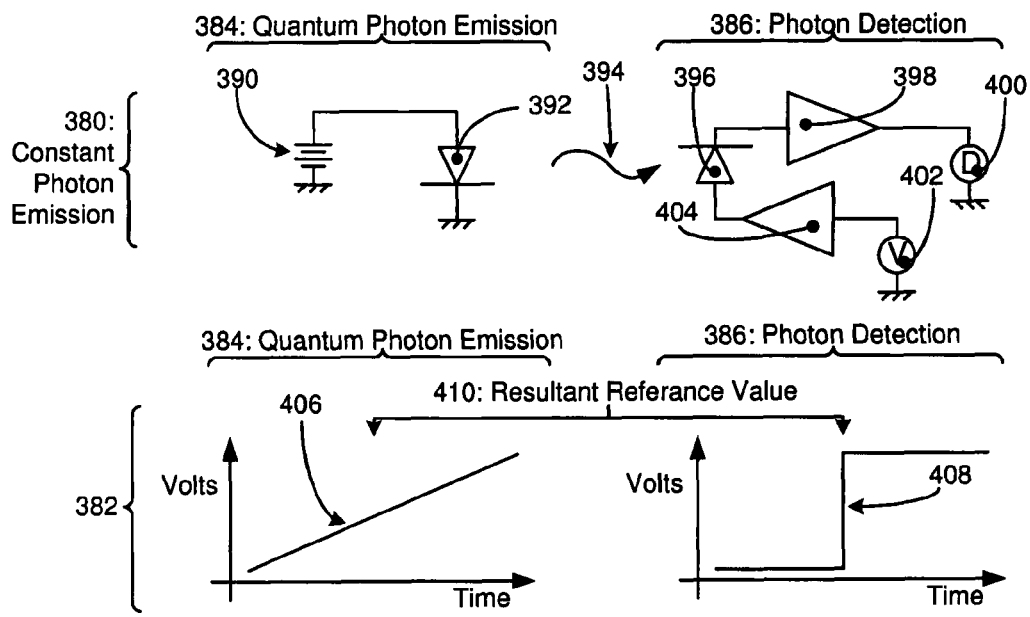
FIG. 30 illustrates reference generation and detection with Quantum Mechanical effects. This is an alternative method to create a physics based reference on the DUT wafer where the ramp voltage assists or creates a threshold level. Note that the photon generation can be off wafer or one wafer in different implementations.

FIG. 28 illustrates a typical Chip Fabrication Process showing the multiple deposition lithography and etching steps. The current teachings allow test insertion in this process by the fact that the testing can be carried out in a wireless, or reduced probe contact manner. Current technology does not allow test insertion or requires testing by extracting semi-finished parts which are discarded after test because of contamination and time flow problems. FIG. 28 includes the following steps etch/strip 340, clean 342, deposition 344, CVD 344a, PVD 344b, oxidation and diffusion 344c, RTP 344d, metal plating 344e, chemical mechanical polishing (CMP) 346, lithography 348, track 348a, and stepper 348b.

An indication of the steps and the tests related to this process is contained in TABLE 1. Note that the cycle is typically repeated many times (25+) and beyond in an IC fabrication process showing the great economic need for the method and device described herein. The current teachings allow one to test both the devices created during the fabrication process as well as the fabrication process itself. An example would be Testing after 346 CMP for opens or shorts. This would test the fabrication process. Another example would be to test after 346 CMP for active elements such as transistors and logic and their functionality enabled by connections created by sets 344 and 346.

Test Sequencing.

It should be noted that the devices and structures shown herein can be implemented in parallel on a wafer as well as on a test head or contactless prober. The consequence is that, using the present teachings, it is possible to have several tests being performed on a wafer at the same time. Depending on the testing required and data processing capability of the system, it is possible that the number of tests may be too many to conduct in parallel. To address this issue, sequencing of tests may be used, where tests are initiated to be performed in series, in parallel, or a series of tests performed in parallel.

Because the test structures can be independent on the wafer, tests performed in parallel may be different tests conducted either simultaneously or at different times, thus allowing optimization of testing through prioritization of tests to optimizing use of tester resources while also minimizing test time. For example, a quick test may be performed to cover the whole wafer while tests that are more detailed can be performed subsequently if interesting results are found. This methodology can also be used to grade various sections of the IC or wafers. For example, a first test may be performed which determines the speed of an IC or a section of wafer. This same test then can be performed in more detail to grade the DUT IC or wafer sections. One example of a test sequence is illustrated in TABLE 3.

In all instances described herein the preferred embodiment is RF contactless coupling. Nevertheless, the description is not to be considered restrictive in that optical or other sources of signal and power also can be implemented.

Further, the test head is controlled by ATE with various startup configurations self tests and test sequences.

TABLE 3

Example of test sequencing:

1. Energize off wafer test head RF signals to power up DUT power section on-wafer.
2. This will power up on-wafer power rectification.
3. Power section of on-wafer device sends power health signal back to tester. This can be in the form of a voltage measurement or a frequency or a pulse to show that the power is good.
4. The test head may be moved in an x-y-z fashion at this point to localize and maximize the power transfer to the wafer. "The power good" signal can be used as a feedback to maximize the on-wafer power. This also aligns the wafer under test to the test head this. This can be done with optical methods as well aligning structures on-wafer with tester head. This can be performed in open loop or closed loop fashion. Open loop for equipment with precise control and closed loop for maximum accuracy.

TABLE 3-continued

Example of test sequencing:

5. The power-health signal return at this point is can be used as an indication of bad or good devices or sections on the wafer. These can be noted in a database and used to determine testing going forward.
6. The test head can now be moved in a z or separation direction and at this point, the power health signal can be monitored to infer parameters of the DUT. For example, a weak power signal may indicate processing or metallization issues which can manifest in weak power rectification or weak RF coupling.
7. Once the power health is good, the next step is to confirm operation of the communications portion of the DUT. This is done by selecting a simple loopback of the signal sent by the test head. This can be done in a default manner after power up or as a set command from the test head.
8. The receive loopback signal is checked for signal strength and integrity by the test head. Good signal level here indicates successful function and construction on-wafer.
9. At this point, the DUT may go into a self-defined sequence to test various portions of the SMU or analog portions of the DUT. This can also be controlled by the test head. In this way, a self/directed test of the various portions of the on-wafer test unit can be used to determine correct operation.
10. A series of internal structures such as voltage references, ratioed resistors, capacitors can be tested. The results of these tests can be used to provide a baseline to which the other test structures can be measured.
11. A series of tests are performed to test the Analog to Digital or Analog to time interval portion of the SMU. This also is carried out the Digital to Analog or Digital to time interval portion of the SMU. An analog or test loopback is performed where the test head controls the source and reads the measure for the same section. In this way, complete SMU operation is tested for functionality as well as accuracy.
12. Once these are preformed then the test head tests the test structure multiplexer which is configured to known structures such as opens shorts via chains etc.
13. The test head is now ready to control the source measure units as well as the test multiplexer. The test multiplexer is configured by the test head to multiplex various test structures (Rs Cs Ls Transistors, SSI, MSI) in coordination with the SMUs.
14. Test results are sent back to the test head for the various structures on the wafer.
15. Test results are then compiled and parameterized by the ATE or other on or off line processing units and control systems.

Note that the tests performed in the sequence shown in TABLE 3 can be performed at one or more of various stages during the manufacture of the wafer. The specific tests can be tuned for the process of interest. For example, the first part of the testing might be concerned with transistor functioning. Later in the process, metal connections and drive capability may be of more interest. The current teachings enable testing in these and other scenarios because of its flexibility for several modes of operation. To illustrate these capabilities we will now provide examples of use of the present teachings.

The present teachings include the concept of applying internal and external knowledge to provide accurate on wafer measurements in a contactless or wireless manner.

Internal references can include voltage band gap references known in the art as well as enhanced references where an external stimulus is used to provide a reference. An example of this would be a current which is supplied by RF means to the DUT wafer. This current can be used to flow through an on wafer resistor to produce a voltage reference. Strictly speaking the voltage has uncertainty due to the process variations inherent in semiconductor fabrication. The accuracy of the voltage can be improved by reference to known physical properties of semiconductor devices such as a band gap reference which is reasonably accurate if the temperature is known. Since the temperature is known by the commonly used wafer chuck sensor, the band gap can be used to determine the voltage seen and thus the current imposed. If one externally drives the current in a controlled manner to twice the value then the current will be doubled and the difference in current can be used to calibrate or standardize the on wafer resources despite the fact that the initial reference on wafer is relatively in accurate. Providing an external reference to improve accuracy can be carried out in multiple ways beyond the example just given. The following are other methods to achieve similar results, but using optical reference circuit elements for referencing results of an interrogation.

EXAMPLE 1

Accuracy of measurement can be implemented with a variable wavelength light source to find band edge of silicon photovoltaic on wafer sensor. An $Ev=hv$ band edge will occur at specific wavelength of light and the specific wavelength will correspond to a specific energy. The specific energy will show as a turn on threshold which will indicate a specific voltage as the laser is swept in frequency. The photon generated voltage or current can be used as an external reference to calibrate or guide or factor any on wafer voltage reference bringing unprecedented accuracy to the on wafer Source Measurement Unit and system.

EXAMPLE 2

A variable intensity light source can be used to double the current of detected photo induced current flowing through an unknown resistor. The change in voltage will reflect the resistance value. Then, when the resistance is doubled the current is halved. In this way the external stimulation can be used to provide similar benefits as in example 1.

EXAMPLE 3

A photo diode used in reverse bias creates a variable resistor which is controllable directly by the amount of light impinging thereon. Reverse biased diodes have linear characteristics over orders of magnitude which allow one to create an R over a known V drop to create a known current. This can be used in a bridge circuit to match a voltage drop across an unknown resistor. The corresponding light intensity produces a resistor which matches an unknown one. One then connects to a known voltage and measures the current.

EXAMPLE 3a

An optically active element on the Wafer is used to generate photons or other electro-optical effect. The optically active element is controlled by on-wafer circuitry. The test unit provides command signals to the DUT to ramp a control signal to the test unit. The ramp is used to control the optically active element. Because of the nature of the optically active element is controlled in a manner by quantum mechanical (QM) effects it will have a clearly defined energy or voltage level in which is starts to operate. An example of this is photo emission which is precisely controlled by quantum effects in semiconductor devices. Only at certain voltage levels are photons emitted. At the time when the Tester device detects the photon energy coming from the DUT the Tester communicates to the DUT that the reference voltage has been reached. Another method is that the Tester simply remembers the point of the ramp when this occurs and uses this information later for correlation and calibration of all subsequent DUT measurements. For example if the ramp is 25% of the way and the QM effect is at this point the QM voltage is known a-priori to be precise value say 0.5 volts. From this point on the tester will know that test results need to by scaled to 0.5v=25% of scale or 2 volts for the full voltage ramp. This way the on-board ramp can be calibrated to a known quantum energy level which is equivalent to a precise voltage level. In this way the relatively in accurate on DUT voltage can be calibrated to very accurate levels. This knowledge can then be used to calibrate voltages, currents, capacitances, resistances on the DUT SMU. This can also be carried out without the need for intervention by the Tester in the case where both generation and detection of the quantum effect is carried out on the DUT itself. This is a form of self calibration. It is not necessary for all applications but it does illustrate the power of the teachings herein. FIGS. 29a and 29b show an example of a voltage ramp and the thresholding of a QM emission. FIG. 29a represents a photo or QM calibration system 350, and FIG. 29b represents a ramp voltage 352. In each figure, there is a corresponding quantum emission portion 354 and a corresponding energy detection portion 356. Referring to FIG. 29a, a ramp voltage (or current) 360 is applied to a photon energy emitter (e.g. IR diode) 364 via a buffer 362. Photons 366 at specific energy are transmitted and detected by detector 368. A buffer 370 is used to amplify the signal and the level is detected by level detector 372. Referring to FIG. 29b, the waveform 374 of the voltage ramp 360 is shown. The resultant output detection 378 coincident with ramp voltage 360 provides a calibration level. Note that in one implementation 354 can be in the tester and in another it may be integrated in the DUT wafer along with the 356 detection circuit. The circuit described above is used to enable a physics based reference to be created on the DUT wafer. The creation of the photons can be external to the DUT i.e. from the tester or can be created on the DUT itself using one of several photon generation techniques known in the art

EXAMPLE 3b

QM effects can be used on emission, e.g. a band-gap thresholding photo-emission device for reference calibration by means of example of a voltage ramp on a photo emissive device. However they can be used on detection, for example the photo-detection band gap device. One can use the QM referencing on the detection side by adding a ramp voltage to a detector. Once the ramp voltage is raised to a certain threshold the detector will detect photons by the QM effect. This detection can then be used to calibrate the ramp on the detector side given an internal or external source of photons. In terms of the teachings herein, the calibration is described as a voltage but it is not meant to be limited to voltage and may utilize a current for calibration. Likewise the QM effect may generate or detect a current. FIGS. 30a and 30b shows the ramping of a detection device thresholding with a QM detector. Referring to FIG. 30a, a system 380 is shown that includes source and detector with constant photon emission, and FIG. 30b represents a ramp voltage 382. In each, there is a corresponding QM photon emission sub system 384 that can be in the tester or on the DUT, and a rampable photon detection sub system 386. Referring to FIG. 30a, there is a power supply 390 to the photon emitter 392, such as an IR diode that emits photons 394 at specific energies. A photon detector 396 detects the photons, and a buffer 398 is used to amplify the detected photons for a level sensitive detector 400. A detector bias voltage ramp input 402 is connected to a buffer 404 that feeds detector element 396. Referring to FIG. 30b, line 410 indicates the coincidence between the ramp 406 and the threshold 408 to give the calibration level.

EXAMPLE 4

Using multivariate analysis one can find process excursions or out of tolerance references or test structures. This is a method in which multiple uncertainties of various elements, resistors, currents, voltages etc. are compared with each other to converge on a standard of measurement.

EXAMPLE 5

One can use serial programming to select stimulation voltage and test structures to be tested by external communications means (including optical and RF communications).

EXAMPLE 6

One can use reference of voltage and create a calibration capacitor. The calibration capacitor can be created by subtracting fringe capacitance from fabricated capacitance in several ways. One way is to use two capacitors, one with twice the perimeter of the other, and use subtraction to calculate perimeter or fringe capacitance. This fringe capacitance is then subtracted from assumed capacitance. One could use AC methods to parameterize the fringe capacitance and then subtract it.

EXAMPLE 7

One can use external precision timing to create a known time interval and a scaled calibration capacitor, $C=e*A/d$ (Capacitance=dielectric constant times area divided by distance) sampler to capture a known amount of charge $C*V=Q$ (charge=Capacitance times Voltage). Timing with voltage reference is used to measure current, knowing that $Q=I*t$ (charge=current times time) or $I=dQ/dt$ (current=change of charge divided by time)=$C*dv/dt$ (current=Capacitance times change in voltage divided by time). Then use voltage and now known current (over time) to measure unknown resistance, $R=E/I$ (resistance=voltage divided by current). Use now known resistance as current measuring sense resistor by way of $I=E/R$. Vref is known. C assumed to be known from: a) ring oscillator dominated by C or differentially dominated by C, and b) from known geometry of fabrication.

Given C+fringe and C+2fringe, one then charges them to known voltage. Then, in sequence: (1) The voltage is removed; (2) Cross connect two caps C+f backwards C+2f forward; (3) Measuring remaining voltage will give f as a ratio to C; (4) Fringe value can now be subtracted scaled from all c measurements; (5) Use unknown current source to charge known capacitor C for known time; and (6) i=C*dV/dT given known V T and C calculate I. Use I as current source to find sense resistor value. Use r=V/I to calculate unknown resistor r becomes R and this is used as a sense resistor.

Wireless Communication for Process Control Monitoring

The discussion above related to implementing the teachings with respect to an electronic circuit in general. As an example of an implementation, there will now be given a discussion of a method and apparatus for wirelessly interrogating an electronic component during processing. There will first be given a discussion of principles involved in wireless testing generally, and then considerations related to process control monitoring will be presented. The concept of test access ports is discussed, which relates to a specific implementation of wireless communication. While the term DUT in the discussion above generally included the testing components, the description below uses the term to refer specifically to the electronic circuits being tested in order to place more emphasis on the design of the test access ports. The apparatus consists of a body having an interface for an interrogating device to use as a conduit in reliably performing multiple discrete interrogations of the electronic component without the interrogating device physically touching the electronic component.

The approach advocated with the present method and apparatus provides a durable interface that can be interrogated as many times as may be necessary to complete a series of discrete testing protocol. This interrogating can be through wireless probing, physical probing or a hybrid approach involving both. Probing approaches previously patented include wireless methods as described in U.S. Pat. No. 6,885,202 and hybrid methods as described in U.S. Pat. No. 7,109,730. There are a number of ways that the teachings concerning the method and apparatus can be put into practice, as will be hereinafter further described.

The wireless method involves the use of two core components, preferably incorporated into a single body: a wireless communication block (WCB), and a device access port (DAP) or a test access port (TAP). Since a TAP is a special case of the more general DAP, it will be understood that the two terms may be used interchangeably in the drawings and the description below. The WCB is used as an interface to wirelessly communicate with an interrogating device, such as a probe. The DAP or TAP is used to directly communicate with or test an electronic component (device under test—DUT).

The contacting method involves the use of a contact pad as an interface on the electronic component (DUT) that is in electronic communication with the integrated circuits thereon, and a probe in electronic communication with automated test equipment (ATE). The entire system may be referred to as a system access port (SAP), which is shown generally in FIG. 31 through 53.

Figure 40:
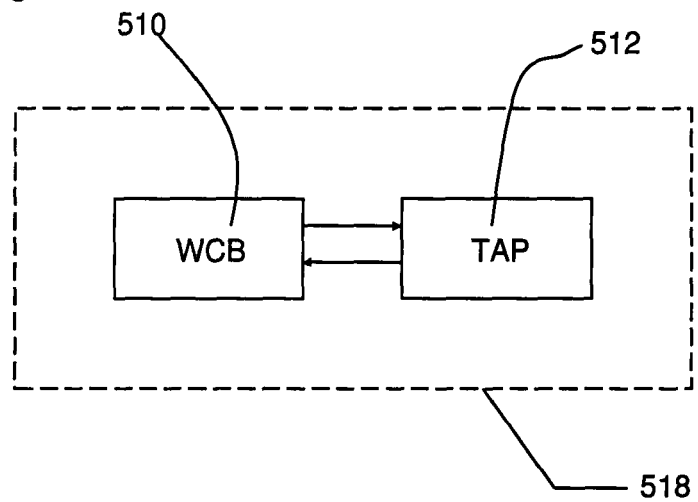
FIG. 40 is a block diagram of an apparatus for interrogating an electronic component suitable for mapping, having one wireless communication block and one test access port.
Figure 41:
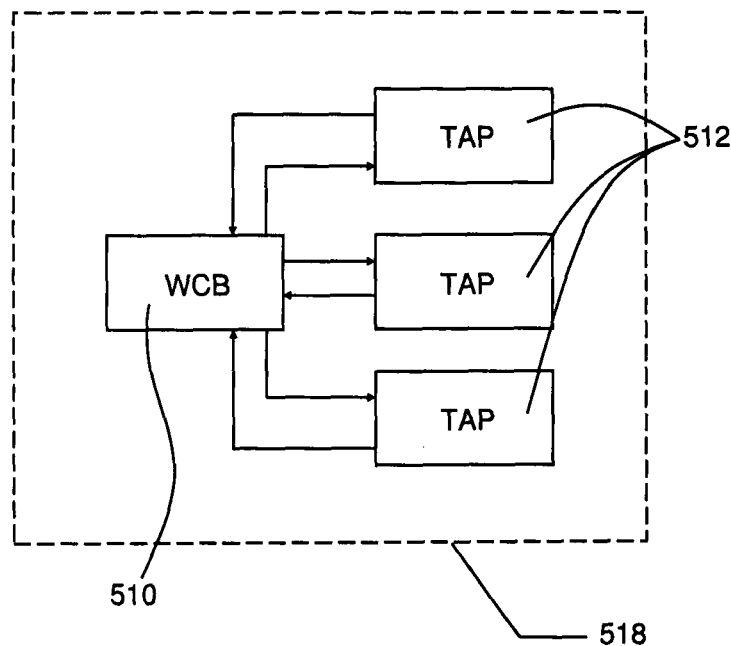
FIG. 41 is a block diagram of a more complex an apparatus for interrogating an electronic component having a single wireless communication block and multiple test access ports, suitable for testing multiple devices under test in parallel, or to add redundancy.
Figure 42:
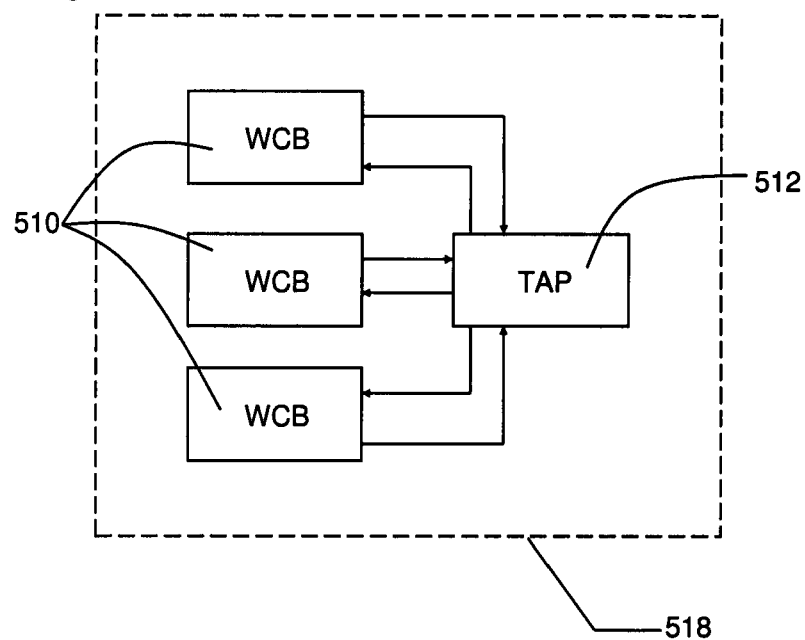
FIG. 42 is a block diagram of an even more complex an apparatus for interrogating an electronic component having multiple wireless communication blocks and a single test access port, for transmission of data in parallel to multiple test probes.
Figure 43:
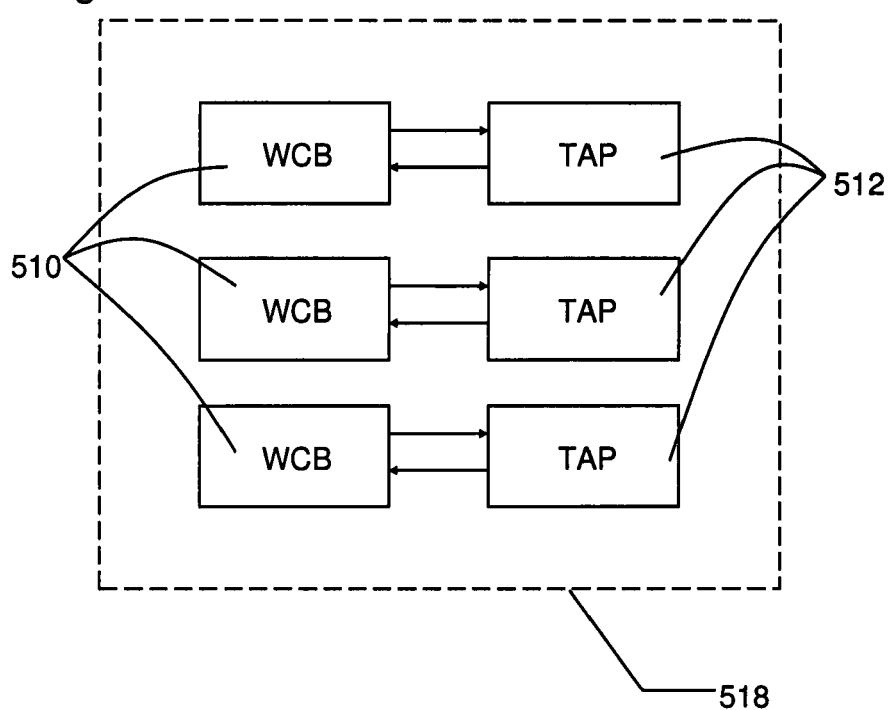
FIG. 43 is a block diagram of an even more complex an apparatus for interrogating an electronic component having multiple wireless communication blocks and multiple test access ports.

There are generally two approaches to communication that may be considered when using different embodiments for the wireless component of SAP 600. The first is the concept of "mapping" for which there may be one transmitter 516 and/or one receiver 522 for one device access port (DAP) 512 as shown in FIG. 40, where the WCB 510 represents the transmitter 516 and the receiver 522, one transmitter 516 and/or one receiver 522 for multiple DAPs 512 as shown in FIG. 41, multiple transmitters 516 and/or multiple receivers 522 for one DAP 512 as shown in FIG. 42, or multiple transmitters 516 and/or receivers 522 for multiple DAPs 512 as shown in FIG. 43. These four variations respectively are described as:
  i) One-to-One mapping
  ii) One-to-Many mapping
  iii) Many-to-One mapping
  iv) Many-to-Many mapping The second concept is that of placement and separation. While there can be any sort of mapping between transmitter 516 and/or receiver 522 and DAP 512, they can be located in many different places. Six such examples are:
  i) Transmitter 516 and/or receiver 522 and DAP 512 on the same chip
  ii) Transmitter 516 and/or receiver 522 and DAP 512 on separate chips, but both mounted on the same semiconductor substrate
  iii) Transmitter 516 and/or receiver 522 and DAP 512 on the same semiconductor substrate
  iv) Transmitter 516 and/or receiver 522 on one semiconductor substrate, DAP 512 on another, and communication between semiconductor substrates within the same package
  v) Transmitter 516 and/or receiver 522 and DAP 512 on the same substrate
  vi) Transmitter 516 and/or receiver 522 on one substrate, DAP 512 on another, and communication between substrates It will be recognized that the description of the embodiments below may be modified by using either of mapping and placement and separation, or both. Furthermore, these concepts may be applied to nearly every component within the wireless communication block (WCB) 510 and DAP 512, their interfaces, and the WCB/DAPs themselves.

Referring to FIG. 31 through 50, the major components of wireless testing are part of a body which will hereinafter be referred to as wireless test access ports (WTAP) 518 will be described first. Some possible embodiments and illustrative applications will then be described. Following these descriptions, the system access port (SAP) 600 will be described with reference to FIG. 51 through 53.

Components of Wireless Test Access Ports

A wireless communication block (WCB) 510 is used to wirelessly transmit and receive data to/from a test probe. While the embodiment described below is a testing apparatus, it will be understood that the apparatus is used for interrogating components of the System in Package, which includes communications for purposes in addition to testing. The test probe will be described with reference to FIG. 59 through 61. Techniques for wireless communication at the physical layer involve either near-field (capacitive, inductive) coupling, or far-field (radiation) coupling. Optical or magnetic coupling may also be used.

Figure 49:
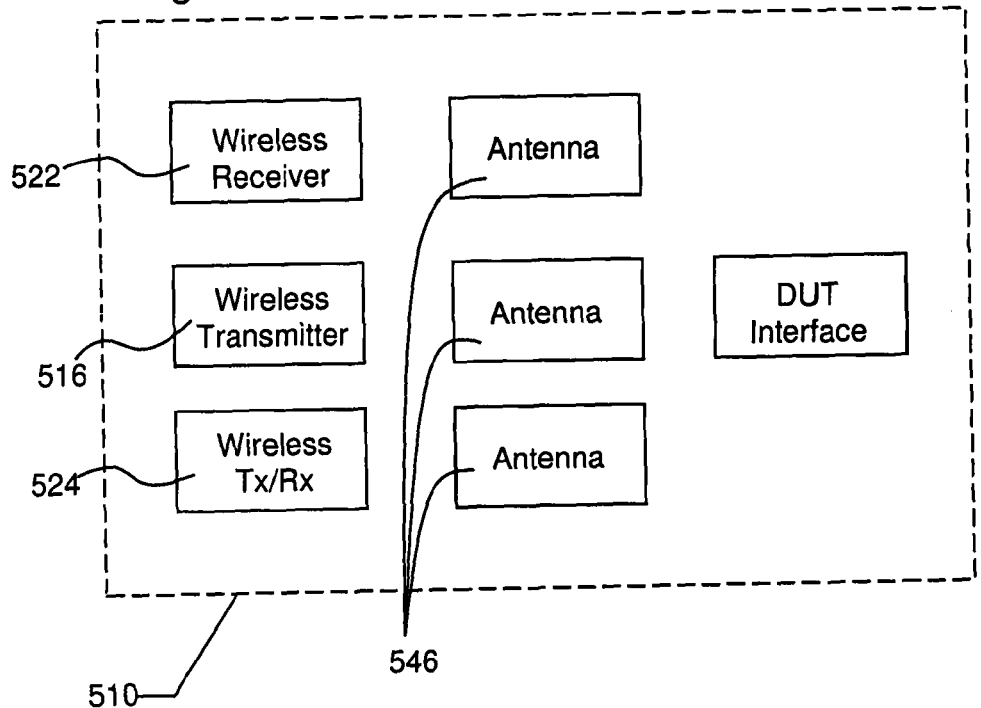
FIG. 49 is a block diagram of an apparatus for interrogating an electronic component having inductors/capacitor plates/antennae that are distinct and separate and built on separate substrates such as chips, boards, substrates, or riser cards.

Referring to FIG. 49, the WCB 510 includes transmission (Tx) 516 circuits to send data to a test probe, receiver (Rx) 522 circuits to receive data from a test probe, and structures 546 for wirelessly transmitting data across a gap (e.g.: inductive coils, plates to form a capacitor, antennae, etc.). The Tx/Rx circuits may also be combined into a single circuit 524 which performs both tasks. The WCB 510 may be designed to communicate with a test probe wirelessly. As well, referring to FIG. 40 through 43, it communicates with one or more TAPs 512 using DC coupling (wireline interconnects).

Figure 34:
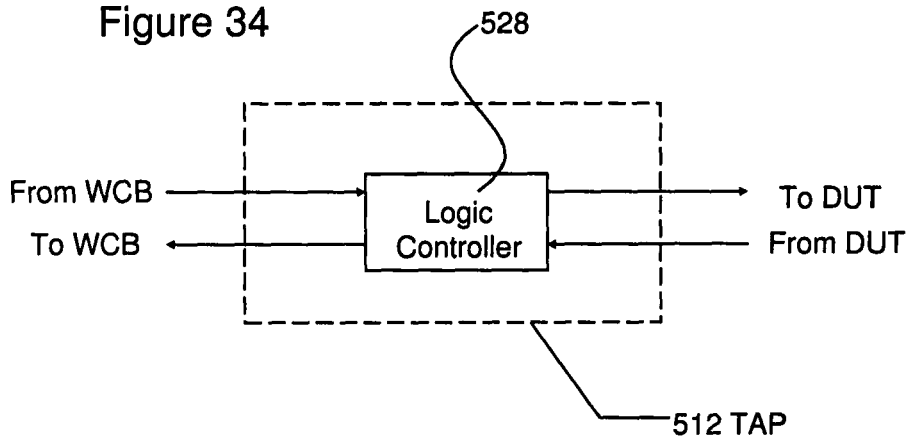
FIG. 34 is a block diagram of an apparatus for interrogating an electronic component that has a logic controller.

Referring to FIG. 34, the test access port (TAP) 512 is a circuit for controlling the process of test on a DUT 20. Information such as instructions or data are issued to a TAP 512, and TAP 512 converts the information into control signals and test vectors which are sent to a device under test (DUT) 20. TAP 512 receives output signals from DUT 20, and these signals can be processed and sent back to test probe 526 via wireless communication using the WCB 510. The TAP 512 includes Tx and Rx circuits (not shown) to communicate with the WCB 510. It also includes logic structures, such as logic controller 528, which convert input instructions and data into control signals and data which can be applied to a DUT 20.

Figure 35:
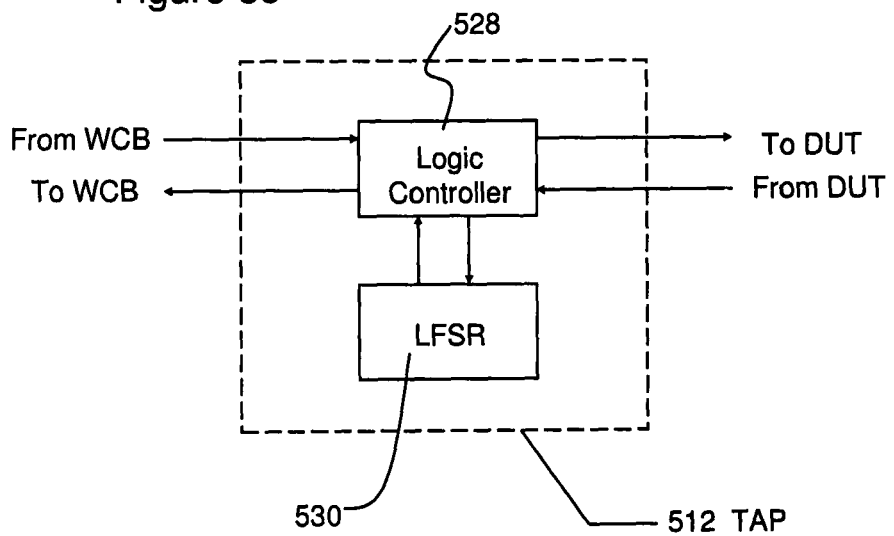
FIG. 35 is a block diagram of an apparatus for interrogating an electronic component having a linear feedback shift register for random instruction/data generation.
Figure 36:
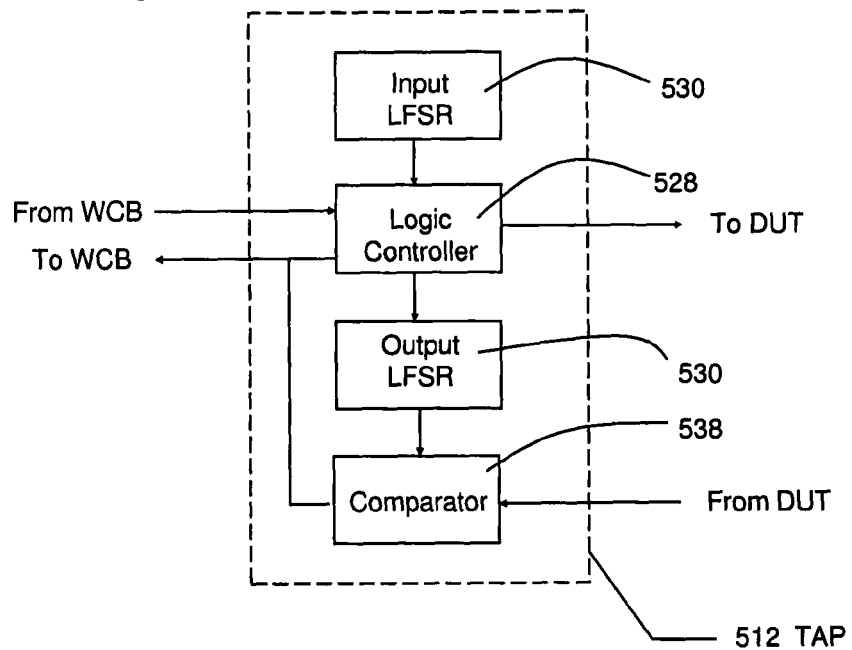
FIG. 36 is a block diagram of an apparatus for interrogating an electronic component that has ability to check the output from the device under test itself, without the need to send data back to the test probe.
Figure 38:
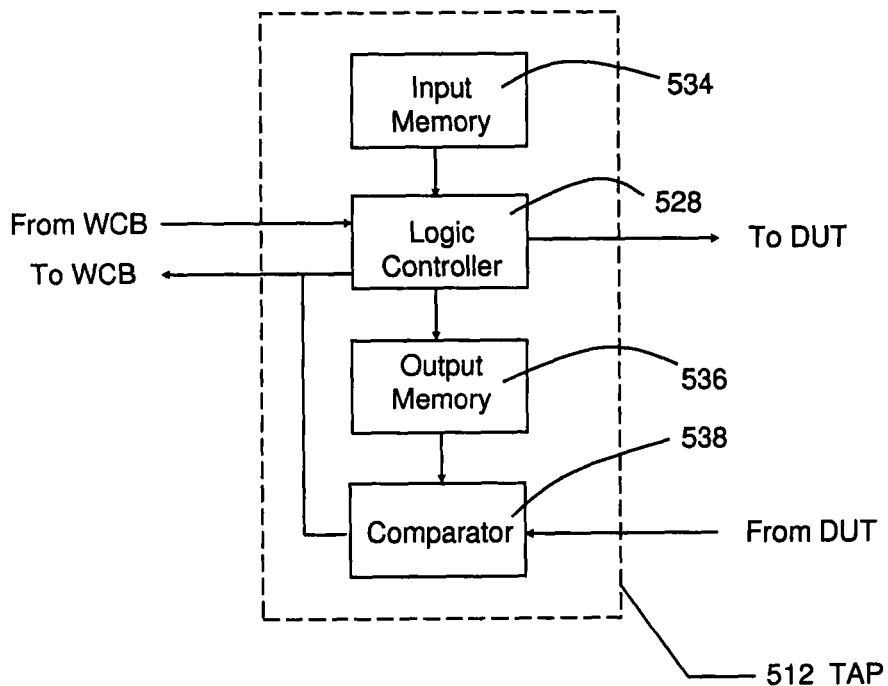
FIG. 38 is a block diagram of an apparatus for interrogating an electronic component having a memory circuit which stores input test vectors, and another memory chip which stores the expected results from the device under test.

TAP 512 may include circuits for pseudo randomly generating instructions and data. One type of circuit which can accomplish this is a linear feedback shift register (LFSR) 530, as shown in FIG. 35. Referring to FIG. 38, the TAP 512 may include memory circuits 532, 534, 536 to store predefined instructions and data which can be used to test a DUT 20. Similarly, the TAP 512 may include circuits for verifying the outputs of a DUT 20. Referring to FIG. 36, such circuits include LFSRs 530 which are matched to input LFSRs 530, memory circuits 532, 534, 536 which store the expected outputs corresponding to specific inputs, and comparators 538 to compare DUT 20 outputs to expected outputs. As well, referring to FIG. 39, TAP 512 may include analogue-to-digital (A/D) 540 and digital-to-analogue (D/A) 542 converters for the purpose of testing analogue and mixed signal circuits.

Figure 31A:
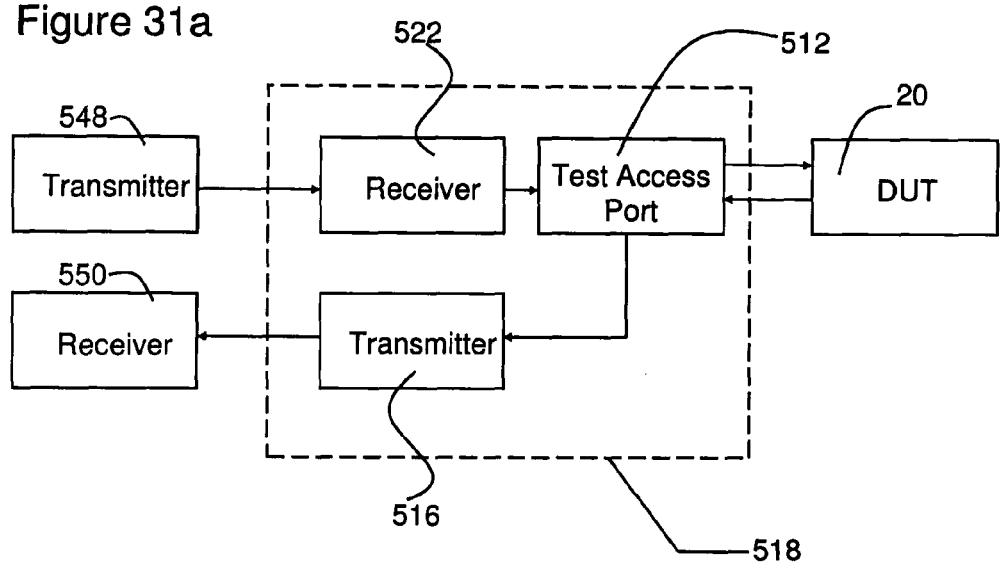
FIG. 31a is a block diagram of an embodiment of an apparatus for interrogating an electronic component.

Referring to FIGS. 31a and 40, the TAP 512 communicates with the WCB 510 and DUTs 20 using direct connects (wireline interconnects). As well, it may communicate with one or more DUTs 20 using wireless interconnects.

Figure 31B:
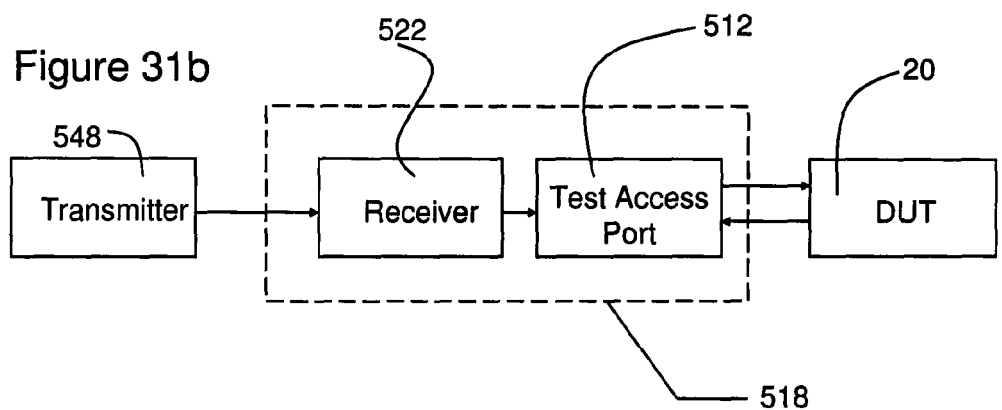
FIG. 31b is a block diagram of another embodiment of an apparatus for interrogating an electronic component.
Figure 31C:
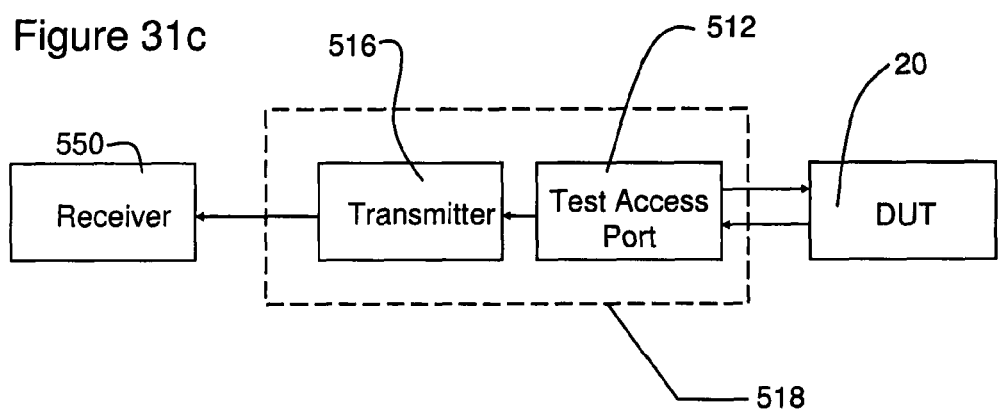
FIG. 31c is a block diagram of an additional embodiment of an apparatus for interrogating an electronic component.

FIG. 31a shows a block diagram of a wireless test access port (WTAP) 518 having wireless transmitters/receivers 20 and TAP 512. WTAP 518 itself does not include a probe or a device under test (DUT) 20, but interfaces with each of them. This design includes both transmitters 516 and receivers 522 on WTAP 518 which communicate with an external receiver 550 and transmitter 548. FIG. 31b shows a block diagram of an alternative WTAP 518 having receivers 522 on WTAP 518. FIG. 31c is a block diagram of another WTAP 518 having transmitters 516.

Figure 32:
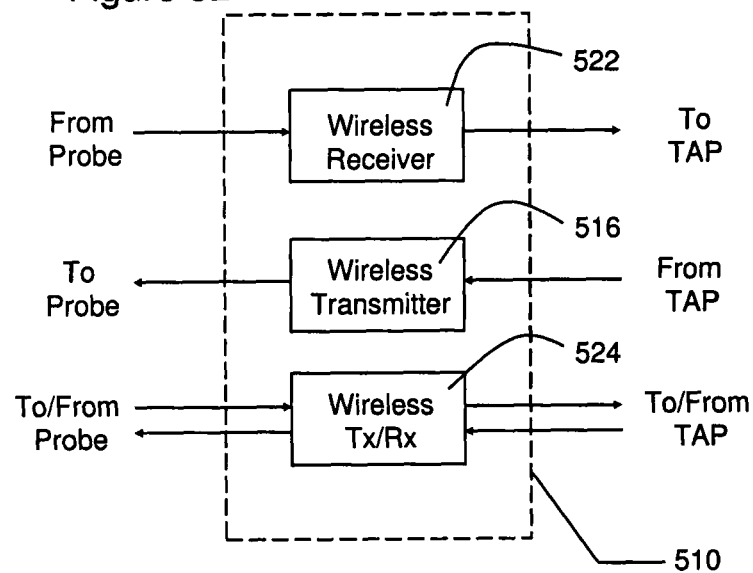
FIG. 32 is a block diagram of an apparatus for interrogating an electronic component with an interface in the form of a wireless communication block having a transmitter and a receiver or bidirectional transmitter-receivers.

The internals of a wireless communication block (WCB) will now be described with reference to FIGS. 32 and 33. FIG. 32 shows a block diagram of WCB 510 having transmitter 516, receiver 522, or bidirectional transmitter-receivers 524. Transmitters 516 send data to a test probe (not shown), receivers 522 receive data from the test probe (not shown), and transmitter-receivers 524 do both.

Figure 33:
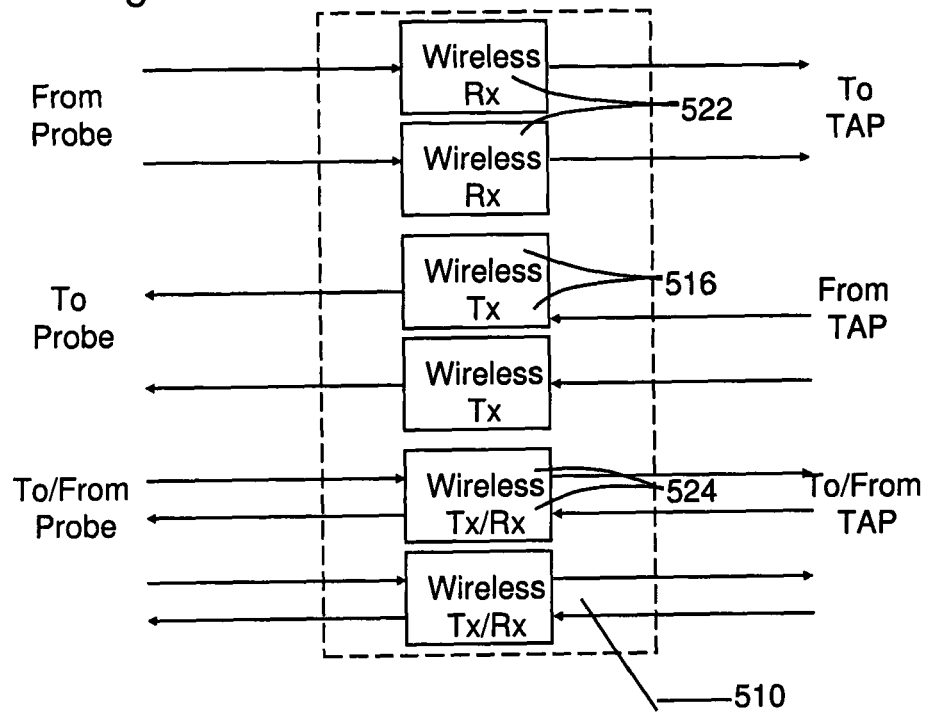
FIG. 33 is a block diagram of an apparatus for interrogating an electronic component with an interface in the form of a wireless communication block having a combination of a plurality of transmitters and receivers, or bidirectional transmitter-receivers.

FIG. 33 shows a block diagram of a more complex WCB 510 having a plurality of transmitters 516, receivers 522, or bidirectional transmitter-receivers 524, which can be in any quantity or combination.

The internals of TAPs will now be described with reference to FIG. 34 through 39. FIG. 34 illustrates a simple design of TAP 512 comprising a logic controller 528 that receives instruction and data signals from WCB 510, and applies the corresponding control and data signals to DUT 20. FIG. 35 illustrates a more complex TAP 512 that includes a linear feedback shift register (LFSR) 530 for random instruction/data generation. FIG. 36 illustrates an even more complex TAP 512 capable of checking the output from DUT 20 itself, rather than sending the raw output from DUT 20 back to test probe 526. In this case, an input LFSR 530 is used to randomly generate instructions/data which can be applied to DUT 20. The output of DUT 20 is received by TAP 512 and then checked to see if it is correct. This is done by processing the output, then comparing to a separate output LFSR 530 which is matched to the input LFSR 530. With these features the system can operate as a built-in-self-test (BIST) mechanism. Hence, rather than transmitting raw output from DUT 20 back to test probe 526, a BIST generates inputs, checks outputs, and only transmits test reports back to test probe 526

Figure 37:
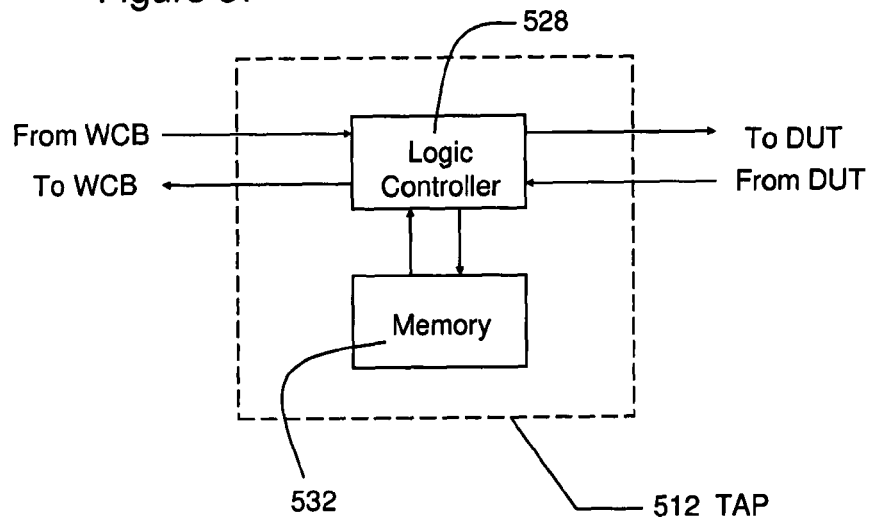
FIG. 37 is a block diagram of an apparatus for interrogating an electronic component having a memory circuit to store test vectors which can be applied to a device under test.
Figure 39:
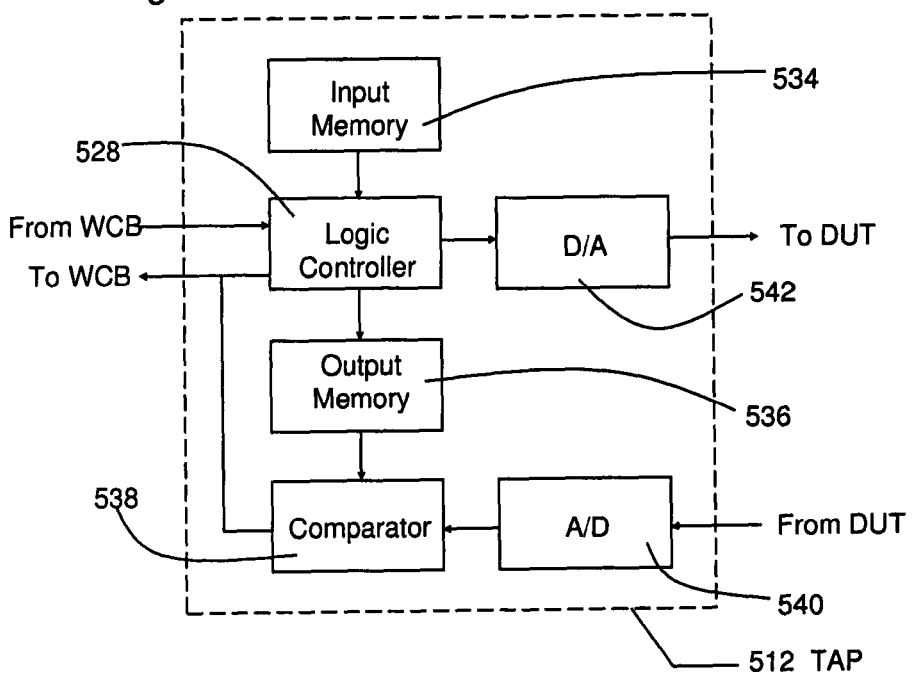
FIG. 39 is a block diagram of an apparatus for interrogating an electronic component for testing analogue and mixed-signal devices, having an analogue-to-digital (A/D) converter and a digital-to-analogue (D/A) converters, and linear feedback shift registers or memory circuits for storing inputs and outputs.

In a further refinement illustrated in FIG. 37, TAP 512 has a memory circuit 532 (e.g.: flash) to store test vectors which can be applied to DUT 20. FIG. 38 illustrates an advanced implementation that includes a memory circuit 532 for storing input test vectors 534, and another memory chip 536 which stores the expected results from DUT 536. The actual outputs are checked against the expected outputs using a comparator 538. FIG. 39 illustrates another advanced design of TAP 512 used to test analogue and mixed-signal devices. In this case, analogue-to-digital (A/D) 540 and digital-to-analogue (D/A) 542 converters are required. Advanced implementations of this design may include LFSRs 530 or memory circuits 532, 534, 536 for storing inputs and outputs.

WTAP for mapping will now be described with reference to FIG. 40 through 43. A simple WTAP 518 will have one WCB 510 and one TAP 512, as illustrated in FIG. 40. FIG. 41 shows a more complex WTAP 518 having a single WCB 510 and multiple TAPs 512. This design may be used to test multiple DUTs 520 in parallel, or to add redundancy. FIG. 42 shows another complex WTAP 518 having multiple WCBs 510 and a single TAP 512. This WTAP 518 may be used to transmit data in parallel to multiple test probes 526. It should be noted that WCB 510 is a logical abstraction, and it is possible to lump multiple WCBs into a single WCB and maintain the abstraction.

Figure 44:
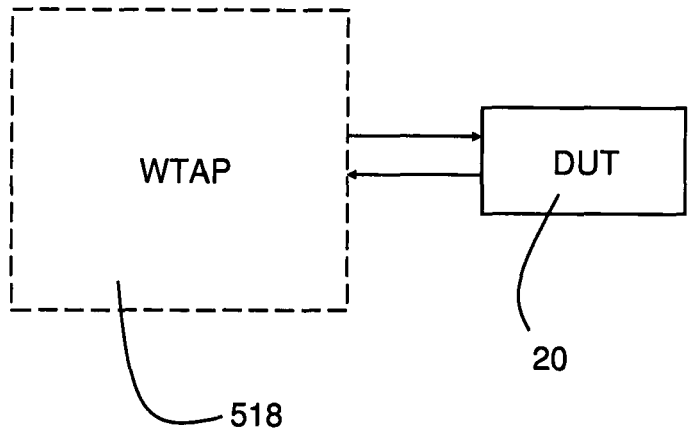
FIG. 44 is a block diagram of an apparatus for interrogating an electronic component designed to communicate with a single device under test.
Figure 45:
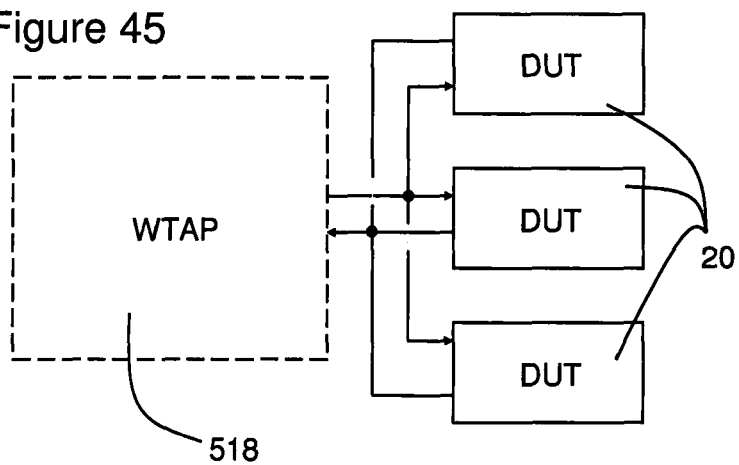
FIG. 45 is a block diagram of an apparatus for interrogating an electronic component designed to communicate with multiple devices under test, having a multiplexer to control which device under test is communicating with the wireless test access port at any given point in time.
Figure 46:
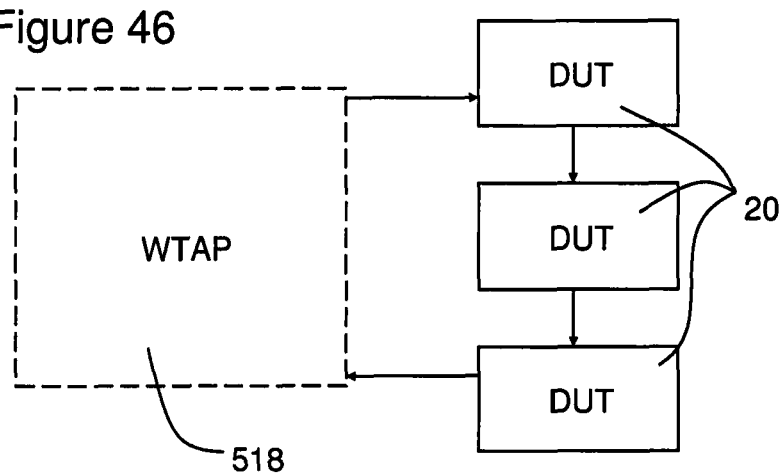
FIG. 46 is a block diagram of an apparatus for interrogating an electronic component in communication with several devices under test chained in series.

FIG. 43 shows a more complex WTAP 18 having multiple WCBs 510 and multiple TAPs 512. Communications between WTAP 518 and DUT 20 will now be described with reference to FIG. 44 through 46. FIG. 44 illustrates communication between a single WTAP 518 and a single DUT 20. FIG. 45 illustrates a WTAP 518 designed to communicate with multiple DUTs 20. One method of achieving this is to use a simple multiplexer to control which DUT 20 is communicating with WTAP 518 at any given point in time. FIG. 46 shows WTAP 518 in communication with multiple DUTs 20 by chaining them in series. When, for example, DUTs 20 store test inputs/outputs in scan registers, the registers of each DUT 20 can be chained together to form a very large scan chain. This allows a single WTAP 518 to test multiple DUTs 20.

Figure 47:
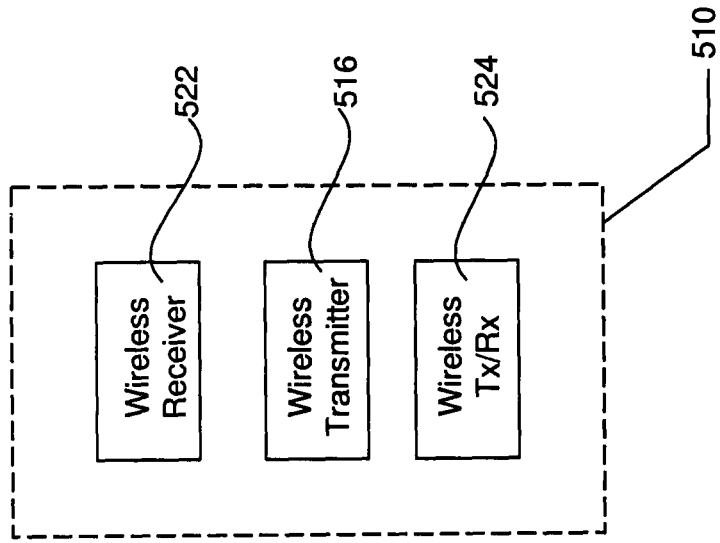
FIG. 47 is a block diagram of an apparatus for interrogating an electronic component having transmitter, receiver, and transmitter-receiver circuits integrated on the same substrate such as a chip, board, substrate, or riser card.
Figure 48:
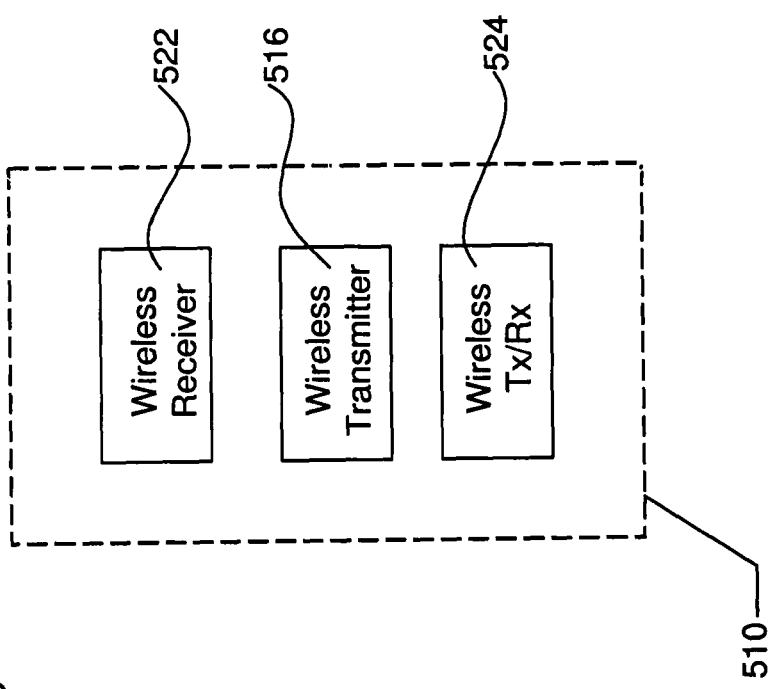
FIG. 48 is a block diagram of an apparatus for interrogating an electronic component having transmitter, receiver, and transmitter-receiver circuits built on independent substrates such as chips, boards, substrates, or riser cards.

Placement of WTAP's will now be described with reference to FIG. 47 through 49. FIG. 47 shows integration of transmitter 516, receiver 522, and transmitter-receiver 524 circuit on the same substrate 544. Examples of substrate 544 include chips, boards, or riser cards. FIG. 48 shows that transmitter 516, receiver 522, and transmitter-receiver 524 circuits may be built on completely independent chips, boards, substrates, or riser cards. FIG. 49 shows that the inductors/capacitor plates/antennae 546 also may all be distinct and separate, and on separate chips, boards, substrates, or riser cards.

Figure 50:
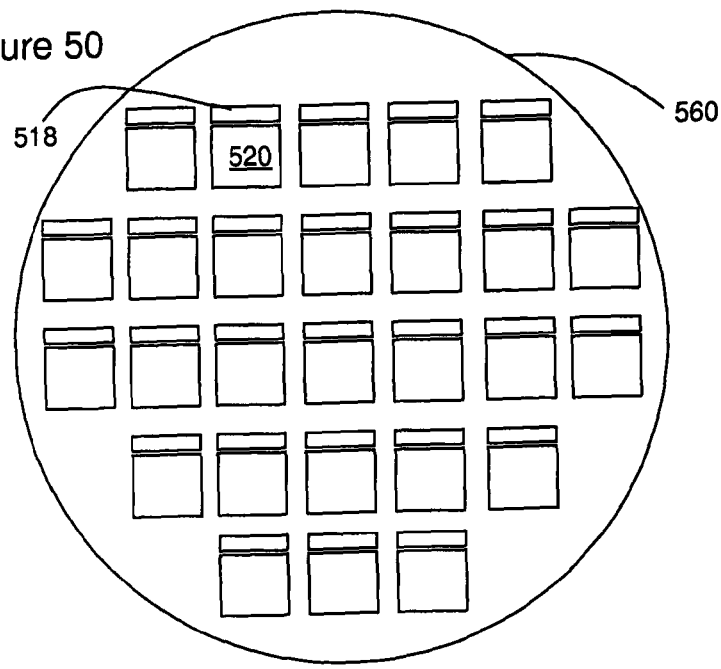
FIG. 50 shows an apparatus for interrogating electronic component devices under test on a processed but undiced semiconductor wafer.

A plurality of WTAP's 518 and DUTs 20 may be manufactured simultaneously on a processed, but undiced semiconductor wafer 560, as illustrated in FIG. 50.

System Access Port

Figure 51:
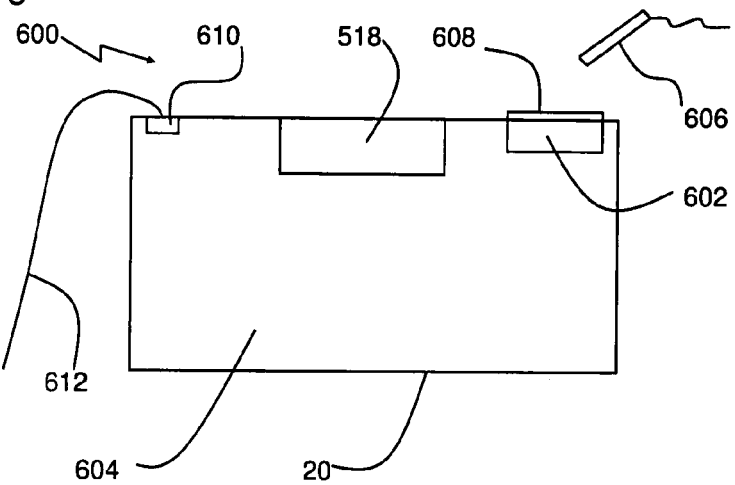
FIG. 51 illustrates an apparatus for interrogating an electronic component integrated into a DUT.
Figure 52:
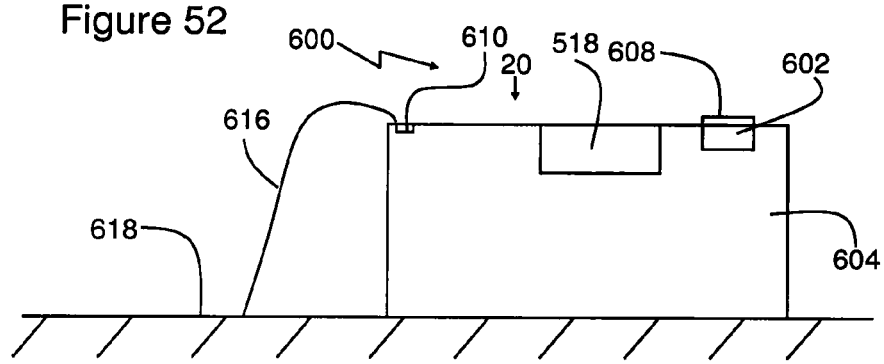
FIG. 52 illustrates an apparatus for interrogating an electronic component as a component of a DUT.

SAP 600 will now be described with reference to FIG. 51 through 53. A SAP 600 may be incorporated into a DUT 20 where such SAP 600 comprising a body providing a contact test port 602 is provided on the substrate 604 of a DUT 20 to enable wireline testing using a probe 606 to contact interface in the form of a touchpad 608 as illustrated in FIG. 51. Test port 602 is conductive and is in direct electronic communication with the components on one or more DUT 20 that are to be tested. A WTAP 518 may also be provided in combination on DUT 20.

Optionally, test port 602 may also be in electronic communication with one or more connection points 610 to allow wired communication of power or data along wire 612 between the DUT 20 and other devices.

In a preferred embodiment, test port 602 will be a special multi-contact panel that is constructed from a robust material such as tungsten or titanium, or a pad of gold that is thicker than conventional gold contacts, so as to enable multiple contacts by probe 606 without causing significant damage to test port 602.

It will be recognized that a description of the robust material of devices based on the teachings herein may be made of other conductive material or composite conductive material that is resilient or non-marking and so such descriptions are non-limiting.

Optionally, SAP 600 may be incorporated into a multi chip device comprising at least one DUT 20 and at least one SAP 600. SAP 600 has bond wires 616 to conduct one or more of power and data to substrate 618, for example a circuit board as illustrated in FIG. 52.

Figure 53:
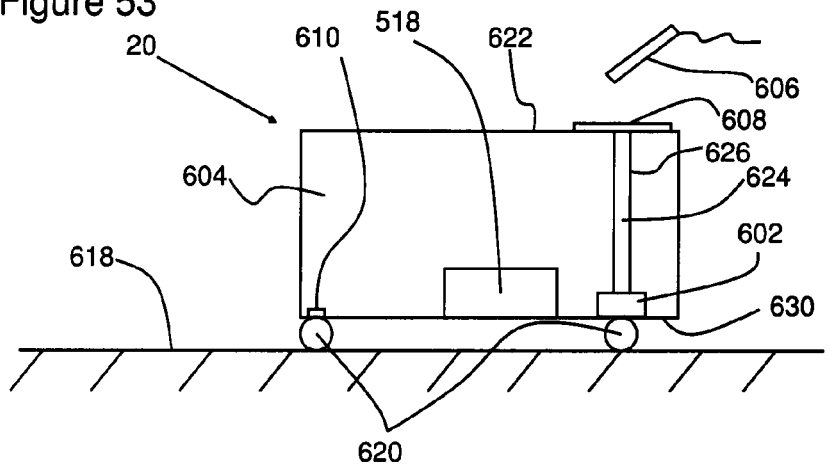
FIG. 53 illustrates an apparatus for interrogating an electronic component as a component of a DUT flip chip mounted.
Figure 54:
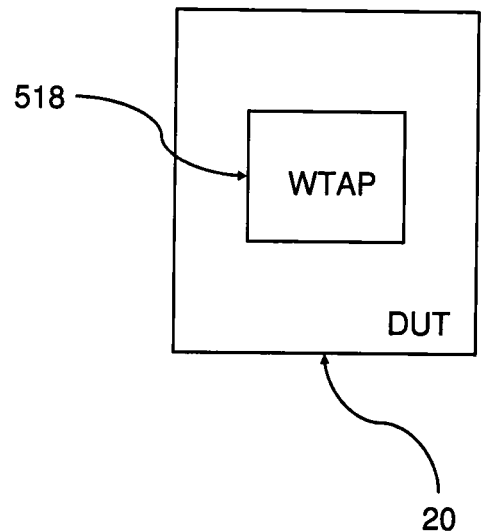
FIG. 54 illustrates an apparatus for interrogating an electronic component with WTAP integrated into a DUT.
Figure 82:
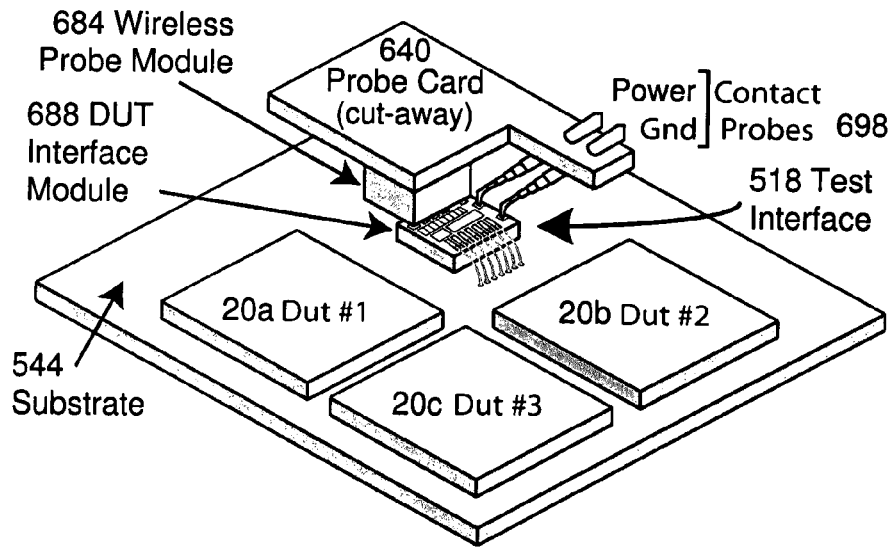
FIG. 82 is a perspective view of an apparatus for interrogating an electronic component with wireless test structures integrated onto a DUT.

Referring to FIG. 53, optionally, SAP 600 may be usable in "flipped" orientation, in which WTAP 518, test port 602 and connection points 610 are on a first face 630 placed opposed to and adjacent an extended substrate 618 such as a board. Test port 602 and connection points 610 are then in contact with electrical contact points 620 on substrate 618 and are thereby in communication with other electronic components on the same substrate 618. Referring to FIG. 54, optionally WTAP 518 may be incorporated into DUT 520, or onto DUT 520, as shown in FIG. 82.

Referring again to FIG. 53, in a flipped orientation, touchpad 608 of test port 602 is situated on the opposite second face 622 of SAP 600 from that adjacent substrate 618. A "via" 624 is an electronic conductor situated in a hole 626 drilled through, for example, a chip when substrate 604 is silicon, so that touchpad 608 is in electronic communication with the other parts of test port 602 situated on first face 630 adjacent to substrate 618. An advantage of this arrangement is that touchpad 608 may be significantly larger, up to the whole area of second face 622, than one placed amid the components on first face 630 as the electronic components to be tested. Another advantage is that second face 622 can be utilized for multiple touchpads 608, for example for independent and simultaneous supply of electrical power and RF communications, and for one or more connection points 610.

Optionally, touchpad 608 of test port 602 is situated on the opposite second face 622 of SAP 600 from that adjacent substrate 618. A conductive trace 632 is situated around the first face 630, an edge face 634, and the second face 622 so that touchpad 608 is in electronic communication with the other parts of test port 602 situated on the first face 630 adjacent to the substrate 618 (not shown in drawings).

Figure 55:
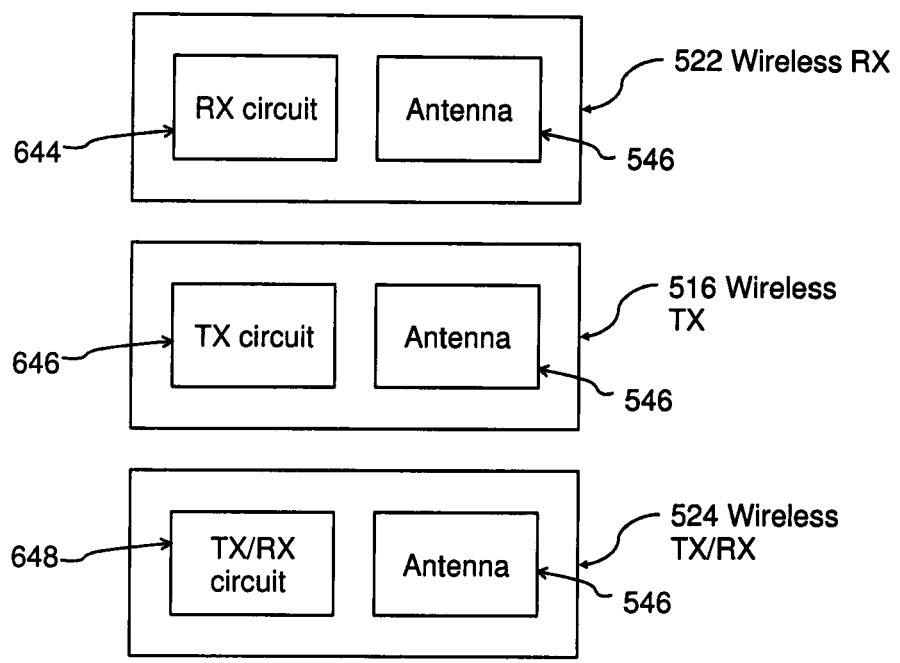
FIG. 55 illustrates an apparatus for interrogating an electronic component with chips having severally a transmitter and an antenna, a receiver and an antenna, and a transceiver and an antenna.

Referring to FIG. 55, transmitter 516 is a combination of Tx circuitry 644 and an antenna 546, receiver 522 is a combination of Rx circuitry 646 and antenna 546, and transceiver 524 is a combination of transceiver circuitry 648 and antenna 546. Referring to FIG. 56, antenna 546 and a receiver 522 may be mounted to the same substrate 544. Referring to FIG. 57, WTAP 518 optionally includes both of touch pad 608 as an electronically contactable test port and transmitter/receiver 524 for wireless communications 650. WTAP 518 is hardwired by wire 616 to other circuitry. Referring to FIG. 58, when WTAP 518 and at least one DUT 20 are hardwired into electrical contact with the same substrate 544 they are in electrical communication whereby DUT 20 can undergo testing. Power 652 is provided via a substrate contact 654.

Figure 59:
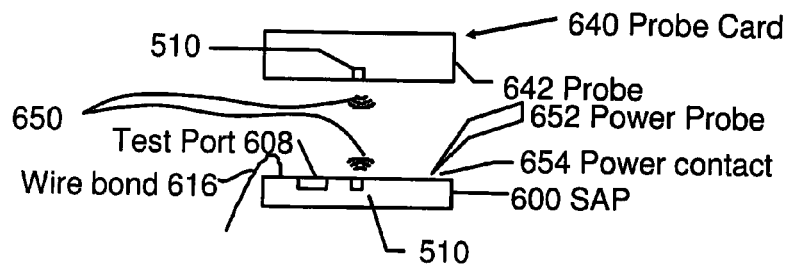
FIG. 59 illustrates an apparatus for interrogating an electronic component with a probe card and a SAP in bidirectional wireless communication.
Figure 60:
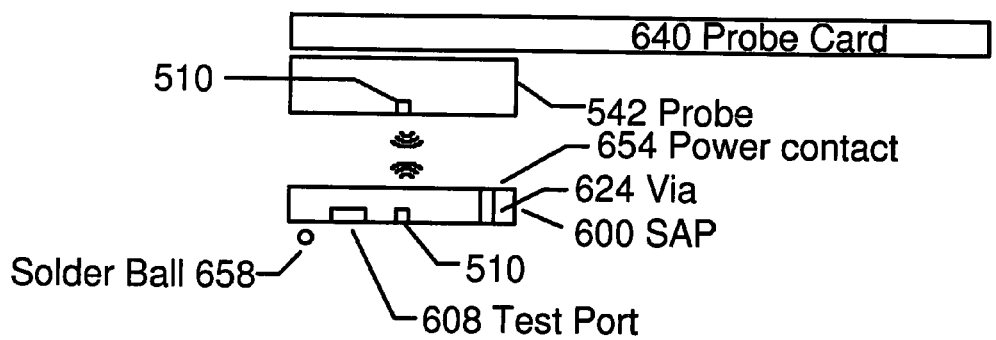
FIG. 60 illustrates an apparatus for interrogating an electronic component with a probe card having a probe in bidirectional communication with a chip that is a SAP, the chip being in flipped orientation.
Figure 61:
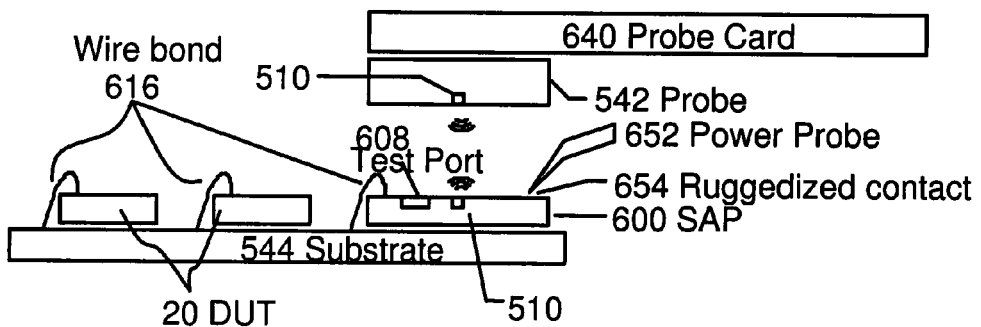
FIG. 61 illustrates the apparatus for interrogating an electronic component with the probe card, probe and SAP shown in FIG. 60, used to test two devices under test mounted to the same substrate as the SAP.

Referring to FIG. 59, transceivers 524 at each of a probe card 640 and SAP 600 enable bidirectional wireless communication. Referring to FIG. 60, probe card 640 having a probe 642 can be in bidirectional communication with SAP 600 when that chip is in flipped orientation, and SAP 600 is in electrical communication with substrate 544, for example by solder balls 658. A via 656 provides electrical contact between the faces of SAP 600. Referring to FIG. 61, when SAP 600 and at least one DUT 20 are mounted on the same substrate 544 and are in electrical communication, probe card 640 and probe 642 are used to test each DUT 20 so mounted.

Figure 62:
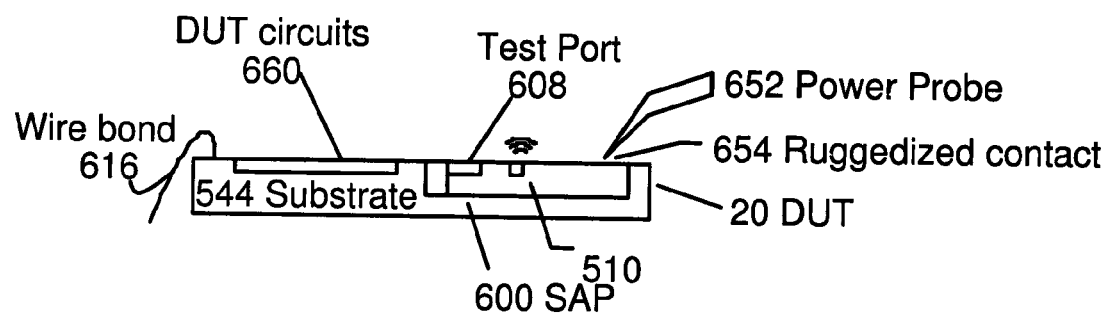
FIG. 62 illustrates an apparatus for interrogating an electronic component with a SAP integrated into the device under test.

Optionally, SAP 600 and DUT circuits 660 can be integrated into DUT 20, as illustrated in FIG. 62.

There are several advantages of the present teachings. With SAP 600, circuits and electronic components of DUT 20 can be tested either by establishing wireless communication through WTAP 518, by establishing electrical communication through contact by probe 606 at touchpad 608, or both. When a higher level of power is required than can be supplied using WTAP 518, that level of power can be supplied through touchpad 608.

Additional advantages accrue when SAP 600 is in flipped orientation. The area of touchpad 608 can be enlarged so as to allow multiple contacts without causing irreparable harm to DUT 20.

Touchpad 608 can be manufactured from any durable material compatible with the other components of the circuitry, thus providing capability for multiple contacts by probe 606.

A method for one or both of communication between and testing of electronic devices and integrated circuits is described. Provision is made for testing using either or both of wireless methods and physical methods using electronic contact by a probe. The wireless method uses a wireless communication block (WCB) 510, and a device access port (DAP) 512 or a test access port (TAP). The WCB 510 is used to wirelessly communicate with a probe, and the DAP or TAP 512 is used to directly communicate with or test an electronic device. The contacting method involves the use of a contact pad on the electronic device that is in electronic communication with the integrated circuits thereon, and a probe in electronic communication with automated test equipment. Optionally, a logic controller can be used to convert input instructions and data into test signals.

In parallel with the above system, an on-device electronic contact is provided for communication or testing using a physical probe. Such test ports are the predominant and only commonly-used method of communicating or testing electronic components in the electronics industry. Communication or testing requires physical, electrical contact between a probe and the electronic component, also known as "DC coupling" or "wireline coupling", for example, testing of an integrated circuit via an on-chip structure that is conductive. Test needles are brought into contact with the circuit at these test ports in order to make a DC-coupled, wireline link.

The apparatus and method of the present teachings have been experimentally tested as will be illustrated in the following examples.

EXAMPLE 1

RF Simulations

The performance of the antenna structures and transceiver circuits is critical to the operation of the WTAP. These have been extensively modeled and simulated. For the antennae, the simulations were performed using a combination of four different simulation software 3D packages. The first two packages, Totem (developed in an academic environment) and AxFDTD use the Finite Difference Time Domain (FDTD) method. The third and fourth packages were, Advanced Design System (ADS) and Sonnet, which use Method-of-Moments (MoM) analysis. Using simulations on each of the different packages was used to determine the optimum antenna geometry, antenna pitch, antenna size, matching circuits, and antenna termination from a theoretical point of view. A discussion of basic antenna design modeling for wireless chip to chip communications can be found in, for example, Sellathamby et al. "Wireless Probe Card", Southwest Test Workshop, Session 7, 2004, and Floyd et al. "Wireless Interconnection in CMOS IC with Integrated Antennas", IEEE ISSCC 2000, Paper WA 19.6, February 2000, pp. 238.

EXAMPLE 2

Scaled Antennas

While computer models for antennae are helpful they are necessarily incomplete because of the micro environmental details within the ICs. For example, CMP metal is used on sub-micron VLSI chips to allow manufacturability and yield with multi-layer metal chips. It is a key enabler of the production of chips but creates a major impact the electromagnetic microenvironment especially when attempting to have wireless communications off chip. Because fabrication and experimentation of this directly in VLSI is expensive and time consuming a design of experiments model of the antenna environment on chip was conceived to answer unknowns with respect to antenna micro-environments. Several antenna environments were produced at a 20033 chip scale using of standard electronics materials. These results allowed a quick test of the microenvironment issues for the eventual silicon design.

Theoretically antennas scale over all sizes and wavelengths. That is, size is directly proportional to wavelength. Therefore antenna Length=1/Freq. Inductance and Capacitance scale directly with linear size.

The scaled antenna test setup is described as follows. A Network Analyzer (NA) HP 8702B was wired to an RF Coupler (Mini Circuits ZEDC-10-2B) to provide a reference signal back to the NA in order to maintain constant forward power. The forward path of the coupler (output) was connected to transmit antenna of the scaled test pair. On the other (receive) antenna a measuring oscilloscope was used to measure the coupling of the antenna pairs.

Figure 63:
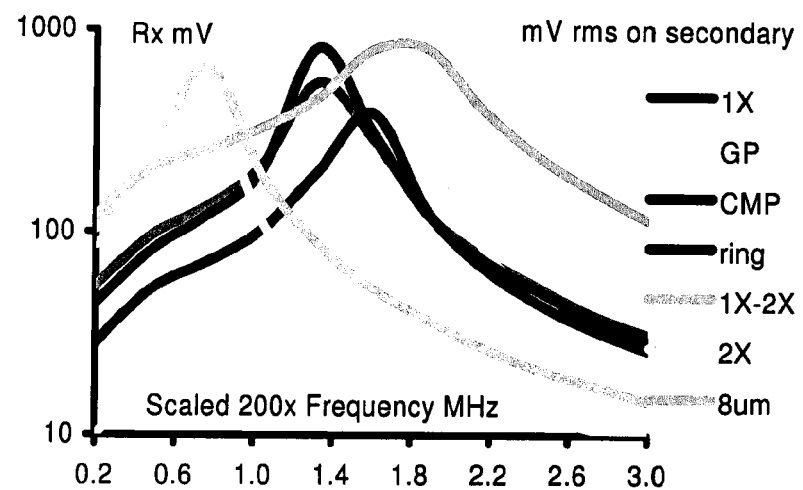
FIG. 63 illustrates a representative set of experimental results for an apparatus for interrogating an electronic component (coupling voltage versus frequency) with various scaled antenna environments.

FIG. 63 shows a representative set of experimental results (coupling voltage versus frequency) with various scaled antenna environments. In FIG. 63 one can see that the CMP appears improve coupling over that of a bare antenna (1×) while a ground plane (GP) has a definite negative impact. The design challenge is to pick an antenna structure that can give high coupling and wide bandwidth and yet not be too high in operating frequency, which is limited in CMOS.

The data showed that the design frequency of 1.5 GHz could be obtained with consideration of the microenvironment. CMP does not seem to have a major impact and that major conducting structures should not be placed (if possible) directly within the antenna area.

EXAMPLE 3

Transceiver Design

The transceiver circuits used for data transfer were designed and simulated with CAD software tools. Because the system requirements for this implementation of JTAG required 10 M-baud throughput Amplitude Modulation (AM) was chosen as the most feasible and the lowest design risk communication method. Due to the system requirements, GHz carrier and low error rate, AM is a reasonable choice mostly due to its simplicity of design and implementation. Earlier simulations included AM, FM and direct digital modulation techniques.

The receive chain was also chosen to be a relatively simple in this case a low power LNA without frequency tuning. This gives a low power and real estate budget and at the same time avoids the selection of tuned elements, which likely have deleterious frequency dependence a shown earlier with the design of experiments of antennae environments.

To enable very high fidelity (low error rate) data transmission the RF carrier frequency was chosen to be a large multiple of the data rate. In our case a 1.5 GHz carrier was chosen from a coupling, power consumption and communications fidelity point of view. Since the transmission range is small, but constrained by the use of a relatively low frequency CMOS technology careful design of the transmitter and receiver are required. An envelope detector was used for demodulation. This circuit was designed with a minimal number of components to save area. One area of particular attention is the susceptibility to noise in a test environment. The high carrier frequency versus the modest (relatively) data rate goes a long way to militating against noise.

A guard ring placed away from the antenna was included, and careful consideration of CMP design rules (metal fill) and an N-well barrier was placed around the transceiver in the physical layout. This was done to reduce the susceptibility to interference caused by noise and to reduce coupling to the rest of the circuit. The area occupied by the transceivers using the AM technique is on the order of the antennas themselves.

The transceivers were designed in a 130 nm 'standard' logic CMOS process of a major semiconductor foundry as follows:
  Technology: CMOS 0.13 um
  Number of metal layers: 8 available, 8 used
  RF design frequency: 1.0-1.5 GHz
  Antenna size: 120 um×120 um A CMOS (130 nm technology) chip was fabricated and is show in FIG. 64. This figure shows both the DUT (Left) and the Probe (Right) as well as antennas (TOP). In this picture the Probe IC is wire bonded (lower right) to a ceramic board, which is part of the wireless probe shown at the center of the probe card in FIG. 65.

The results from the performance evaluation of the fabricated CMOS circuits are presented as follows. The above simulation results are experimentally verified using the CMOS chips. After fabrication the DUT/Probe ICs were tested for functioning RF transmit signals on a standard probe station.

A custom RF (contactless) Probe was designed and placed proximally central to the DUT/Probe antennas to show operation of 5 independent transmit path signals, TDI, TCK, TMS, DIRIN, *TRST. An RF spectrum analyzer was used with the custom probe to observe the RF carriers.

Figure 66:
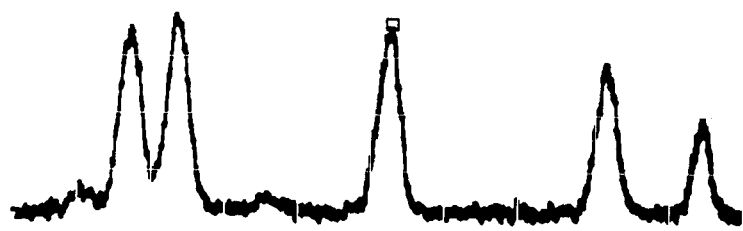
FIG. 66 illustrates the results of one test of an apparatus for interrogating an electronic component and demonstrates the independent (parallel) nature of the transmitting signals.

FIG. 66 demonstrates the independent (parallel) nature of the transmitting signals. The testing showed 100% yield for testing of fourteen devices, indicating that the fabrication of the basic RF transmit carrier was successful. Each RF signal is controlled by its own Voltage Controlled Oscillator (VCO) and further by its own data path. The carrier frequency measured was 1.48 GHz with a spread of less than 100 MHz. This is completely adequate with respect to a narrow frequency as required by the tuning effect of coupling antennas mentioned earlier. These parallel RF signals between the Probe and DUT (SiP) become virtual wires for the JTAG signals, thus providing a wireless TAP. As mentioned earlier these five transmit signals are used for the JTAG Probe signals. On the DUT there are five corresponding receivers.

EXAMPLE 4

Probe Physical Design

Figure 64:
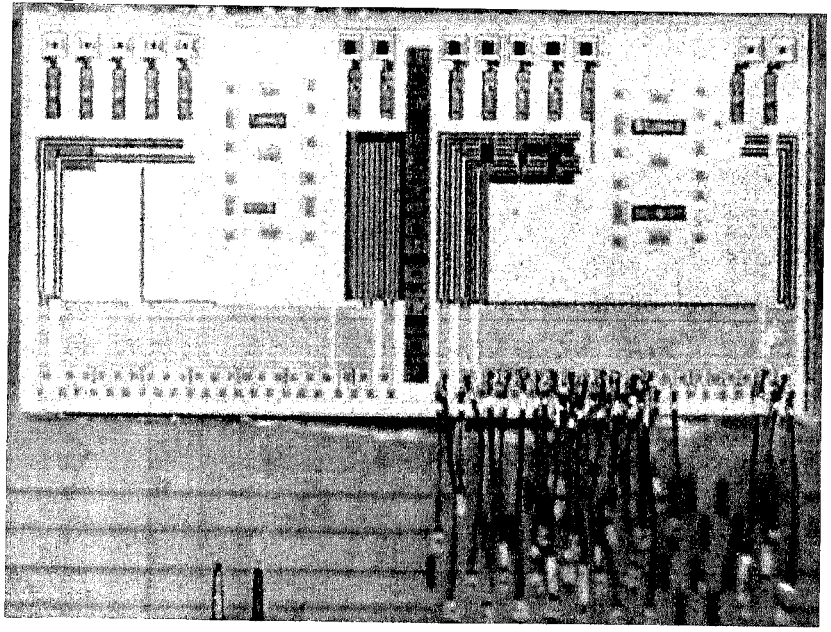
FIG. 64 illustrates both the DUT (Left) and the probe (Right) as well as antennas for an apparatus for interrogating an electronic component (TOP). Here the probe IC is wire bonded (lower right) to a ceramic board, which is part of the non-contact probe.
Figure 65:
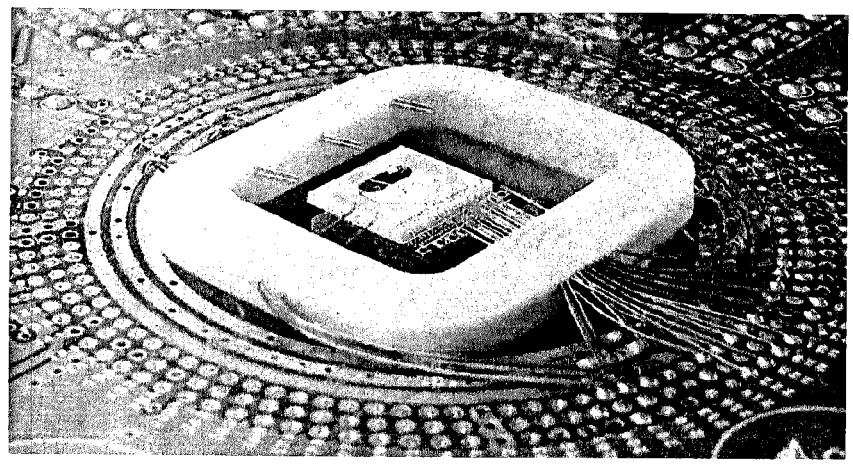
FIG. 65 illustrates a hybrid apparatus for interrogating an electronic component with non-contact probe card. The non-contact probe is placed in the center opening of a standard probe card. Standard probe needles, seen on the periphery of the non-contact probe card, provide power to the SiP non-contact DUT.

FIG. 65 shows a hybrid wireless probe card. The wireless probe, illustrated in FIG. 64, is placed in the center opening of a standard probe card. Standard probe needles seen on the periphery of the wireless probe card provide power to the SiP wireless DUT.

The wireless probe shown in the center of FIG. 65 consists of five elements:
1. Probe transceiver IC
2. Ceramic transition hybrid
3. PCB with ribbon connector to Probe PCB
4. Back mounting post
5. Wireless Probe mount (fits within topside Probe card PCB ring)

All of these must fit in the throat of the opening of an unmodified probe card. Bench testing was carried out on a standard prober. Face to face error rate testing was carried out on a custom xyz probe holder. SiP production testing was carried out on an Electroglas 4090u prober with an Agilent 4070 tester on the production floor of NXPs production facility in Caen France.

Electrical parametric tests can detect defects other than functional faults. For example, Iddq tests can detect some resistive faults that are not severe enough to cause a logical fault in digital circuits. Some tests can be used to detect elevated quiescent current above normal. A standard element in testing is a ring oscillator, which can be used to find basic gate delay as well as yield issues. A long chain ring oscillator was included in the WTAP DUT to allow process parameters to be observed both by the wireless interface (ring Osc. frequency) as well as ATE (Iddq) connected to the Prober.

Figure 68:
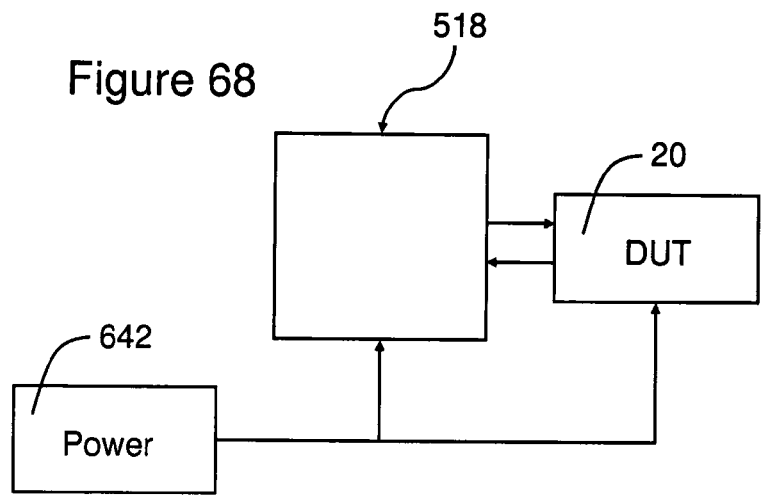
FIG. 68 is a block diagram an apparatus for interrogating an electronic component illustrating power applied externally to the WTAP and DUT.

As illustrated in FIG. 68, an apparatus is created for which testing can be performed by the application of external power. FIG. 68 is a block diagram an apparatus for interrogating an electronic component illustrating that external power 648 is applied externally to the wireless test access port (WTAP) 518 and DUT 20. This is useful for higher power applications where external power can be large and controlled thru element 648.

Figure 69:
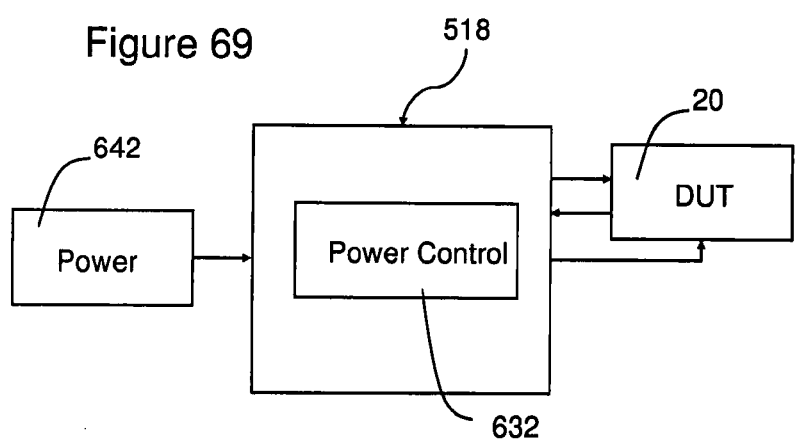
FIG. 69 is a block diagram an apparatus for interrogating an electronic component illustrating power applied externally to the WTAP and the WTAP supplying and controlling power to the DUT.

As illustrated in FIG. 69 an apparatus is created for which the power can be applied through the WTAP 518. FIG. 69 is a block diagram an apparatus for interrogating an electronic component illustrating external power 648 applied externally to the WTAP 518 and the WTAP 518 supplying and controlling power, via power control element 632 to the DUT 20.

Figure 70:
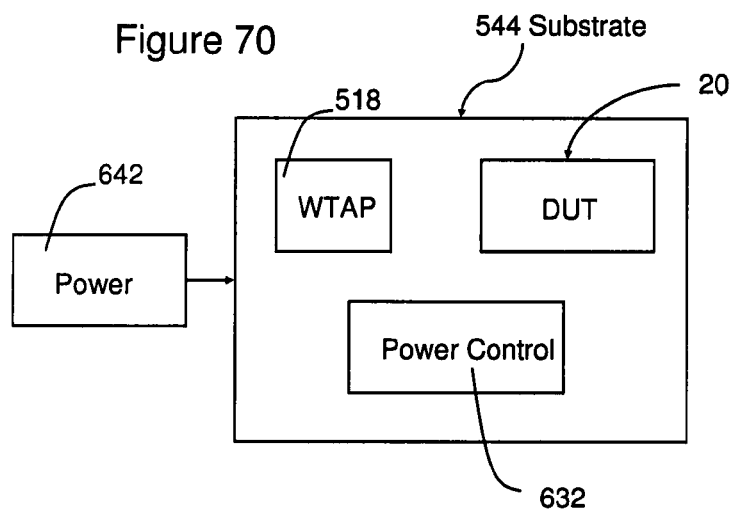
FIG. 70 is a block diagram an apparatus for interrogating an electronic component illustrating power applied externally to the substrate.

As illustrated in FIG. 70 an apparatus is created in which the external power 642 is applied to a WTAP which has internal power control 632 as well as an internal DUT 20. FIG. 70 is a block diagram an apparatus for interrogating an electronic component illustrating power applied externally to the substrate where the DUT and WTAP are not separated.

Figure 71:
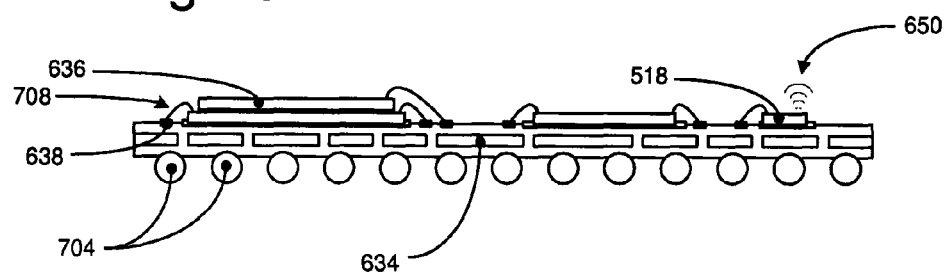
FIG. 71 illustrates an apparatus for interrogating an electronic component with a SIP device mounted on a substrate.

FIG. 71 illustrates an apparatus for interrogating an electronic component with an SIP device mounted on a substrate. In this apparatus the following elements are combined to form a System In Package (SIP). There is a Wireless Test Access Port 518 as separate IC, substrate 634 with redistribution conductors, stacked die 636, bond pad on substrate 638, test or control signal 650, ball bond 704, and wire bond 708.

While this figure shows two dies stacked it will be familiar to those in the art that multiple dies, 3, 4 etc can be assembled in a similar way and thus be advantaged by this inventive apparatus.

Figure 72:
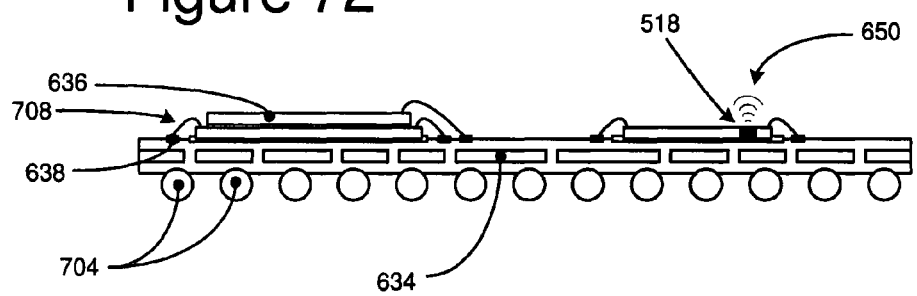
FIG. 72 illustrates an apparatus for interrogating an electronic component with a SIP device integrated within an integrated circuit.

In a similar manner as FIG. 71, FIG. 72 illustrates an apparatus for interrogating an electronic component with a SIP device, however in this case the WTAP is integrated within an integrated circuit.

The integrated circuit may perform functions for ultimate utility of the SIP devices but in this case has the added functionality to perform the WTAP function. It may be integrated into one or several such circuits as needed for test coverage.

With the hybrid design the DUT can be placed in various modes and the SiP can be tested for Iddq as it is assembled. Any out of spec part or manufacturing step can then be noted for rejection of additional component placement or final packaging.

EXAMPLE 5

Wireless Error Rate Testing

To test the integrity of the system data error rate tests were performed to evaluate the raw error rate under ideal and non-ideal DUT probe placement conditions as well as seeing the range of mechanical offsets possible. A bit error rate test was used to determine error rate of wireless communications link. On the transmit (digital input) probe side a test pattern was with a Tektronix CSA 907T test set. The DUT receive signal (digital output) was connected to the companion Tektronix CSA907R receiver. The clock rate was set to 20 MHz on test the units to match the design goal of 10 Mbaud data rate. The pseudorandom bit pattern was selected on the transmitter. The receive test set was set to observe the same pattern. The receive level settled on 0.4 volts. This low voltage is due to 50 ohm termination of the Tektronix test set loading the CMOS DUT output. The low power CMOS logic output of the DUT normally would not see 50 ohms and thus loaded the output to a lower voltage level. When the probe was situated over a DUT mounted on a SiP substrate a 30 um gap was set between DUT and probe.

Figure 67:
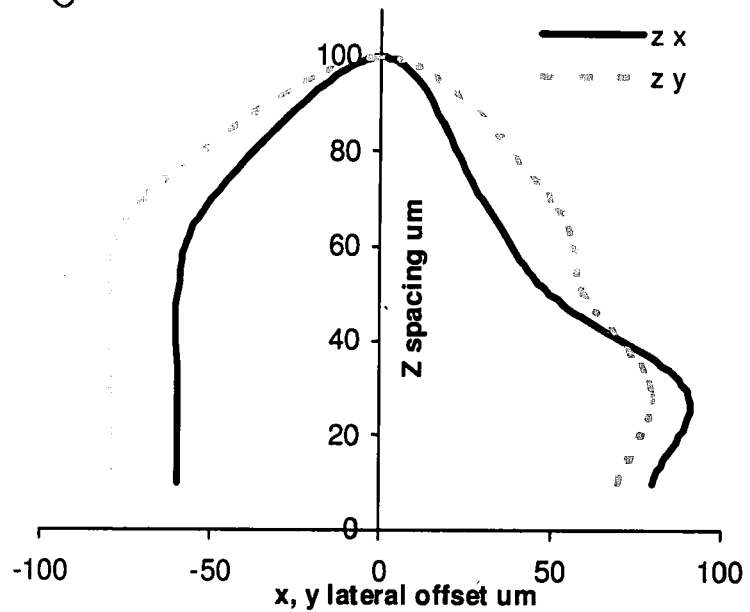
FIG. 67 illustrates error rate versus vertical and lateral DUT to probe alignment offsets of an apparatus for interrogating an electronic component.

FIG. 67 shows error rate versus vertical and lateral DUT to probe distance offsets and the 10-10 error rate contours. Within the contour the error rate is essentially zero and outside the error rate rapidly increases to 100%. The +Z direction has greater separation between DUT and probe. The +ZX direction moves the probe to increase the overlap with the DUT. The −ZX direction moves the probe in the opposite direction, giving less overlap with the DUT. The ZY direction moves the probe laterally so that antennas are more or less overlapped. It can be seen in FIG. 67 that the required floating probe location for good data integrity is approximately +/−50 um in the X or Y direction, and between 0 and 45 um in the Z direction.

Wafer or laminate testing is accomplished using a test computer or tester, connected to a test head, connected to a load board with probe card, which communicates via some contact or contact-less communication with an integrated circuit (IC) wafer, laminate, system in package (SIP), redistributed chip packaging (RCP) wafer, or circuits created through some other additive or subtractive fabrication processes.

Figure 73:
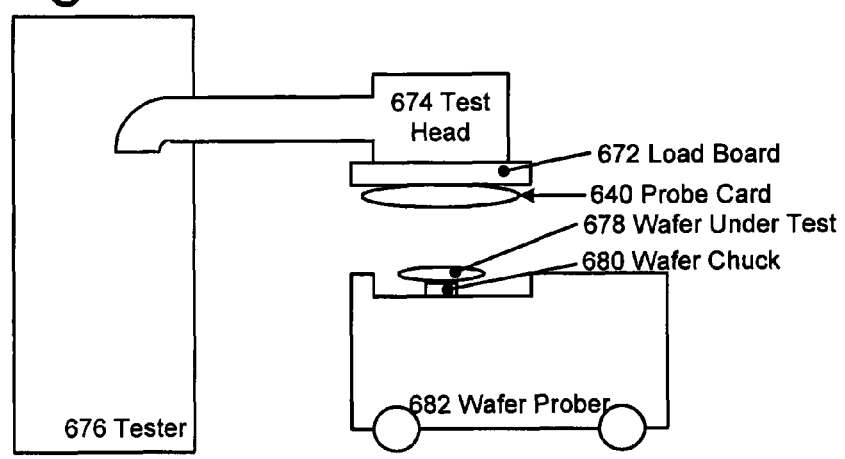
FIG. 73 is a schematic view of a wafer testing system.

A wafer can be a monolithic slice of semiconducting material, or it may be a hybrid structure (as in the case of the RCP wafer) created from discrete devices mounted or molded together into a single disc or rectangular form. FIG. 73 is a system diagram that gives an overall view of the wireless testing system, including the test computer or tester 676, which provides input signals and power supplies via cabling and test head, to the load board 672 and probe card 640 (note that the tester 676, cabling, & test head 674 in some cases will be integrated into a single unit). The Wireless test interface (WTI) chip on the probe card 640 converts the signals to RF signals and transmits them to the WTI Device under Test (DUT) chip or wafer which has been placed on some or many test sites on the wafer. The probe card 640 also transmits power and ground to the wafer, either by contact with probes, or by other non-contact means. The wafer is transported by a wafer chuck 680 on a wafer probe system or wafer prober 682, so that the probe card 640 can align itself over top of one or multiple sites on the wafer to perform the tests, before the wafer is moved to the next set of test sites.

During the processing of the wafer or laminate, process control monitoring (PCM) is performed to determine the quality of the process and the status of the wafer or laminate. The purpose of the PCM is to detect failures in the wafer or laminate and faults in the process as early as possible to reduce the cost of processing faulty wafers or laminates and reduce the effect of a faulty process on further product.

Figure 74A:
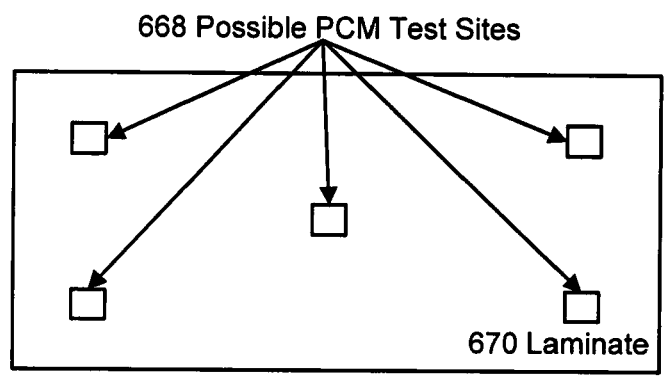
FIG. 74A is a top plan view of possible process control monitoring (PCM) test site locations on a laminate.
Figure 74B:
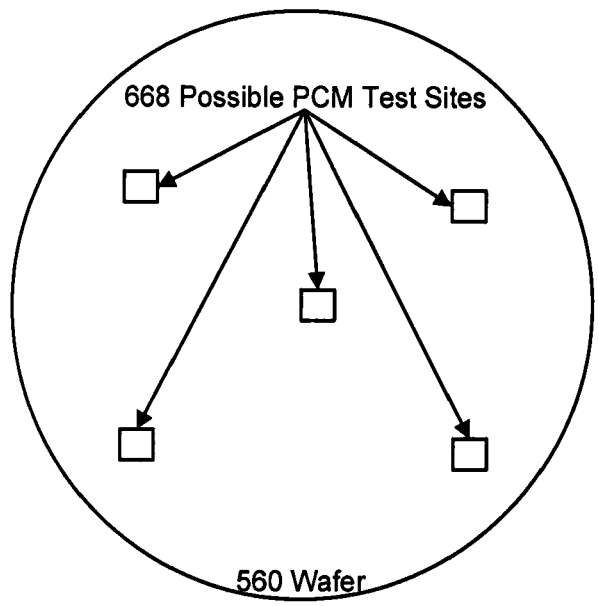
FIG. 74B is a top plan view of possible process control monitoring (PCM) test site locations on a wafer.

One method of conducting PCM is to design and build test sites 668, as shown in FIGS. 74A and 74B on the wafer 560 or laminate 670, instead of building real product at those sites, and to test or sample these test sites to determine the quality of the build process, instead of testing the real product sites. FIG. 74A shows possible locations of process control monitoring test sites on a hybrid wafer 560 (FIG. 74B) or laminate 670 (FIG. 74A). These test sites are dedicated to test structures that will enable evaluation of the fabrication process, and will likely not become real product. The test sites are usually distributed about the wafer or laminate in order to detect variations in process across the area of the product.

Contacting the wafer during PCM by the use of probes has several disadvantages: touching the wafer with probes creates metal & silicon particles which can damage the product and equipment, repeatedly touching the wafer can destroy the contact point so that the wafer cannot be tested further, alignment of probes on the wafer becomes more difficult as the contact points decrease in size and increase in number.

Methods described here use communication between probe card (on which the Scanimetrics WTI probe chip is located) and on-wafer PCM test site (on which the Scanimetrics WTI device under test (DUT) chip is located). Communication between probe card and test site can be of two types:
  contact probing using mechanical probes
    contact-less probing using radio frequency (RF) communication. In this case, contact probes may or may not be used to provide power and ground to the test site.

Figure 75A:
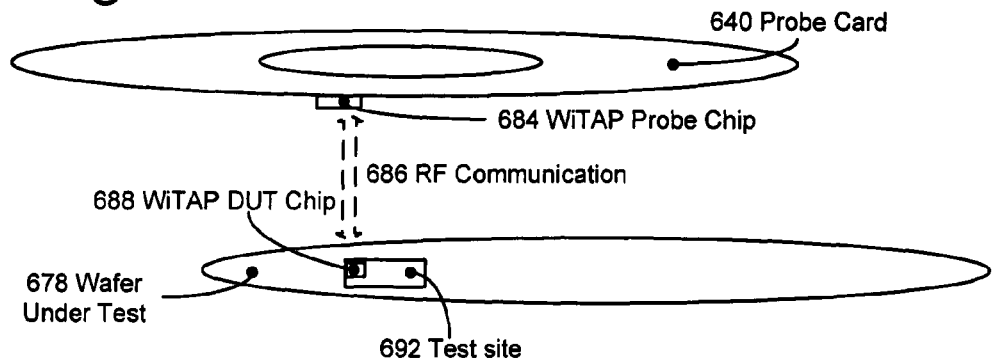
FIG. 75A is a schematic view of a probe card and wafer under test showing non-contact communication and power delivery.
Figure 75B:
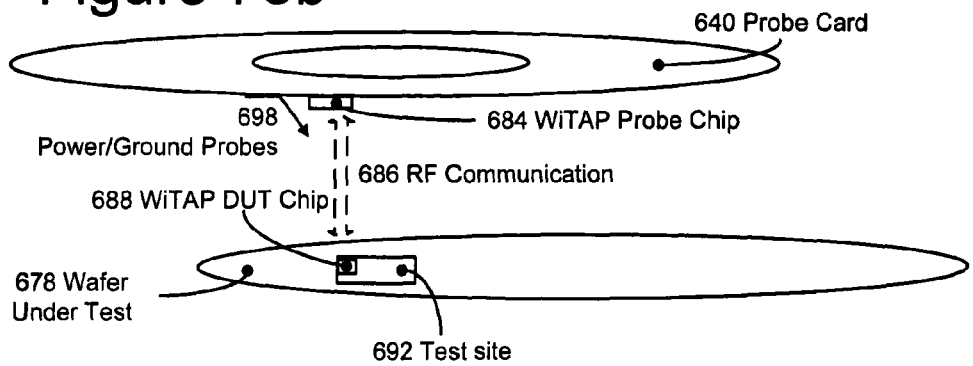
FIG. 75B is a schematic view of a probe card and wafer under test showing non-contact communication with contact power delivery.
Figure 75C:
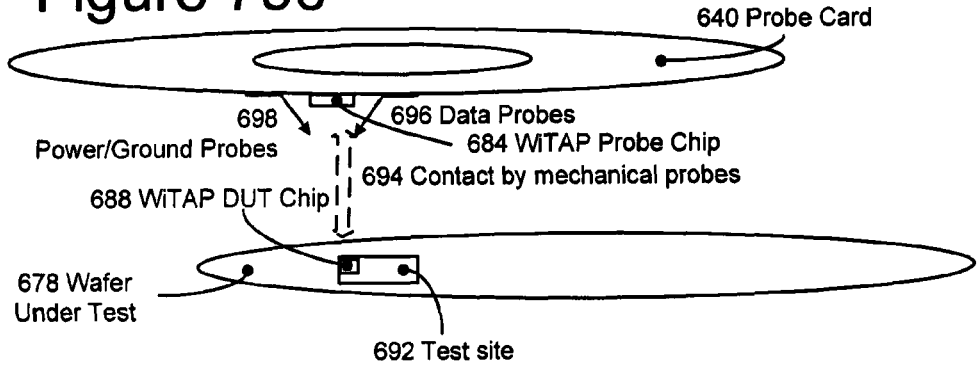
FIG. 75C is a schematic view of a probe card and wafer under test showing contact communication and power delivery.

FIGS. 75A, 75B, and 75C show some details of a probe card 640 and wafer or laminate under test 678. In the process control monitoring (PCM) application, the test site would be one of a few or many spaces on the wafer that have been sacrificed to be used as non-product test sites. At various stages during the manufacturing process, the test site would be tested wirelessly with the WTI probe chip on the probe card to determine the validity of the process and the correct operation of the test site.

Figure 76:
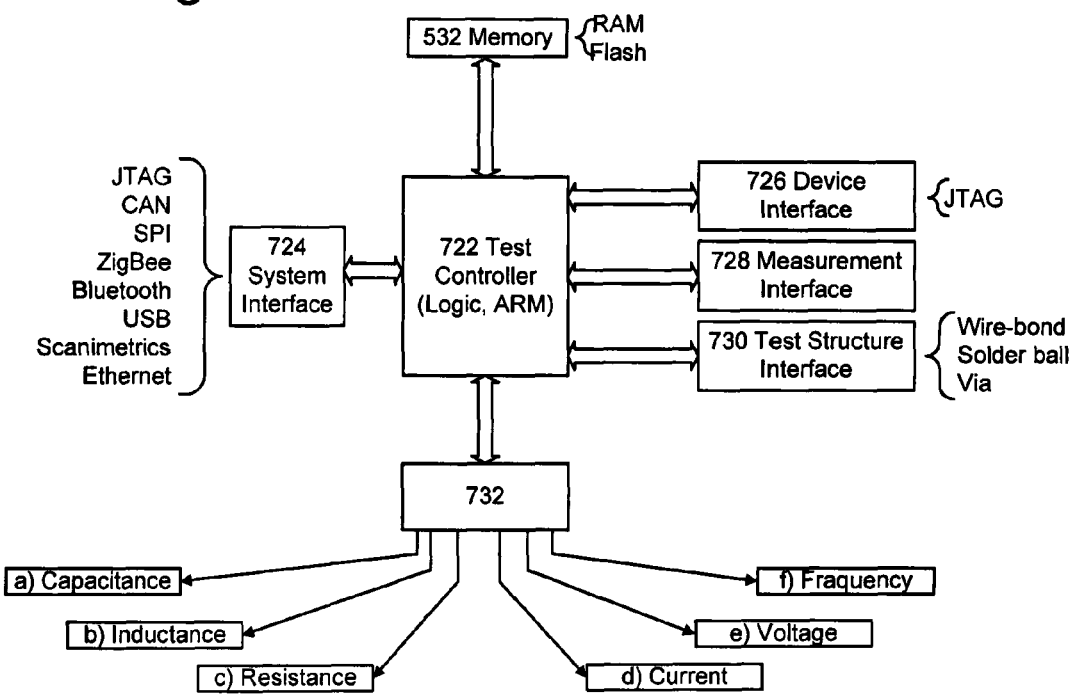
FIG. 76 is a block diagram of a wireless test interface (WTI) PCM testing sub-system.

FIG. 76 shows a block diagram of the WTI Process Control Monitoring (PCM) testing sub-system. The test controller 722 receives commands from the tester via the system interface 724, using a variety of protocols, including JTAG, CAN, SPI, ZigBee, Bluetooth, USB, Scanimetrics-proprietary interfaces, and Ethernet. The test controller 722 sends commands to the measurement unit 732, to take measurements on the device under test, including capacitance, inductance, resistance, current, voltage, and frequency. The test controller 722 can access memory 532 (RAM and/or flash), and can communicate to various devices 726 (e.g. JTAG), measurement structures 728, and test structures 730 (e.g. chains of wire-bonds, solder balls, or vias).

Note that while PCM is described as one application, functional tests will work in the same manner. It will be understood that the suite of PCM or functional tests or a combination are enabled by these teachings.

As the wafer or laminate fabrication process proceeds, tests can be performed at each step to determine if the process is faulty or valid, and if the structures being developed or deposited on the wafer or laminate are working properly.

Figure 77:
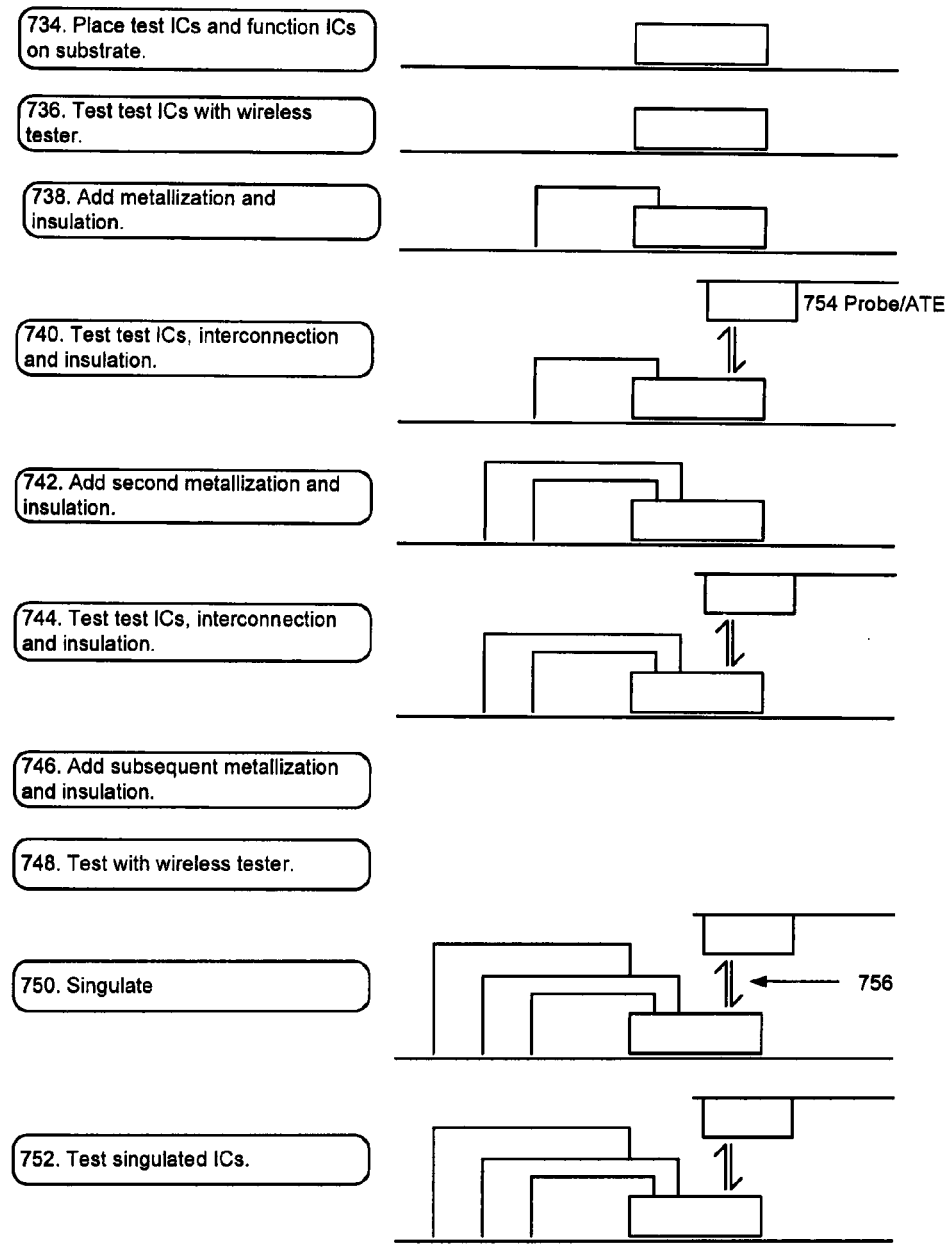
FIG. 77 is a flow diagram of the steps in a fabrication and test process.
Figure 78:
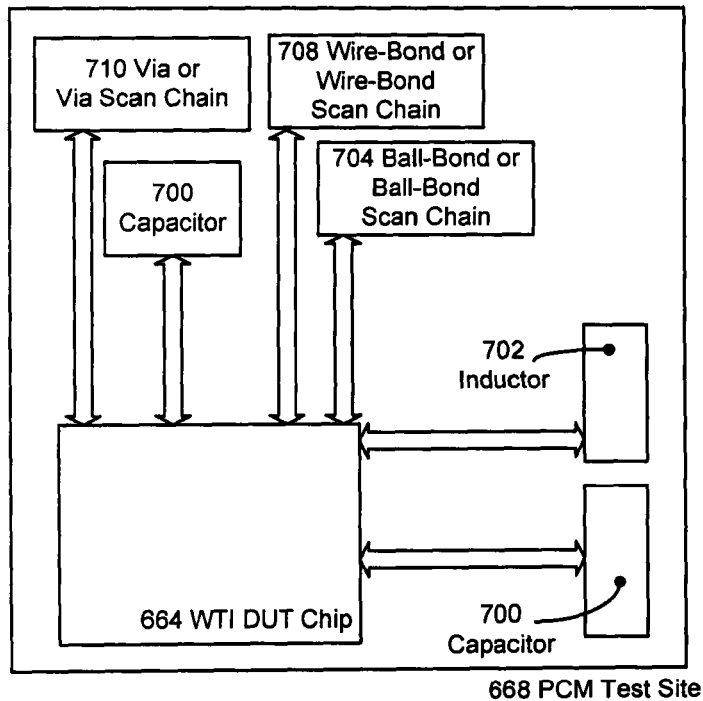
FIG. 78 is a schematic view of a WTI PCM test site.
Figure 79:
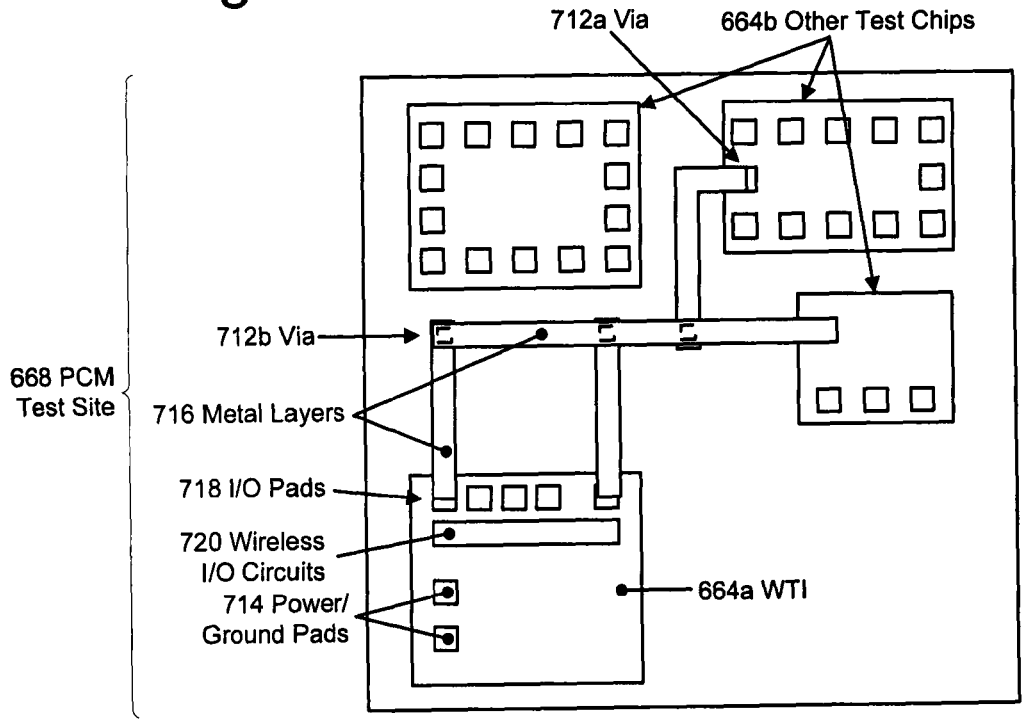
FIG. 79 is a top plan view of a WTI PCT test site.

Building & Testing Process Flow (Using a Wireless PCM):

FIG. 77 shows the fabrication & test process flow, FIG. 78 shows a WTI PCM test site in a high level diagram, and FIG. 79 shows a top view of a WTI PCM test site. Preferably, functional ICs are attached to the substrate, and the WTI DUT IC is attached to test site location on substrate, along with any other test ICs. The WTI DUT IC is tested with the wireless test system.

In FIG. 77, the flow describes the processing and testing steps for building IC wafers, laminates, RCP wafers, or other additive & subtractive processes. The WTI DUT chip is being used for contact or contact-less process control monitoring. The WTI DUT chip can be placed on the substrate in the test site locations, then tested with the WTI probe chip on the probe card, using mechanical probes in the full contact case, or RF communication in the non-contact case. Then the first dielectric layer and first metal layer would be added over top of the WTI DUT chip, and another test would be performed, to verify insulation properties of dielectric and resistivity/connectivity of metal, via loopback from one WTI DUT input to a WTI DUT output. Subsequent layers of dielectric and metal would be applied and tested in a similar fashion.

Referring to FIG. 78, a WTI DUT chip is mounted on one or more dedicated test sites on the hybrid wafer or laminate, and connected via wire-bond, ball-bond, or some other connection method to a variety of structures, including capacitors, resistors, inductors, vias and via chains, ball-bonds and ball-bond chains, wire-bonds and wire-bond chains. These structures can be embedded in the wafer or laminate during the fabrication process, or can be discrete structures that are mounted on the wafer or laminate after fabrication, during the assembly process.

In FIG. 79, the WTI DUT chip and other possible test ICs have been placed on the substrate, and dielectric and metal layers have been deposited over top of the ICs. The metal layers provide interconnect between WTI DUT inputs and other test circuits, with signal returning by metal layers to WTI DUT outputs to be transmitted wirelessly to the probe card.

Figure 80A:
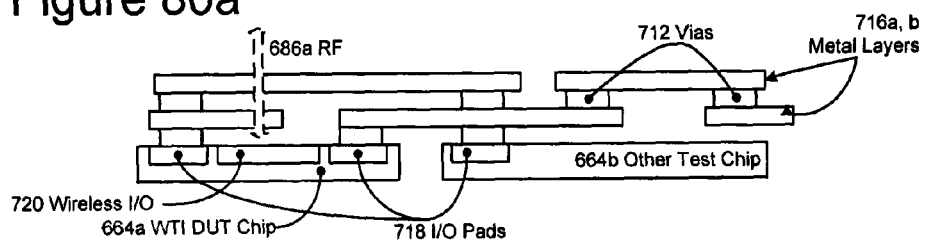
FIG. 80A is a side elevation view in section of a WTI PCT test site with contact-less communication and contact-less power delivery.
Figure 80B:
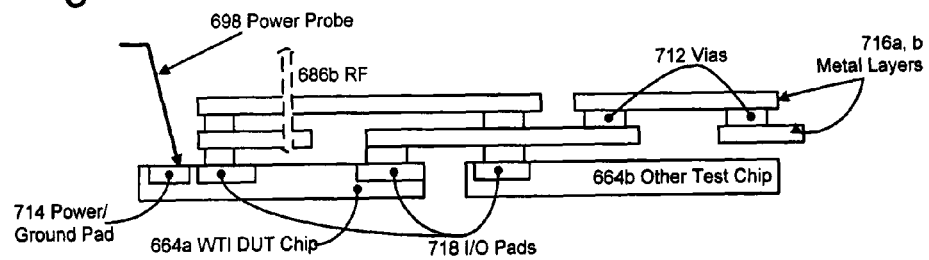
FIG. 80B is a side elevation view in section of a WTI PCT test site with contact-less communication and power delivery via mechanical probes.
Figure 80C:
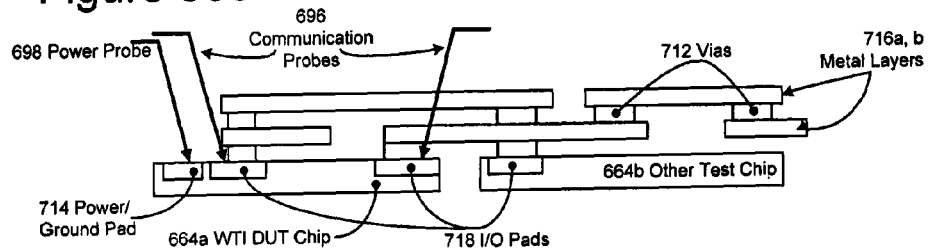
FIG. 80C is a side elevation view in section of a WTI PCT test site with contact communication and power delivery.

PCM Measurements:

The contact-less process control monitoring system will perform the direct electrical measurement of assembly processes. Referring to FIGS. 80A, 80B, and 80C, the following types of measurements can be performed in WTI PCM of the build process 1. Opens/shorts between IC I/O pads 718 and other points, e.g. other I/O pads on other chips, connected with vias 712 and metal layers 716. A "via" 712 is a metal connection between two metal layers 716 or between a metal layer 716 and an I/O pad 718.
2. Via resistance, i.e. a single or multiple vias 712.
3. Wire-bond continuity and resistance
4. Ball-bond continuity and resistance 5. Metal layer 716 connectivity and resistance. The metal layers 716 are deposited, masked, and etched to produce thin metal lines used for interconnect. The WTI DUT chip 664a can be used to test whether these interconnects are able to transmit signals, and to measure their resistance.
6. Metal layer capacitance and inductance. These are especially important measurements when the final product is used in RF applications, where good performance relies on accurate & reliable capacitance & inductance values in the product.
7. Functionality of a test chip on the test site. The WTI DUT chip 664a can provide a scan test to determine the proper working operation of other test chips 664b on the test site.
8. Electrical characteristics (capacitance, resistance, and inductance) of the other mounted test chips 664b or of fabricated on-wafer or on-laminate structures.

FIG. 80A-80C shows a side view of a WTI PCM test site. A WTI DUT chip 664a and another (one or more) test chip 664b is shown lying in test site on wafer or laminate. Full contact communication (via mechanical probes 696) or contact-less communication (via RF 686a and *b*) from probe card with WTI probe chip to WTI DUT 664a allows the application of signals to the I/O pads 718 of the WTI DUT 664a, which will be connected by deposited metal 716 and vias 712 to other test chips 664b or to one or more vias 712 and then returning to another WTI DUT I/O pad, so that the return signal can be read by the probe card. Power delivery can be achieved via mechanical probes 698 or via RF 686a.

Figure 81A:
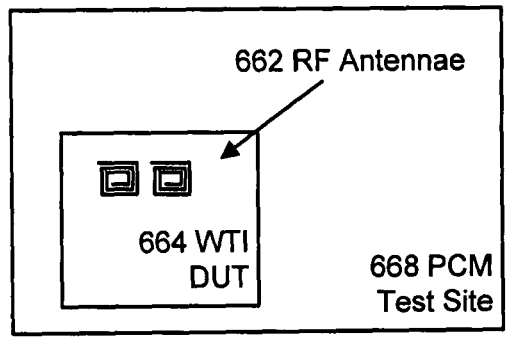
FIG. 81A is a schematic view of a PCM test site showing an antenna placement.
Figure 81B:
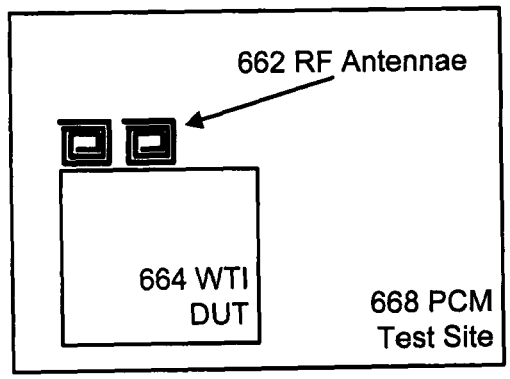
FIG. 81B is a schematic view of a PCM test site showing an alternate antenna placement.
Figure 81C:
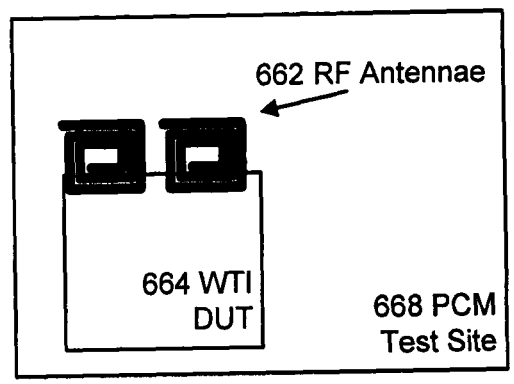
FIG. 81C is a schematic view of a PCM test site showing another alternate antenna placement.

FIG. 81A-81C shows various antenna placement options in PCM test site: FIG. 81A shows antennas 662 placed in WTI circuit; FIG. 81B shows antennas 662 placed in wafer or laminate circuit; and FIG. 81C shows antennas placed on top of WTI or on top of wafer or laminate by subsequent additive fabrication process.

FIG. 82 is a perspective view of an apparatus for interrogating an electronic component with wireless test structures integrated onto a DUT.

Figure 83:
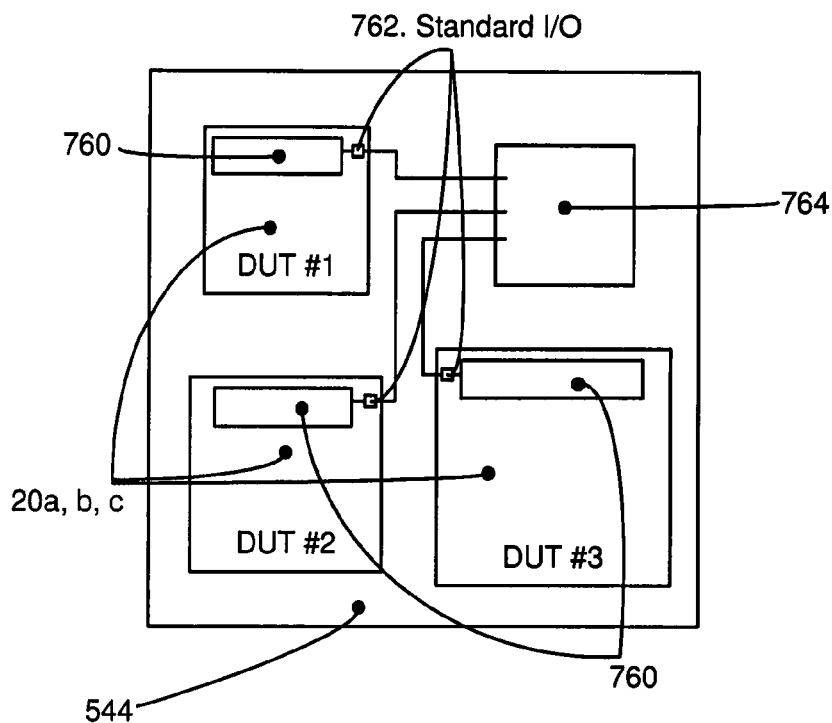
FIG. 83 is an illustration showing signalling between three DUTs and one test interface.

FIG. 83 is an illustration showing signalling between 3 DUTs and one test interface. Elements illustrated include DUTs 20a, 20b, 20c, SiP substrate 544, chip IDs 760, standard I/O 762, and wireless communications antennas and circuits 764. A test SiP interface module is embedded in the SiP to read out the chip ID numbers using JTAG scan chains.

Figure 84A:
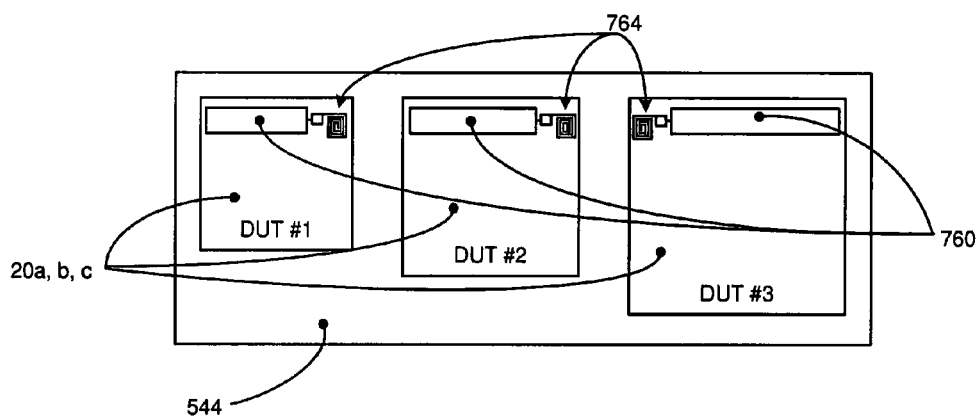
FIG. 84a is an illustration showing a completely wireless set of DUTs which include read/write ID or test data in non-volatile memory on DUTS.

FIG. 84a is an illustration showing a completely wireless set of DUTs which include read/write ID or test data in non-volatile memory on DUTS. The power may be supplied by external pins as in a test socket or in some other standard way. Elements illustrated include SiP Substrate 544, chip ID and test results memory 760, and wireless communications antennas and circuits 764. The test circuit is integrated on dies to read out the chip ID numbers and test results. It is important to multistep testing to know what tests were performed in the past and what the test results were. This method and apparatus allows the storage of partial test results in the IC or the SiP. In this way the test results and ID can be read even after packaging which creates traceability in ICs Wafers SiPs MCMs and even packaged parts during and after manufacture. One way to describe this method and apparatus is a 'wireless bar code' or 'wireless ink', and may include a memory device such as an imprinting technique. Another use of the process and apparatus is to program known good die (KGD) with an appropriate code in the memory. In this way subsequent manufacturing steps can read the designation and cull non-good die. This allows a decoupling between test and packaging which allows the front end of a packaging process to be optimized by not packaging the non-KGD. This also allows the decoupling in time such that whole wafers full of partially good material can be later recovered and read i.e. there is a savings of not having to package non good die as well as not having to trace or separate the dies at the time of testing. The quality of the dies can be carried throughout the process. The concept can be extended to add quality or speed grading to the parts which can be programmed in the memory at time of test. Later at packaging the memory can be read to determine which parameter of quality such as speed or error rate for memory devices of the particular device in hand. The record keeping does not have travel separately and thus raises the success and decouples steps which can then be individually optimized.

Figure 84B:
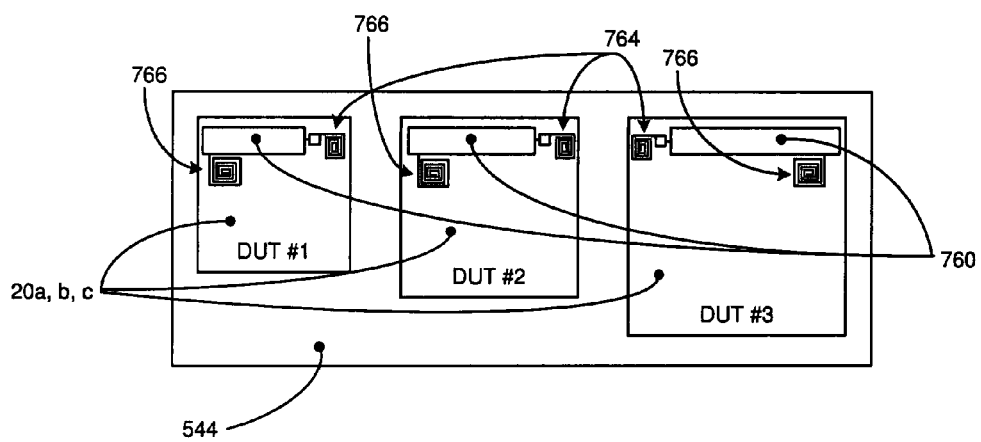
FIG. 84b is an illustration showing Wireless Power Cells Integrated on DUT with separate communication channels.

FIG. 84b Wireless Power Cells Integrated on DUT with separate communication channels. Elements illustrated include DUTs 20a, 20b, 20c, SiP substrate 544, chip ID and test results memory 760, wireless communication antennas and circuits 764, and wireless power antenna and circuits 766. Ultra low power test circuits are integrated into the dies to read the chip ID numbers. This illustrates how one can add traceability and audit functions even without contact to ICs Wafers SiPs MCMs etc.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The following claims are to be understood to include what is specifically illustrated and described above, what is conceptually equivalent, and what can be obviously substituted. Those skilled in the art will appreciate that various adaptations and modifications of the described embodiments can be configured without departing from the scope of the claims. The illustrated embodiments have been set forth only as examples and should not be taken as limiting the invention. It is to be understood that, within the scope of the following claims, the invention may be practiced other than as specifically illustrated and described.

What is claimed is:

1. An apparatus for interrogating an electronic circuit supported by a substrate, comprising:
   a tester positioned external and spaced from the substrate and comprising a tester transceiver;
   a testing circuit supported by the substrate and connected to the electronic circuit, the testing circuit comprising a processor and a testing circuit transceiver;
   the testing circuit transceiver communicating with the tester transceiver for transmitting instructions from the tester to the processor and for transmitting results of an interrogation of the electronic circuit from the processor to the tester;
   the processor and the testing circuit transceiver being separate and distinct from the electronic circuit to be interrogated: and
   the processor being programmed to process instructions from the tester to interrogate the electronic circuit with the interrogation corresponding to the instructions.

2. The apparatus of claim 1, wherein the tester comprises a probe and a probe interface, and the tester transceiver is a wireless probe transceiver.

3. The apparatus of claim 2, wherein at least one of the testing circuit and the processor comprises a source measurement unit or a parametric measurement unit.

4. The apparatus of claim 1, wherein the tester comprises a power transmitter and the testing circuit comprises a power receiver.

5. The apparatus of claim 1, wherein the electronic circuit comprises more than one device to be interrogated.

6. The apparatus of claim 1, wherein the substrate is a wafer and the electronic circuit is an integrated circuit in the wafer.

7. The apparatus of claim 1, wherein the electronic circuit is mounted on the substrate.

8. The apparatus of claim 1, wherein the testing circuit comprises power control circuit elements.

9. The apparatus of claim 1, wherein the processor comprises at least one signal converter element selected from a group consisting of an alternating current/direct current converter, an analog/digital converter, a voltage/frequency converter, a current/frequency converter, a voltage/time converter, and a current/time converter.

10. The apparatus of claim 1, wherein the interrogation corresponding to the instructions comprises a test selected from a group consisting of: front end tests, back end tests, current-voltage and capacitance-voltage relationships tests, light contamination tests, minority carrier diffusion length tests, lifetime and quantitative metallization and diffusion measurement tests, gate oxide integrity (GOI) tests, dielectric parameter tests using on-wafer charge pumps and control dielectric leakage measurements, non-contact capacitance-voltage tests for dielectric charge and interface measurements, capacitance and oxide thickness tests for dielectrics with a charge pump within tunneling range, non-contact capacitance-voltage tests for dielectric charge and interface measurements for dielectrics in the low leakage F-N tunneling, CMP damage monitoring tests, etch damage monitoring tests, plasma damage monitoring tests, surface level effects tests including charge injection, ultra low power tests during the fabrication of semiconductor wafers, and tests for in line process monitoring carried out at various stages of semiconductor wafer fabrication.

11. The apparatus of claim 1, wherein the testing circuit comprises a memory device for storing at least one of testing instructions, testing results and component identification.

12. An apparatus for interrogating an electronic circuit supported by a substrate comporising;
- a tester positioned external and spaced from the substrate and comprising a tester transceiver;
- a testing circuit supported by the substrate and connected to the electronic circuit, the testing, circuit comprising a processor and a testing circuit transceiver in communication with the tester transceiver for transmitting instructions from the tester to the processor and for transmitting results of an interrogation from the processor to the tester; and
- the processor being programmed to process instructions from the tester to interrogate the electronic circuit with an interrogation corresponding to the instructions; and
- wherein the processor comprises a reference circuit element for referencing results of the interrogation.

* * * * *